(12) United States Patent
Kim et al.

(10) Patent No.: US 7,446,771 B2
(45) Date of Patent: Nov. 4, 2008

(54) METHOD AND APPARATUS FOR ENCODING AND DECODING AN ORIENTATION INTERPOLATOR

(75) Inventors: Do-kyoon Kim, Kyungki-do (KR); Seok-yoon Jung, Seoul (KR); Euee-seon Jang, Seoul (KR); Sang-oak Woo, Kyungki-do (KR); Shin-jun Lee, Seoul (KR); Mahn-jin Han, Kyungki-do (KR); Gyeong-ja Jang, Kyungki-do (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 311 days.

(21) Appl. No.: 10/304,914

(22) Filed: Nov. 27, 2002

(65) Prior Publication Data

US 2003/0128883 A1 Jul. 10, 2003

Related U.S. Application Data

(60) Provisional application No. 60/333,130, filed on Nov. 27, 2001, provisional application No. 60/334,541, filed on Dec. 3, 2001, provisional application No. 60/342,101, filed on Dec. 26, 2001, provisional application No. 60/369,597, filed on Apr. 4, 2002.

(30) Foreign Application Priority Data

Nov. 22, 2002 (KR) .................... 10-2002-0073044

(51) Int. Cl.
*G06T 13/00* (2006.01)
*G06T 15/70* (2006.01)

(52) U.S. Cl. .................. 345/473; 345/474; 345/475

(58) Field of Classification Search .............. 345/473, 345/474, 475, 950, 951; 375/244; 341/143
See application file for complete search history.

(56) References Cited

U.S. PATENT DOCUMENTS 5,692,117 A * 11/1997 Berend et al. ............... 345/475
5,757,668 A * 5/1998 Zhu ....................... 375/240.16
5,818,463 A * 10/1998 Tao et al. .................... 345/473
5,933,549 A * 8/1999 Ide et al. ..................... 382/309
6,075,901 A   6/2000 Signes et al.
6,151,033 A * 11/2000 Mihara et al. ............... 345/475
6,559,848 B2 * 5/2003 O'Rourke ................... 345/473
6,704,890 B1   3/2004 Carotti et al.
6,798,835 B2   9/2004 Sugiyama
6,891,565 B1   5/2005 Dieterich

FOREIGN PATENT DOCUMENTS

JP         410215458 A  *  8/1998
WO       WO 01/41156 A1    6/2001

OTHER PUBLICATIONS

Ko, Yun-Ho; Choi, Jae Gark; Cho, Soon-Jae; Kim, Seong-Dae, "Efficient coding algorithm for affine motion parameters", Optical Engineering, vol. 40, No. 2, Feb. 2001, pp. 200-208.*

(Continued)

*Primary Examiner*—Ulka Chauhan
*Assistant Examiner*—Daniel F Hajnik
(74) *Attorney, Agent, or Firm*—Buchanan Ingersoll & Rooney PC

(57) ABSTRACT

A method and an apparatus for encoding and decoding an orientation interpolator indicating the locations of keyframes on a temporal axis and the rotation of an object in each of the keyframes are provided. The apparatus for encoding an orientation interpolator includes an break point extractor which extracts, from a first animation path constituted by an orientation interpolator input thereinto, a minimum number of break points, which can bring about an error of no greater than a predetermined error limit between the first animation path and a second animation to be generated by the extracted break points, a key data encoder which encodes key data input from the break point extractor, and a key value data encoder which encodes key value data input from the break point extractor by generating rotational differential data, by which the object is rotationally transformed by as much as a difference between a rotational transformation value of a current keyframe and a rotational transformation value of a previous keyframe.

41 Claims, 63 Drawing Sheets

OTHER PUBLICATIONS

Strassman, Steve, "Hairy Brushes" 1986 Siggraph Conference Proceedings (vol. 20, No. 4, pp. 225-232).*

Shoemake, Ken, "Animation Rotation with Quaternion Curves" ACM (vol. 19, No. 3, 1985), pp. 245-254.*

Aaron E. Walsh, Mikael Bourges-Sevenier, "Core Web3D", Pub Sep. 14, 2000, eBook through Safari Tech Books Online, chapters 17-19, ISBN 0-13-085728-9.*

R. Ramamoorthi, C. Ball, and A.H. Barr. Dynamic splines with constraints for animation. Technical Report CS-TR-97-03, California Institute of Technology, Included on CD-ROM, Jan. 1997. ftp://ftp.cs.caltech.edu/tr/cs-97-03.ps.Z. http://citeseer.ist.psu.edu/ramamoorhi97dynamic.html.*

European Search Report issued on Apr. 8, 2005 in corresponding application.

James D.K. Kim et al., "Animation Data Compression in MPEG-4: Interpolators", Intl. Conf. on Image Processing, IEEE vol. 2 of 3, Sep. 22, 2002, pp. 33-36.

MPEG: "Call for Proposals for Interpolator Compression", ISO/IEC JTC1/SC29/WG11 N4098, Mar. 2001, Singapore.

Mahnjin Han, Alexandre Cotarmanc'h, "Interpolator Compression Core Experiments Description", ISO/TEC JTC1/SC29/WG11 N4364, Jul. 2001, Sydney.

E.S. Jang, "3D Animation Coding: Its History and Framework", Multimedia and Expo, 2000, IEEE 2000, pp. 1119-1122.

J. Signes, "Binary Format For Scene (BIFS): Combining MPEG-4 Media to Build Rich Multimedia Services", Spie, vol. 3653, Jan. 1999, pp. 1511-1515.

* cited by examiner

FIG. 11
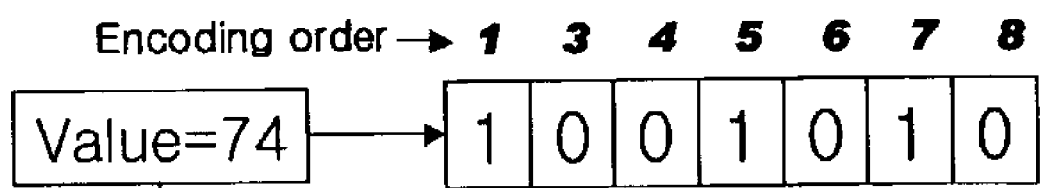
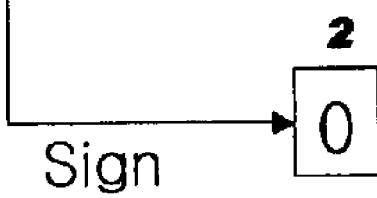
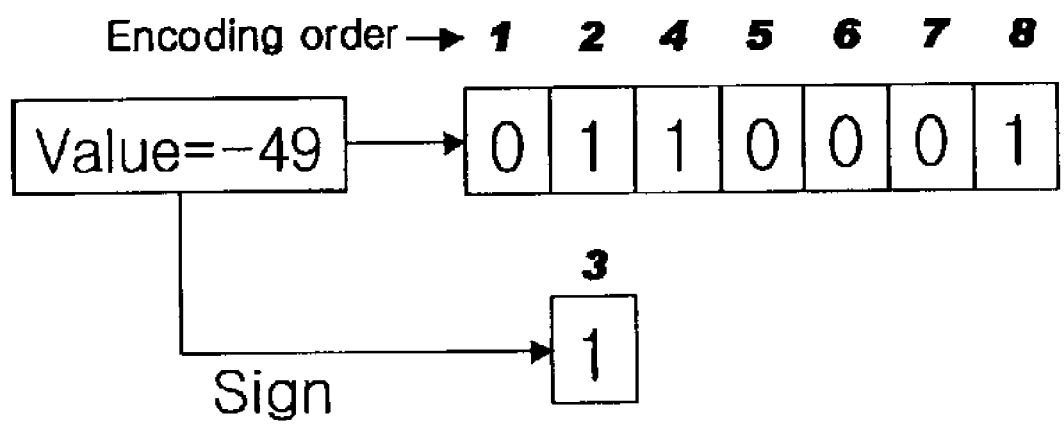

FOLD

DIVIDE

SHIFT-UP

FINAL

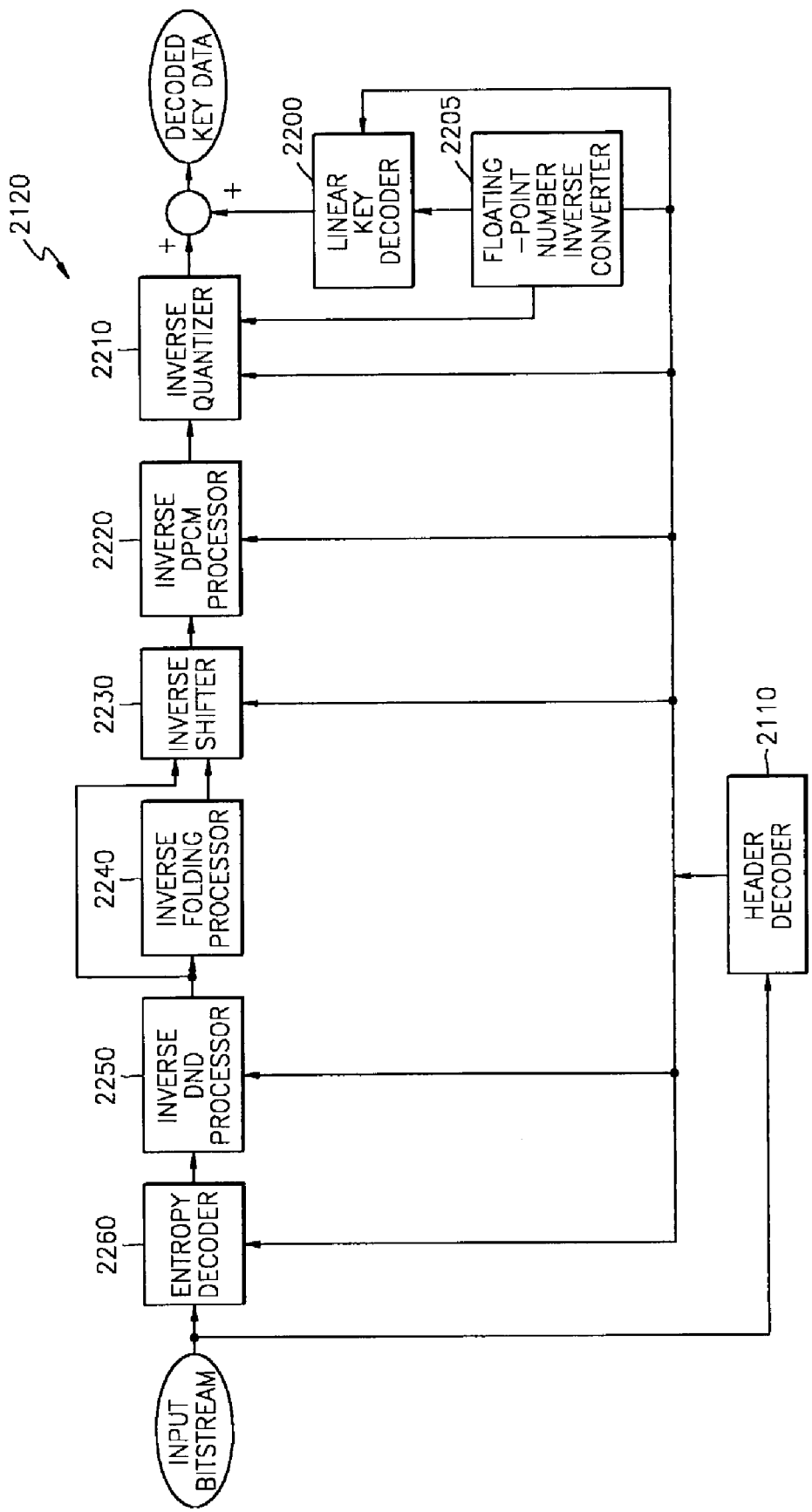

FIG. 29A

```
class CompressedOrientationInterpolator {
    KeyHeader kHeader;
    OriIKeyValueHeader oriIKVHeader;
    qf_start();
    aligned(8)KeySelectionFlag ksFlag(kHeader, oriIKVHeader.bPreserveKey);
    Key k(kHeader);
    if(oriIKVHeader.nKVDPCMOrder == 0)   //1st order DPCM
        OriIDPCMKeyValue    oriIDPCMKeyValue(oriIKVHeader.oriIDPCMKVHeader,
ksFlag.nNumberOfKeyValue-1);
    else  //2nd order DPCM
        OriIDPCMKeyValue    oriIDPCMKeyValue(oriIKVHeader.oriIDPCMKVHeader,
ksFlag.nNumberOfKeyValue-2);
}
```

FIG. 29B

```
class KeyHeader {
        int i;
        unsigned int(5) nKeyQBit;
        unsigned int(5) nNumKeyCodingBit;
        unsigned int(nNumKeyCodingBit) nNumberOfKey;
        unsigned int(4) nKeyDigit;
        bit(1) bIsLinearKeySubRegion;
        if(bIsLinearKeySubRegion == 1)
                LinearKey lKey(nKeyDigit);
        bit(1) bRangeFlag;
        if(bRangeFlag == 1)
                KeyMinMax keyMinMax(nKeyDigit);
        unsigned int(5) nBitSize;
        unsigned int(2) nKDPCMOrder;
        for(i = 0; i < nKDPCMOrder + 1; i++) {
                bit(1) nQIntraKeySign[[i]];
                if(i == 0 && nQIntraKeySign[i] == 1)
                        continue;
                unsigned int(nBitSize) nQIntraKey[[i]];
        }
        bit(1) bShiftFlag;
        if(bShiftFlag == 1) {
                bit(1) nKeyShiftSign;
                unsigned int(nBitSize) nKeyShift;
        }
        unsigned int(3) nDNDOrder;
        if(nDNDOrder == 7) {
                bit(1) bNoDND;
                if(bNoDND == 1)
                        nDNDOrder = -1;
        }
        int nMaxQBit = nBitSize;
        for(i = 0; i < nDNDOrder; i++) {
                bit(1) nKeyMaxSign[[i]];
                unsigned int(nMaxQBit) nKeyMax[[i]];
                nMaxQBit = (int)(log10(abs(nKeyMax[i]))/log10(2))+1;
                if(nMaxQBit+1 < nBitSize)
                        nMaxQBit += 1;
                else
                        nMaxQBit = nBitSize;
        }
        int bSignedAACFlag;
        int nKeyCodingBitQBit = (int)(log10(nKeyQBit))/log10(2))+1;
        unsigned int(nKeyCodingBitQBit) nKeyCodingBit;
        if(nDNDOrder != -1 && nDNDOrder != 0) {
                bit(1) bKeyInvertDownFlag;
                if(bKeyInvertDownFlag == 1) {
                        unsigned int(nKeyCodingBit) nKeyInvertDown;
                        bSignedAACFlag = 0;
                } else {
                        bSignedAACFlag = 1;
                }
        } else {
                bSignedAACFlag = 0;
        }
}
```

FIG. 29C

```
class LinearKey (int nKeyDigit) { unsigned int(5) nNumLinearKeyCodingBit;

unsigned int(nNumLinearKeyCodingBit) nNumberOfLinearKey ;

KeyMinMax kMinMax(nKeyDigit);

```
class KeyMinMax (int nKeyDigit) {
    bit(1) bMinKeyDigitSame;
    if((bMinKeyDigitSame == 0)
            unsigned int(4) nMinKeyDigit;
    else
            nMinKeyDigit = nKeyDigit;
    if(nMinKeyDigit != 0) {
            if(nMinKeyDigit < 8) {
                    int count = (int)(log10(10^nMinKeyDigit-1)/log10(2)) + 1;
                    bit(1) nMinKeyMantissaSign;
                    unsigned int(count) nMinKeyMantissa;
                    bit(1) nMinKeyExponentSign;
                    unsigned int(6) nMinKeyExponent;
            } else
                    float(32) fKeyMin;
    }
    bit(1) bMaxKeyDigitSame;
    if(bMaxKeyDigitSame == 0)
            unsigned int(4) nMaxKeyDigit;
    else
            nMaxKeyDigit = nKeyDigit;
    if(nMaxKeyDigit != 0) {
            if(nMaxKeyDigit < 8) {
                    int count = (int)(log10(10^nMaxKeyDigit)-1)/log10(2)) + 1;
                    bit(1) nMaxKeyMantissaSign;
                    unsigned int(count) nMaxKeyMantissa;
                    bit(1) bSameExponent;
                    if(bSameExponent == 0) {
                            bit(1) nMaxKeyExponentSign;
                            unsigned int(6) nMaxKeyExponent;
                    }
                    else
                            nMaxKeyExponent = nMinKeyExponent;
            } else
                    float(32) fKeyMax;
    }
}
```

FIG. 29E

```
class OriIKeyValueHeader () {
    bit(1) bPreserveKey;
    unsigned int(5) nKVQBit;
    bit(1) nKVDPCMOrder;
    OriIDPCMKeyValueHeader oriIDPCMKVHeader(nKVQBit, nKVDPCMOrder);
}
```

FIG. 29F

```
class OriIDPCMKeyValueHeader (int nKVQBit, unsigned int nKVDPCMOrder) {
    unsigned int(nKVQBit-1) firstQKV_S;
    bit(1) nFirstXSign;
    unsigned int(nKVQBit-1) firstQKV_X;
    bit(1) nFirstYSign;
    unsigned int(nKVQBit-1) firstQKV_Y;
    bit(1) nFirstZSign;
    unsigned int(nKVQBit-1) firstQKV_Z;
    if (nKVDPCMOrder==1) {        //2nd order DPCM
    bit(1) nSecondXSign;
    unsigned int(nKVQBit-1) secondQKV_X;
    bit(1) nSecondYSign;
    unsigned int(nKVQBit-1) secondQKV_Y;
    bit(1) nSecondZSign;
    unsigned int(nKVQBit-1) secondQKV_Z;
    bit(1) bIsMoreTwoKVs;
    }
    if (nKVDPCMOrder==0 || bIsMoreTwoKVs==1) {
    bit(1) x_keyvalue_flag;
    OriIKeyValueCodingBit oriIKVCodingBit_X(x_keyvalue_flag, nKVQBit);
    bit(1) y_keyvalue_flag;
    OriIKeyValueCodingBit oriIKVCodingBit_Y(y_keyvalue_flag, nKVQBit);
    bit(1) z_keyvalue_flag;
    OriIKeyValueCodingBit oriIKVCodingBit_Z(z_keyvalue_flag, nKVQBit);
    }
}
```

FIG. 29G

```
class OrilKeyValueCodingBit (unsigned int flag_bit, int nKVQBit) {
    int count = (int)(log10(nKVQBit)/log10(2)) + 1;
    if(flag_bit == 0) {
        unsigned int(count) nKVCodingBit;
        if(nKVCodingBit == 1)
            unsigned int(nKVCodingBit) nAllKeyValue;
        else {
            bit(1) nSign;
            unsigned int(nKVCodingBit-1) nAllKeyValue;
        }
    } else {
        bit(1) bIsUnaryAAC;
        if(bIsUnaryAAC != 1)
            unsigned int(count) nKVCodingBit;
    }
}
```

FIG. 29H

```
class KeySelectionFlag(KeyHeader kHeader, int bPreserveKey) {
  int i;
  int nNumOfKeyValue = 0;
  if(bPreserveKey == 1) {
    for(i=0; i<kHeader.nNumberOfKey; i++) {
      qf_decode(&keyFlag[i], keyFlagContext);
      if(keyFlag[i] == 1)
        nNumOfKeyValue++;
    }
  } else
    nNumOfKeyValue = kHeader.nNumberOfKey;
}
```

FIG. 29I

```
class Key (KeyHeader kHeader) {
    int nQKey[kHeader.nNumberOfKey];
    int i;
    int nNumberOfRemainingKey;
    if(kHeader.bIsLinearKeySubRegion == 1)
        nNumberOfRemainingKey = kHeader.nNumberOfKey-
kHeader.lKey.nNumberOfLinearKey;
    else
        nNumberOfRemainingKey = kHeader.nNumberOfKey;
    for(i = kHeader.nKDPCMOrder+1; i < nNumberOfRemainingKey; i++) {
        if(kHeader.bSignedAACFlag == 0)
            decodeUnsignedAAC(nQKey[i], kHeader.nKeyCodingBit, keyContext);
        else
            decodeSignedAAC(nQKey[i], kHeader.nKeyCodingBit+1,
keySignContext, keyContext);
    }
}
```

FIG. 29J

```
class OriIDPCMKeyValue(OriIDPCMKeyValueHeader kvHeader, int nNumKV) {
    int i;
    if(kvHeader.x_keyvalue_flag != 0) {
        if(kvHeader.oriIKVCodingBit_X.bIsUnaryAAC == 1)
            for(i = 0;i < nNumKV;i++)
                decodeUnaryAAC(&DeltaKeyValue[i].x, kVXSignContext,
kVXUnaryContext);
        else
            for(i = 0;i < nNumKV;i++)
                decodeSignedAAC(&DeltaKeyValue[i].x,
kvHeader.oriIKVCodingBit_X.nKVCodingBit, kVXSignContext, kVXContext);
    }
    if(kvHeader.y_keyvalue_flag != 0) {
        if(kvHeader.oriIKVCodingBit_Y.bIsUnaryAAC == 1)
            for(i = 0;i < nNumKV;i++)
                decodeUnaryAAC(&DeltaKeyValue[i].y, kVYSignContext,
kVYUnaryContext);
        else
            for(i = 0;i < nNumKV;i++)
                decodeSignedAAC(&DeltaKeyValue[i].y,
kvHeader.oriIKVCodingBit_Y.nKVCodingBit, kVYSignContext, kVYContext);
    }
    if(kvHeader.z_keyvalue_flag != 0) {
        if(kvHeader.oriIKVCodingBit_Z.bIsUnaryAAC == 1)
            for(i = 0;i < nNumKV;i++)
                decodeUnaryAAC(&DeltaKeyValue[i].z, kVZSignContext,
kVZUnaryContext);
        else
            for(i = 0;i < nNumKV;i++)
                decodeSignedAAC(&DeltaKeyValue[i].z,
kvHeader.oriIKVCodingBit_Z.nKVCodingBit, kVZSignContext, kVZContext);
    }
}
```

METHOD AND APPARATUS FOR ENCODING AND DECODING AN ORIENTATION INTERPOLATOR

This application claims the priority of Korean Patent Application No. 2002-73044, filed Nov. 22, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to a method and an apparatus for encoding and decoding three-dimensional animation data, and more particularly, to a method and an apparatus for encoding and decoding an orientation interpolator representing information on the rotation of an object in animation.

2. Description of the Related Art

MPEG-4 BIFS, which is one of the international multimedia standards, supports a keyframe-based animation using an interpolator node having keys and key values of an animation.

In order to represent animation as naturally and smoothly as possible using such a keyframe-based animation technique, a considerable number of keys and a considerable amount of key value data are required, and field data between key frames are filled in by interpolation. Interpolation in a virtual reality modeling language (VRML) involves linear or spherical interpolation.

Keys and key values approximate an original animation curve on a temporal axis. FIG. 1 is a diagram illustrating two-dimensional trajectories of animation data, represented by an orientation interpolator node, in accordance with the passage of time on the surface of a three-dimensional sphere. As shown in FIG. 1, the conventional MPEG-4 BIFS supports spherical linear interpolation between keyframes, and an animation path looks similar to a set of segments representing the variation of the animation data.

In an orientation interpolator node provided by BIFS, key data indicate a predetermined moment of time on a temporal axis where an animation is located using discontinuous numbers between $-\infty$ and $\infty$. Key value data represent information on the rotation of an object in a synthetic image at a predetermined moment of time indicated by key data. Information on the rotation of the object at another predetermined moment of time, which is not represented by key data, is obtained using key data corresponding to two moments of time, which are most adjacent to the predetermined moment of time, by spherical linear interpolation.

In spherical linear interpolation, rotation information is represented by a rotation axis and a rotation angle. MPEG-4 BIFS, like virtual reality modeling language (VRML), supports rotation information represented by a rotation axis and a rotation angle using an orientation interpolator node. When generating a smooth animation using key value data in spherical linear interpolation, differential values of key value data between keyframes are highly correlated with each other, which causes redundancy among data. Accordingly, it is effective to use a method for encoding key value data using differential values of data.

MPEG-4 BIFS provides two different methods for encoding field data represented by keys and key values of an orientation interpolator node. One is a method for encoding field data using pulse code modulation (PCM) and the other is a method for encoding field data using differential pulse code modulation (DPCM) and entropy encoding.

In the method for encoding field data using PCM, only a quantization process is performed on key data and key value data to be encoded. Since the characteristics of data to be encoded are not considered in this method, this method is considered ineffective. In the method for encoding field data using PCM, field data of an orientation interpolator node are input, and key value data of the field data are converted into values in a quaternion space. Next, keys and key value data are quantized. Quantized field data are output in the form of binary data. In order to measure the degree to which the results of quaternion transformation are visually distorted as compared with original field data, the binary data are restored into key value data consisting of a rotation axis and a rotation angle. Restored field data of an orientation interpolator node are stored and then are output on a screen. It is possible to measure the degree of visual distortion of images caused by a quaternion error using the restored data. Distortion of images can be calculated with Equation (1) below.

$$D = \sqrt{(\frac{\sum_{i=0}^{i<N} \varepsilon_i}{N})^2} = \sqrt{(\frac{\sum_{i=0}^{i<N} Q_i - \hat{Q}_i}{N})^2} \quad (1)$$

In Equation (1), N represents the number of field data, and $\varepsilon_i$ represents a differential value between encoded key value data $Q_i$ and key value data $\hat{Q}_i$ restored in a quaternion space.

On the other hand, in the method for encoding field data using DPCM and entropy encoding, a correlation between successive data is considered, and thus this method is considered more effective than the method for encoding field data using PCM in terms of encoding efficiency. In this method, a differential value between previously restored key value data and key value data to be encoded is calculated before a quantization process, and then the differential value is quantized, thus enhancing the encoding efficiency by taking advantage of the characteristics of data shown in the differential value.

FIGS. 2A and 2B are block diagrams of a MPEG-4 PMFC encoder using linear DPCM and entropy encoding, and a MPEG-4 PMFC decoder using inverse linear DPCM and entropy decoding, respectively. A linear DPCM operator shown in FIG. 2A calculates differential data $\dot{Q}_i$ between current key value data and previously restored key value data following Equation (2).

$$\dot{Q}_i = Q_i \hat{Q}_{i-1} = (q_{i,0} - \hat{q}_{i-1,0}, q_{i,1} - \hat{q}_{i-1,1}, q_{i,2} - \hat{q}_{i-2,2}, q_{i,3} - \hat{q}_{i-1,3}) \quad (2)$$

In Equation (2), $Q_i$ represents original key value data at a predetermined moment of time (t), which are represented by a quaternion, and $\hat{Q}_{i-1}$ represents key value data at a predetermined moment of time (t−1), which are restored from an error compensation circuit.

However, the encoding method performed in the apparatus for encoding key value data shown in FIG. 2A does not have a high encoding efficiency. It is possible to easily figure out what the disadvantages of the encoding method are by analyzing key value data, which determine the rotation of an object in a quaternion space. Key value data are represented by a quaternion in the following equation.

$$Q = \left(\cos\frac{\theta}{2}, \frac{n_x}{\|n\|}\sin\frac{\theta}{2}, \frac{n_y}{\|n\|}\sin\frac{\theta}{2}, \frac{n_z}{\|n\|}\sin\frac{\theta}{2}\right) \qquad (3)$$

For example, when components of one quaternion have the same absolute values as their corresponding components of another quaternion but different signs in a quaternion space, as shown in Equation (3), the two quaternions are considered the same. In other words, the two quaternions provide the same effects in terms of the rotational transformation of an object in a 3D space, which means the factors that affect the rotational transformation of an object are a direction of a rotation axis and a rotation angle, rather than the vector of the rotation axis. However, like in MPEG-4 BIFS, if key value data are represented by a quaternion using Equation (3) and a differential value is linearly calculated by calculating differences in vectors between successive key value data, the differential value is not 0, which means that linear differential values do not reflect redundancy in rotational transformation well. Accordingly, it is impossible to precisely measure the quality of images using the method for measuring the distortion degree of images shown in Equation (1).

SUMMARY OF THE INVENTION

To solve the above as well as other problems, it is an aspect of the present invention to provide a method and an apparatus for encoding and decoding an orientation interpolator, which encodes and decodes an extracted orientation interpolator constituted by break points extracted from an original orientation interpolator so as to prevent an error between the extracted orientation interpolator and the original orientation interpolator from being greater than an allowable error limit and thus can provide high-quality animation with a high compression rate.

It is another aspect of the present invention to provide a method and an apparatus for encoding and decoding an orientation interpolator, which can provide high-quality animation with a high compression rate by calculating a rotational differential value, which can sufficiently reflect redundancy in rotational transformation, and encoding key value data of an orientation interpolator using the rotational differential value.

It is another aspect of the present invention to provide a bitstream encoded and decoded by a method and an apparatus for encoding and decoding an orientation interpolator according to the present invention, which can provide high-quality animation with a high compression rate.

Accordingly, to achieve the above as well as other aspects of the present invention, there is provided an apparatus for encoding an orientation interpolator, which includes key data indicating the locations of keyframes on a temporal axis and key value data indicating the rotation of an object. The apparatus includes an break point extractor which extracts, from a first animation path constituted by an orientation interpolator input thereinto, a minimum number of break points, which can bring about an error of no greater than a predetermined error limit between the first animation path and a second animation to be generated by the extracted break points, a key data encoder which encodes key data input from the break point extractor, and a key value data encoder which encodes key value data input from the break point extractor.

Preferably, the apparatus further includes a resampler which samples the first animation path into a predetermined number of sections having an interval of a predetermined amount of time and outputs an orientation interpolator including resampled key data and resampled key value data, and a selector which outputs an orientation interpolator input thereinto to the resampler or the break point extractor in response to an external input signal.

To achieve the above as well as other aspects of the present invention, there is provided an apparatus for encoding an orientation interpolator, which includes key data indicating the locations of keyframes on a temporal axis and key value data indicating the rotation of an object. The apparatus includes a resampler which samples an animation path constituted by an input orientation interpolator into a predetermined number of sections having an interval of a predetermined amount of time and outputs an orientation interpolator including resampled key data and resampled key value data, a key data encoder which encodes key data input from the resampler, and a key value data encoder which generates a rotational differential value used to rotate an object by as much as a difference between rotational transformation applied to the object by key value data of a current keyframe and rotational transformation applied to the object by key value data of a previous keyframe and thus encodes key value data input from the resampler.

Preferably, the break point extractor includes a linear interpolator which extracts a beginning path point and an ending path point of an input animation path, selects path points between the beginning and ending path points, and interpolates other path points, which still have not yet been selected, using the selected path points, an error calculator which calculates an error between the input animation path and an interpolated animation path generated by the linear interpolator using interpolation, and a determining unit which extracts break points, by which an error between the input animation path and the interpolated animation path can be minimized, and outputs the selected break points if the corresponding error is not greater than a predetermined error limit.

Preferably, the key value encoder includes a rotational differential data generator which generates, using a rotational transformation value of a current keyframe and a restored rotational transformation value of a previous keyframe, a rotational differential value used to rotate the object by as much as a difference between rotational transformation applied to the object in the current keyframe by key value data and rotational transformation applied to the object in the previous keyframe by key value data, and outputs rotational differential data by quantizing the rotational differential value, and an entropy encoder which entropy-encodes the rotational differential data.

Preferably, the rotational differential data generator includes a first quaternion multiplier which generates the rotational differential value using the rotational transformation value of the current keyframe and the restored rotational transformation value of the previous keyframe, a quantizer which generates rotational differential data by quantizing the rotational differential value, an inverse quantizer which generates a restored rotational differential value by inverse-quantizing the rotational differential data, and a second quaternion multiplier which generates a restored rotational transformation value of the current keyframe by quaternion-multiplying the restored rotational differential value by a rotational transformation value of the previous keyframe.

Preferably, the key data encoder includes a first quantizer which quantizes key data of a orientation interpolator using predetermined quantization bits, a first DPCM processor which generates differential data of the quantized key data, a DND processor which performs a DND operation on the differential data depending on a relationship between the differential data and a maximum value and a minimum value among them, and a first entropy encoder which entropy-encodes the differential data input from the DND processor.

To achieve the above as well as other aspects of the present invention, there is provided an apparatus for decoding a bitstream, into which an orientation interpolator, including key data indicating the locations of keyframes on a temporal axis and key value data indicating the rotation of an object, is encoded. The apparatus includes a key data decoder which decodes key data from an input bitstream, a key value data decoder which decodes key value data from the input bitstream, and an orientation interpolator synthesizer which generates an orientation interpolator by synthesizing decoded key value data and key value data spherically linearly interpolated using the decoded key value data.

Preferably, the key value data decoder includes an entropy decoder which generates circular-DPCMed rotational differential data or quantized rotational differential data by entropy-decoding key value data from the bitstream, an inverse circular DPCM operator which generates quantized rotational differential data by performing an inverse circular DPCM operation on rotational differential data input from the entropy-decoder following the order of DPCM operation decoded from the bitstream, an inverse quantizer which rotates the object by as much as a difference between rotational transformations applied to the object by quaternion key value data of each of the keyframes by inverse-quantizing the quantized rotational differential data, and a quaternion multiplier which generates a rotational transformation value of a current keyframe by quaternion-multiplying a rotational differential value of the current keyframe by a restored rotational transformation value of a previous keyframe.

To achieve the above as well as other aspects of the present invention, there is provided a method for encoding an orientation interpolator including key data indicating the locations of keyframes on a temporal axis and key value data indicating the rotation of an object. The method includes (b) generating key data and key value data to be encoded by extracting, from a first animation path constituted by the orientation interpolator, a minimum number of break points, which can bring about an error of no greater than a predetermined error limit between the first animation path and a second animation to be generated by the extracted break points, (d) encoding the key data generated in step (b), and (e) encoding the key value data generated in step (b).

Preferably, step (b) includes (b1) selecting a beginning path point and an ending path point of the first animation path, (b2) selecting path points between the beginning and ending path points one by one and interpolating other path points, which still have not yet been selected, using the selected path points, (b3) calculating an error between the first animation path and a second animation path generated by interpolation in step (b2), and (b4) selecting break points, by which an error between the first animation path and the second animation path can be minimized, checking if the corresponding error is not greater than a predetermined error limit, and determining key data and key value data to be encoded.

Preferably, the method for encoding an orientation interpolator may further include (a) generating an orientation interpolator including resampled key data and resampled key value data by sampling the first animation path into a predetermined number of sections having an interval of a predetermined amount of time, before step (b) or may further include (c) generating key data and key value data to be encoded by sampling the second animation path constituted using the extracted break points into a predetermined number of sections having an interval of a predetermined number of time, after step (b).

To achieve the above as well as other aspects of the present invention, there is provided a method for encoding an orientation interpolator including key data indicating the locations of keyframes on a temporal axis and key value data indicating the rotation of an object. The method includes (a) sampling an animation path constituted by the orientation interpolator into a predetermined number of sections having an interval of a predetermined amount of time and thus generating an orientation interpolator including resampled key data and resampled key value data, (d) reducing the range of the key data sampled in step (a) and encoding the key data, and (e) encoding the key value data sampled in step (a) by generating and encoding a rotational differential value used to rotate the object by as much as a difference between rotational transformation applied to the object by key value data of a current keyframe and rotational transformation applied to the object by key value data of a previous keyframe.

Preferably, step (d) includes quantizing the key data with a predetermined number of quantization bits, generating differential data by performing a predetermined DPCM operation on quantized data, and entropy-encoding the differential data.

Preferably, step (e) includes (e1) generating a rotational differential value used to rotate the object by as much as a difference between rotational transformations applied to the object by key value data of the current and previous keyframes using a rotational transformation value of the current keyframe and a restored rotational transformation value of the previous keyframe and generating rotational differential data by quantizing the rotational differential value, (e2) selectively performing a linear DPCM operation or a circular DPCM operation on the rotational differential data, and (e3) entropy-encoding the rotational differential data Preferably, step (e1) includes (e11) generating the rotational differential value using a rotational transformation value of the current keyframe and a restored rotational transformation value of the previous keyframe, (e12) generating rotational differential data by quantizing the rotational differential value, (e13) generating a restored rotational differential value by inverse-quantizing the rotational differential data, and (e14) generating a restored rotational transformation value of the current keyframe by quaternion-multiplying the restored rotational differential value by a restored rotational transformation value of the previous keyframe.

To achieve the above as well as other aspects of the present invention, there is provided a method for decoding a bitstream, into which an orientation interpolator, including key data indicating the locations of keyframes on a temporal axis and key value data indicating the rotation of an object, is encoded. The method includes (a) decoding key data from an input bitstream, (b) decoding key value data from the input bitstream, and (c) generating an orientation interpolator by synthesizing decoded key value data and key value data spherically linearly interpolated using the decoded key value data.

Preferably, in step (c), if there is no decoded key value data corresponding to key data currently being subjected to orientation interpolator synthesization, key value data corresponding to the key data currently being subjected to orientation interpolator synthesization are interpolated using decoded key value data corresponding to previously synthesized key data and decoded key value data corresponding to key data to be synthesized next.

Preferably, step (a) includes generating differential data by entropy-decoding the input bitstream, generating quantized key data by performing a predetermined DPCM operation and an inverse DND operation on the differential data, and generating restored key data by inverse-quantizing the quantized key value data.

Preferably, step (b) includes (b1) generating circular-DPCMed rotational differential data or quantized rotational differential data by entropy-decoding key value data from the bitstream, (b2) generating rotational differential data by performing an inverse circular DPCM operation on entropy-decoded rotational differential data following the order of DPCM operation decoded from the bitstream, (b3) generating a rotational differential value used to rotate the object by as much as a difference between rotational transformations applied to the object by quaternion key value data of each of the keyframes by inverse-quantizing the rotational differential data, and (b4) generating a rotational transformation value of a current keyframe by quaternion-multiplying a rotational differential value of the current keyframe by a decoded rotational transformation value of a previous keyframe.

To achieve the above as well as other aspects of the present invention, there is provided a bitstream, into which an orientation interpolator, including key data indicating the locations of keyframes on a temporal axis and key value data indicating the rotation of an object, is encoded. The bitstream includes key data encoding/decoding information, into which key data and information necessary to decode the key data are encoded, and key value data encoding/decoding information, into which key value data and information necessary to decode the key value data are encoded. Here, the key data encoding/decoding information includes inverse DND operation information including the order of inverse DND indicating a predetermined number of cycles of inverse DND to be performed on differential data generated by entropy-decoding the bitstream in order to extend the range of the differential data and maximum and minimum values among differential data used in each cycle of inverse DND operation, first inverse DPCM operation information including the order of inverse DPCM operation to be performed on the inverse-DNDed differential data so as to transform the inverse-DNDed differential data into quantized key data and intra key data which are used for each cycle of inverse DPCM operation, and first inverse quantization information used in inverse quantization to generate restored key data by inverse-quantizing the quantized key data. The key value data encoding/decoding information includes rotational differential data entropy-encoded by quantizing a rotational differential value used to rotate the object by as much as a difference between rotational transformations applied to the object by quaternion key value data of each of the keyframes, entropy-decoding information including an entropy decoding mode indicating an entropy decoding method to be performed on the rotational differential data, inverse circular DPCM operation information including the order of inverse circular DPCM operation, which indicates whether or not an inverse circular DPCM operation will be performed on entropy-decoded rotational differential data following the entropy decoding mode, and second inverse quantization information including a predetermined number of inverse quantization bits used to restore original key value data by inverse-quantizing the quantized key value data.

Preferably, the key data encoding/decoding information further includes linear key decoding information used for decoding a linear key region included in the bitstream, and the linear key decoding information includes a flag indicating whether or not there exists the linear key region where key data linearly increase among the key data, the number of key data included in the linear key region, and beginning and ending key data of the linear key region.

BRIEF DESCRIPTION OF THE DRAWINGS

The above objects and advantages of the present invention will become more apparent by describing in detail preferred embodiments thereof with reference to the attached drawings in which:

FIG. 11 is a diagram illustrating an example of a function encodeSignedAAC;

FIG. 22 is a block diagram of a key data decoder according to a preferred embodiment of the present invention;

FIGS. 29A through 29J are SDL-language program codes, by which an apparatus for decoding an orientation interpolator according to a preferred embodiment of the present invention, which decodes key data and key value data, is realized.

DETAILED DESCRIPTION OF THE INVENTION

An apparatus and a method for encoding an orientation interpolator according to a preferred embodiment of the present invention will be described more fully with reference to the accompanying drawings.

Figure 1:
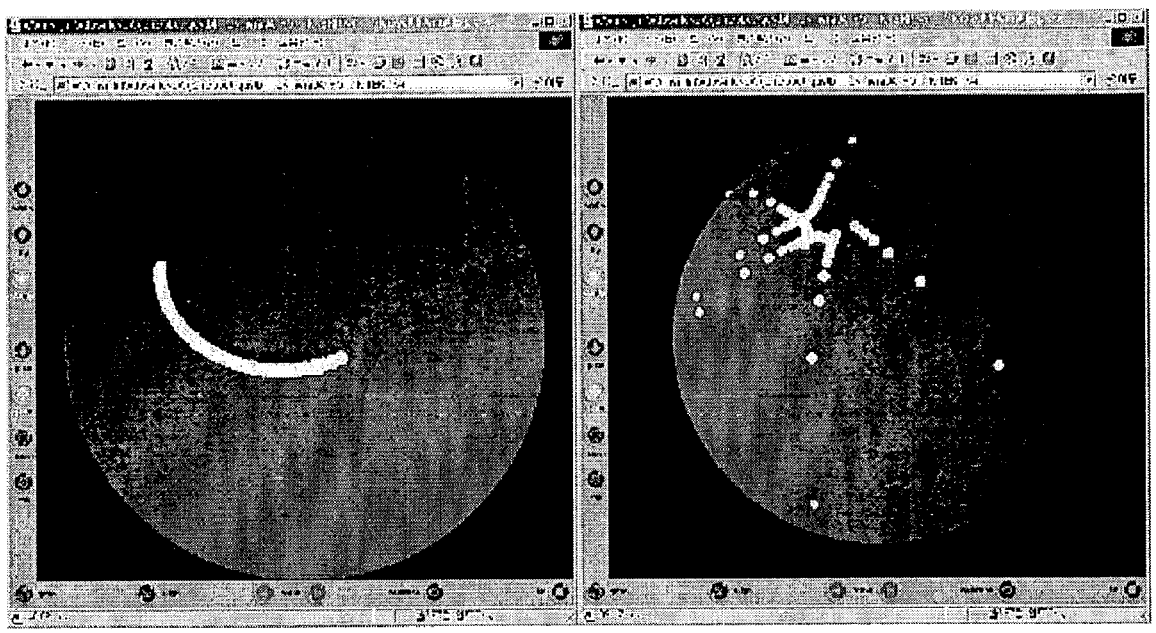
FIG. 1 is a diagram illustrating two-dimensional trajectories of animation data, represented by an orientation interpolator node, in accordance with the passage of time on the surface of a three-dimensional sphere.
Figure 2A:
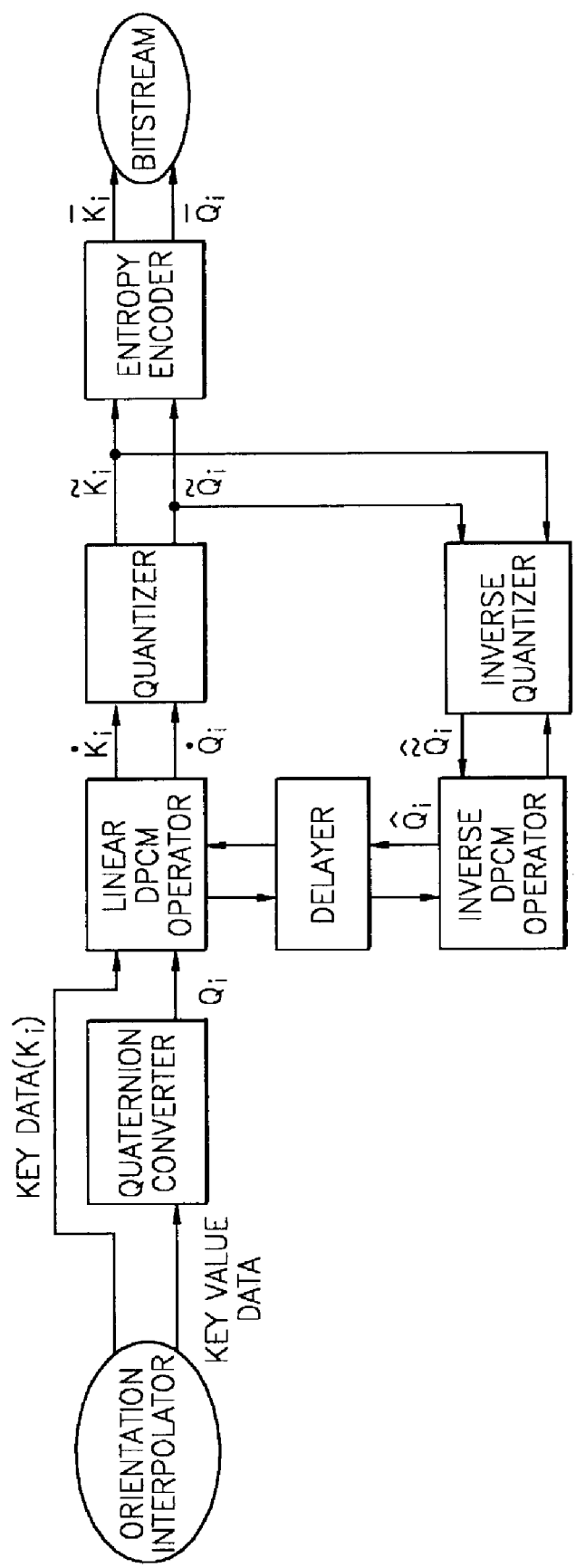
FIGS. 2A and 2B are block diagrams of a MPEG-4 PMFC encoder using linear DPCM and entropy encoding and a MPEG-4 PMFC decoder using linear inverse DPCM and entropy decoding, respectively.
Figure 2B:
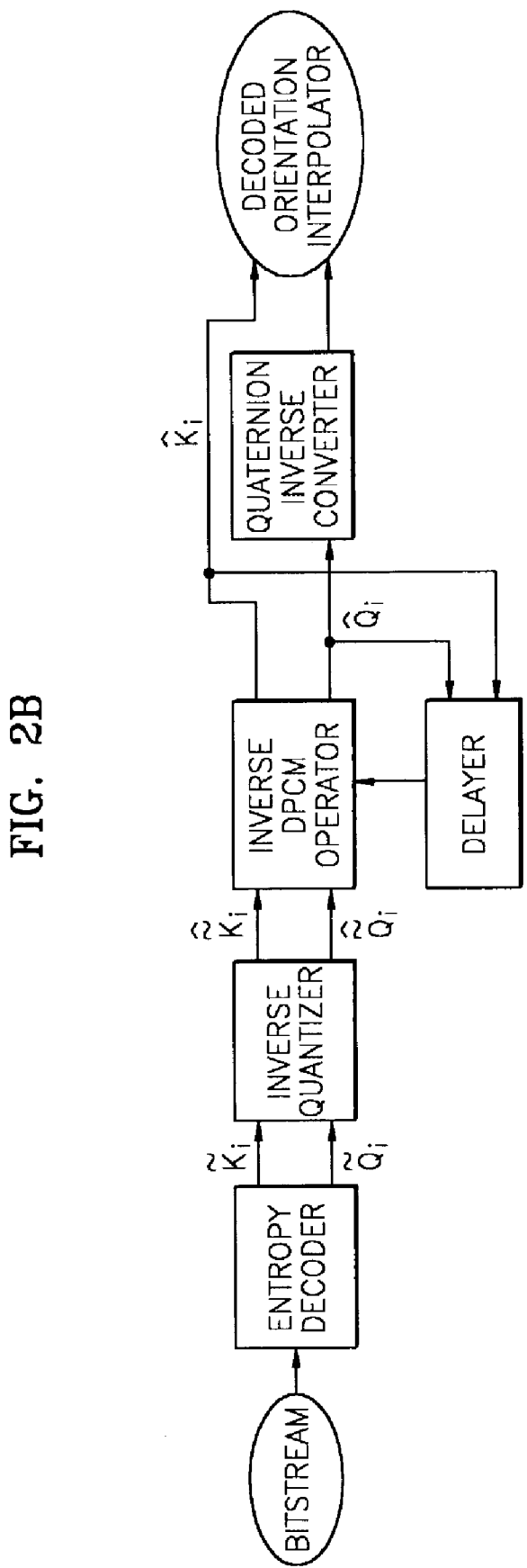
Figure 3A:
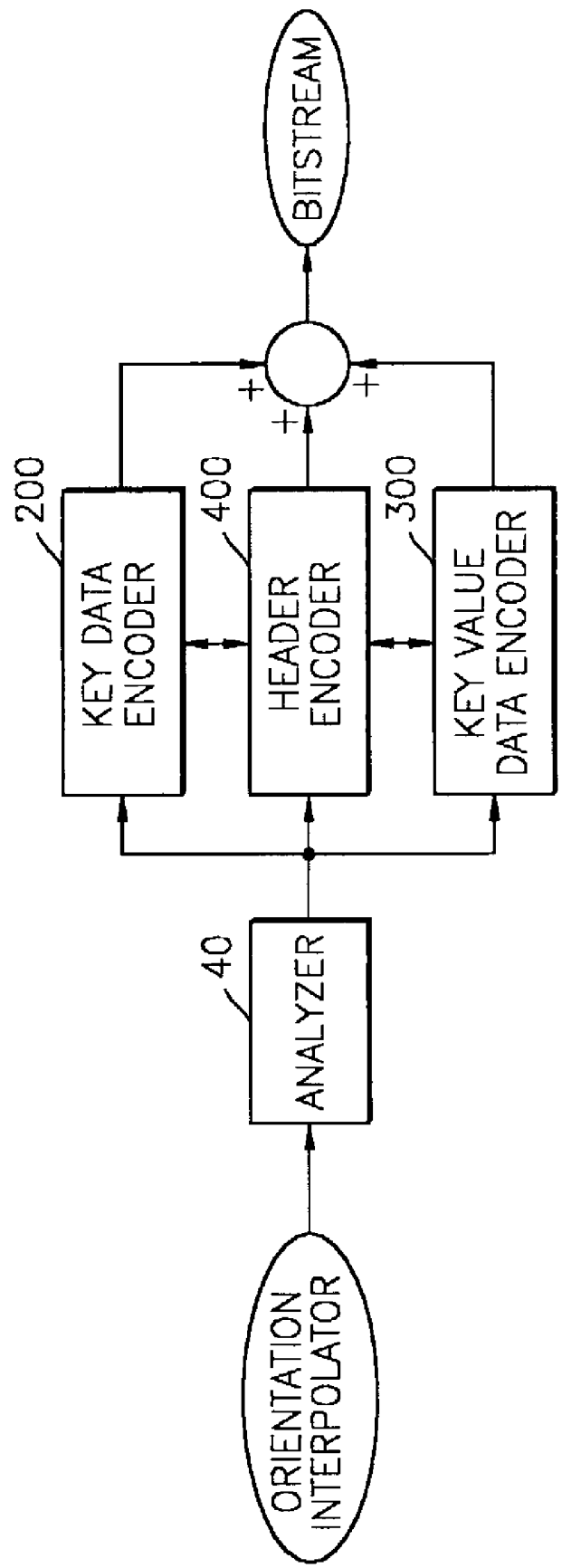
FIG. 3A is a block diagram of an apparatus for encoding an orientation interpolator according to a preferred embodiment of the present invention.

FIG. 3A is a block diagram of an apparatus for encoding an orientation interpolator according to a preferred embodiment of the present invention. Referring to FIG. 3A, the apparatus for encoding an orientation interpolator includes an analyzer 40, a key data encoder 200, a key value data encoder 300, and a header encoder 400.

Figure 3B:
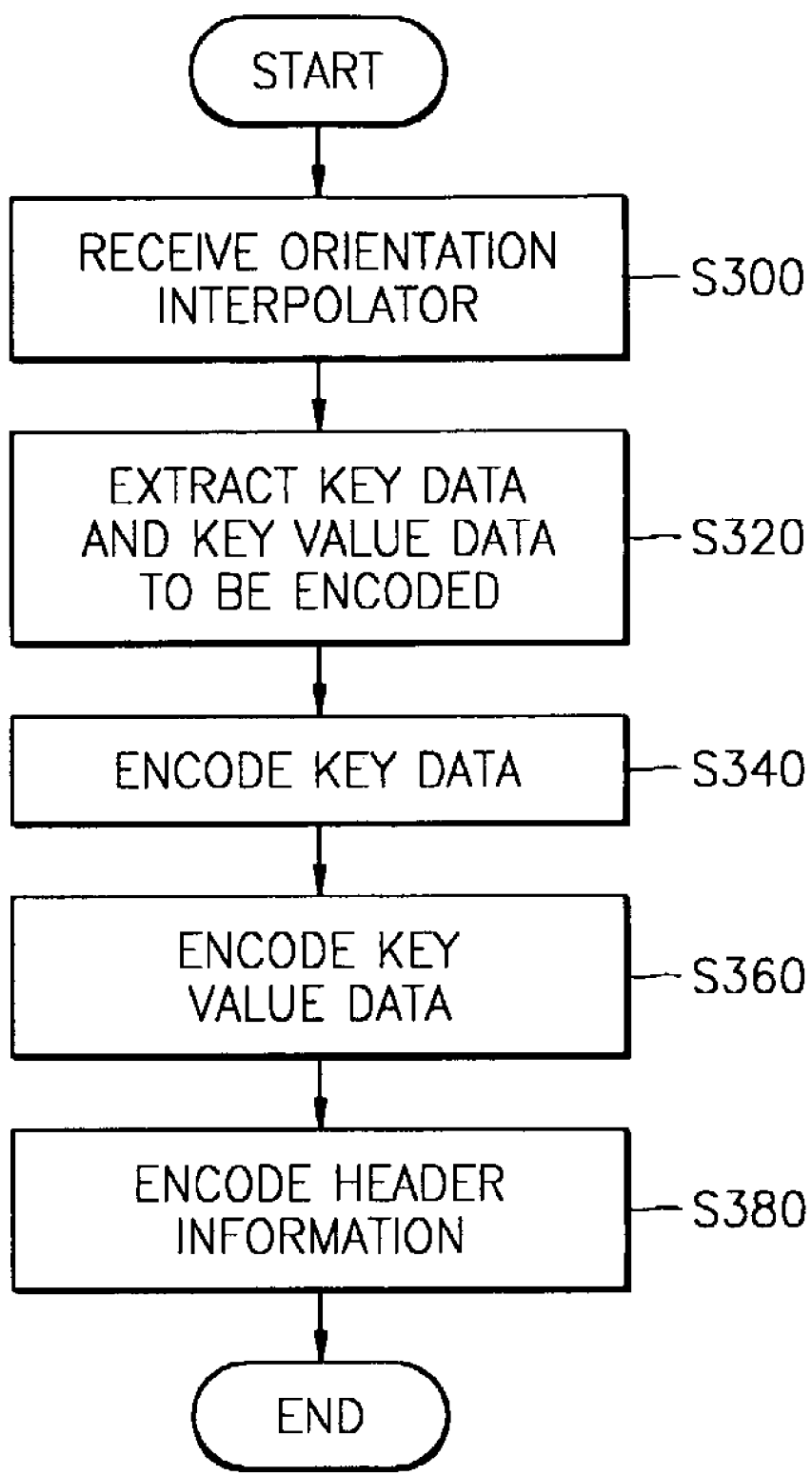
FIG. 3B is a flowchart of a method for encoding an orientation interpolator according to a preferred embodiment of the present invention.

FIG. 3B is a flowchart of a method for encoding an orientation interpolator according to a preferred embodiment of the present invention. Referring to FIG. 3B, an orientation interpolator to be encoded is input into the analyzer 40 in step S300. In step S320, the analyzer 40 extracts key data and key value data to be encoded from a first animation path comprised of key value data of x, y, z and theta(rotation angle) components of the orientation interpolator, outputs the extracted key data to the key data encoder 200, and outputs the extracted key value data to the key value data encoder 300.

The key data encoder 200 quantizes the key data input from the analyzer 40 using a predetermined number of quantization bits, generates differential data by performing a predetermined DPCM operation on the quantized key data, and entropy-encodes the differential data in step S340.

The key value data encoder 300 quantizes the key value data input from the analyzer 40 using a predetermined number of quantization bits, generates differential data by performing a predetermined DPCM operation on the quantized data, and encodes the differential data in step S360.

The header encoder 400 receives information necessary to decode the key data and key value data from the key data encoder 200 and the key value data encoder 300 and encodes the information in step S380.

Hereinafter, the structures and operations of the analyzer 40, the key data encoder 200, and the key value data encoder 300 will be described in greater detail with the accompanying drawings.

Figure 4A:
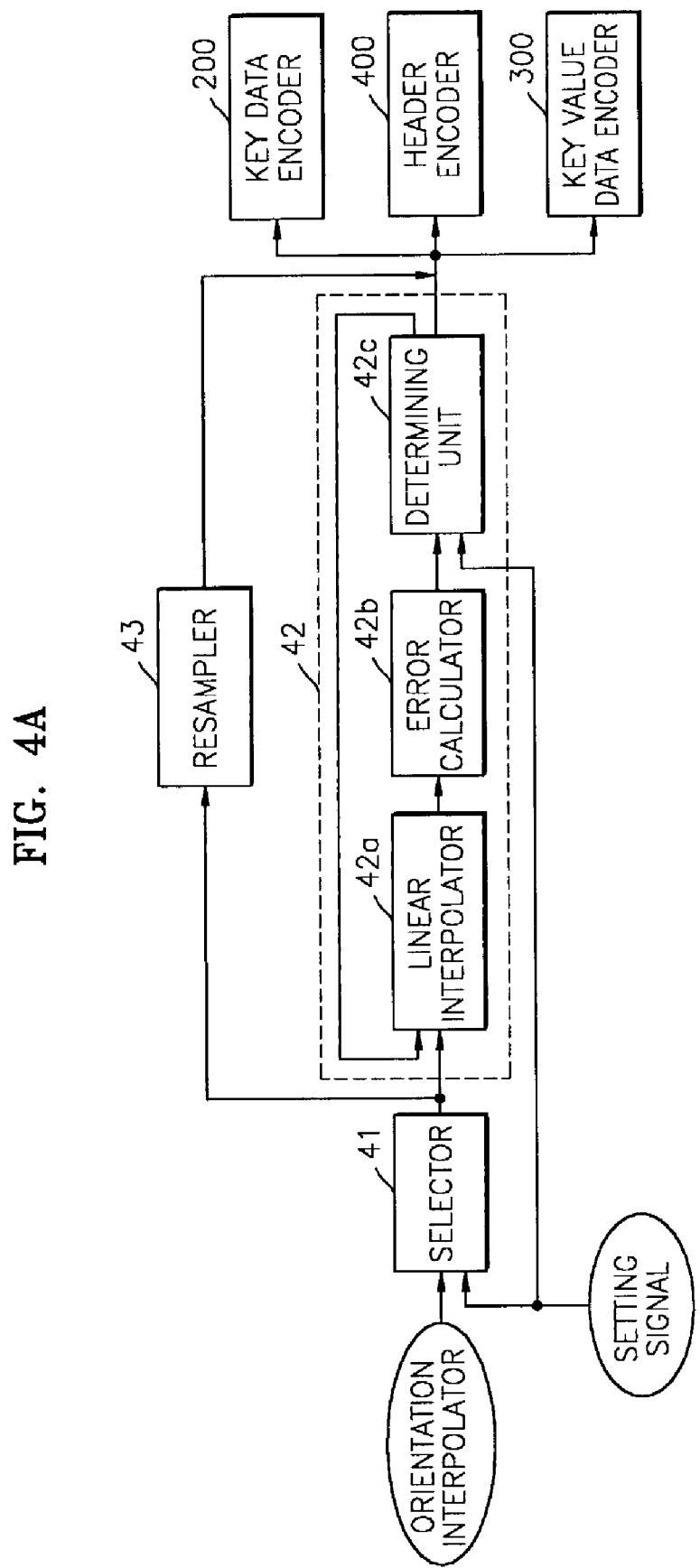
FIGS. 4A through 4C are block diagrams of examples of an analyzer according to preferred embodiments of the present invention.

FIG. 4A is a block diagram of an example of the analyzer 40 according to a first embodiment of the present invention. Even though a process of extracting key data and key value data to be encoded using the analyzer 40 can be performed on all the components (x, y, z and theta) of key value data, this process will be described in the following paragraphs, taking only one of the components of the key value data (the orientation interpolator) into consideration for the convenience of explanation.

Referring to FIG. 4A, the analyzer according to the first embodiment of the present invention includes a resampler 43, which samples a first animation path based on an input orientation interpolator into a predetermined number of sections having intervals of a predetermined amount of time with one another and outputs the sampled animation path to a key encoder 200, a key value encoder 300, and a header encoder 400, an break point extractor 42, which extracts a minimum number of break points by which an error between the first animation path and a second animation path generated based on break points extracted from the first animation path can be prevented from exceeding a predetermined error limit, and outputs the extracted break points to the key data encoder 200, the key value data encoder 300, and the header encoder 400, and a selector 41, which outputs the input orientation interpolator to the resampler 43 or the break point extractor 42 in response to an external input signal. The break point extractor 42 includes a linear interpolator 42a, an error calculator 42b, and a determining unit 42c.

Figure 5A:
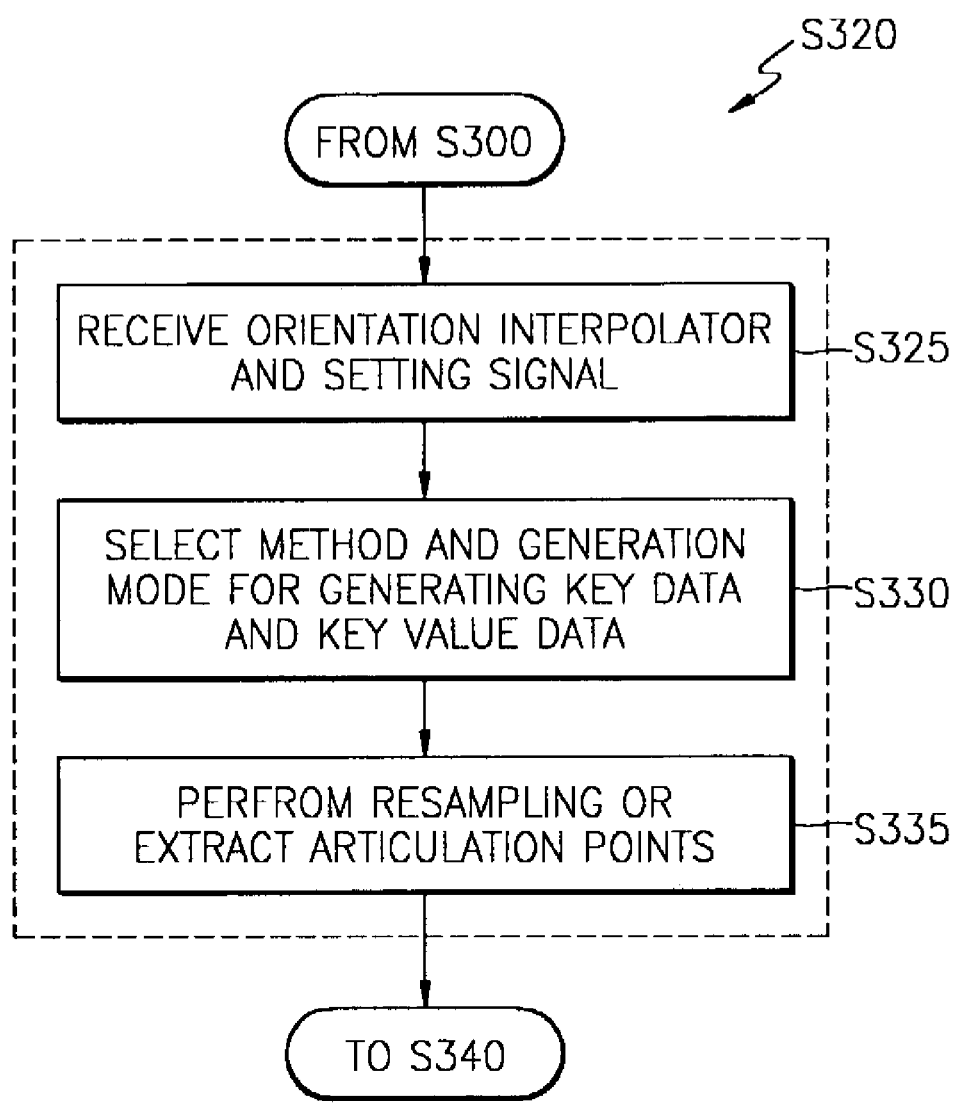
FIG. 5A is a flowchart of a step S320 shown in FIG. 3B.

FIG. 5A is a flowchart of the operation of the analyzer 40 according to the first embodiment of the present invention. Referring to FIG. 5A, the selector 41 receives an orientation interpolator and a setting signal from the outside in step S325. The setting signal includes a generation method setting signal used to determine a method of generating key data and key value data to be encoded and a generation mode setting signal used to determine a mode for generating key data and key value data to be encoded.

The mode for generating key data and key value data will be described first in the following paragraphs.

The analyzer 40 reduces the amount of key data and key value data to be encoded by decreasing the number of keyframes of an orientation interpolator input thereinto. The analyzer 40 is supposed to have either an animation path-preserving mode or an animation key-preserving mode, depending on a mode setting signal input thereinto from the outside.

In an animation path-preserving mode, an orientation interpolator is only used to describe interpolation of an animation path, and random access to keyframes is not necessary. In order to effectively encode an orientation interpolator in the animation path-preserving mode, key data of an orientation interpolator existing along an animation path within a predetermined error range and key value data corresponding to the key data may be removed.

On the other hand, in an animation key-preserving mode, it is necessary to have random access to keyframes using MPEG-4 BIFS commands, such as 'replace', 'delete', or 'insert'. In the animation key-preserving mode, the number of key data of an orientation interpolator does not change. The animation path-preserving mode and the animation key-preserving mode will be described more fully later.

Referring to FIG. 5A again, the selector 41 selects a mode for generating key data and key value data to be encoded, following a generation mode input from the outside. In step S330, the selector 41 outputs the input orientation interpolator to the break point extractor 42, if the input generation mode is an animation key-preserving mode. If the input generation mode is an animation path-preserving mode, the selector 41 outputs the input orientation interpolator to the resampler 43 or the break point extractor 42 together with information necessary to generate key data and key value data in step S330, in response to a generation method setting signal input from the outside.

Specifically, in the case of generating key data and key value data to be encoded by resampling, the selector 41 outputs the number of key data (i.e., time intervals) and a generation mode together with the orientation interpolator to the resampler 43. In the case of generating key data and key value data to be encoded by extracting break points, the selector 41 outputs a critical error between an original animation path and a path to be generated by the extracted break points and the generation mode to the break point extractor 42.

The resampler 43 generates sampled key data and sampled key value data by sampling an animation path generated by the orientation interpolator input from the selector 41 at intervals of a predetermined amount of time, and the break point extractor 42 extracts a minimum number of break points, by which an error between the animation path generated by the input orientation interpolator and an animation path to be generated by the extracted break points can be prevented from exceeding a predetermined error limit, in step S335.

Figure 5B:
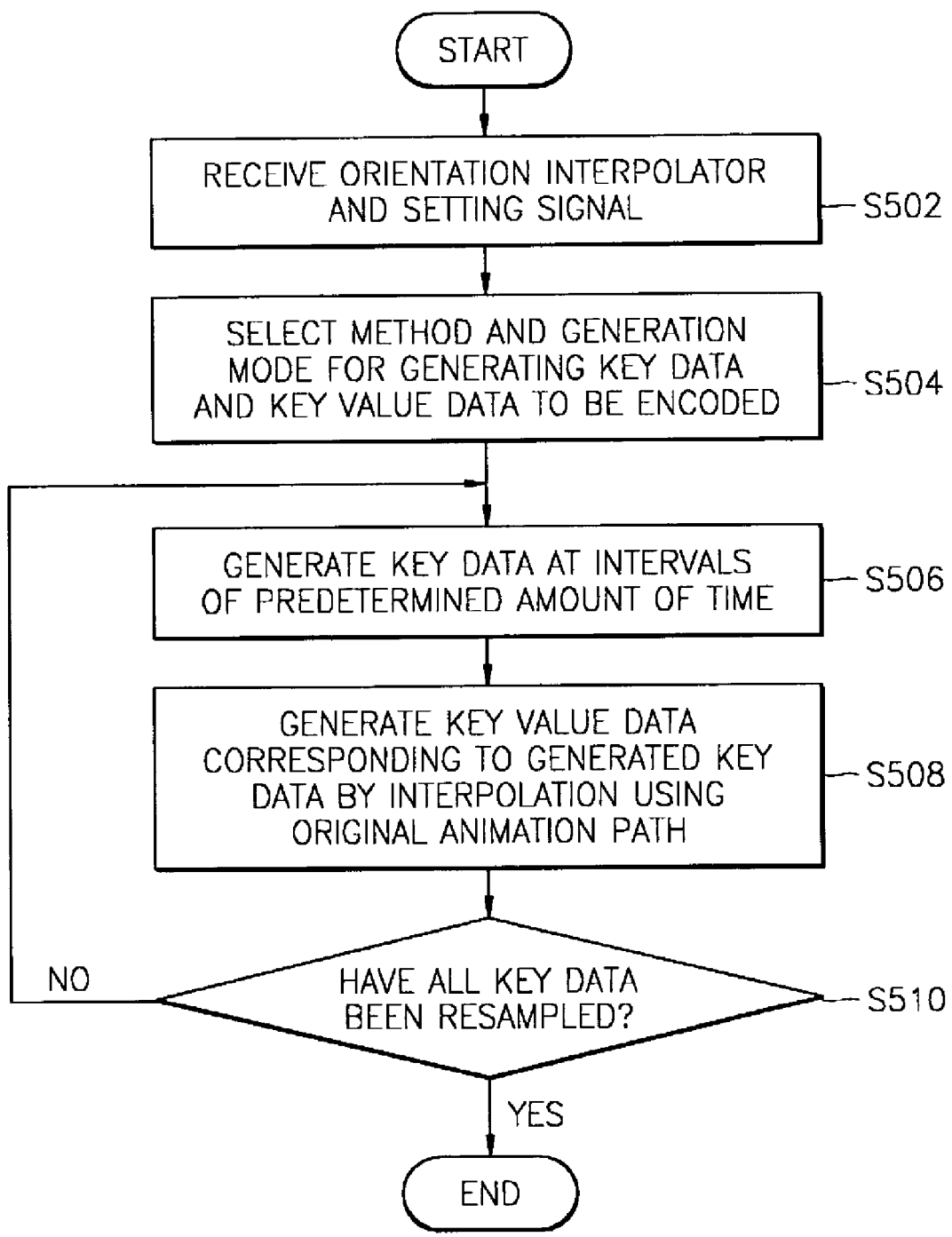
FIG. 5B is a flowchart of a resampling method according to a preferred embodiment of the present invention.

FIG. 5B is a flowchart of the operation of the resampler 43 according to a preferred embodiment of the present invention. Referring to FIG. 5B, the resampler 43 receives an orientation interpolator and the number (m) of key data to be resampled from the selector 41 in step S502. The number (m) of key data to be resampled may be arbitrarily set up by a user or may be set up at a predetermined value in advance.

The resampler 43 selects a first path point and a final path point of an original animation path generated by the input orientation interpolator and sets up an initial value (i) of the key data to be resampled at 1 in step S504.

Thereafter, the resampler 43 generates i-th key data at intervals of a predetermined amount of time in step S506.

Figure 6A:
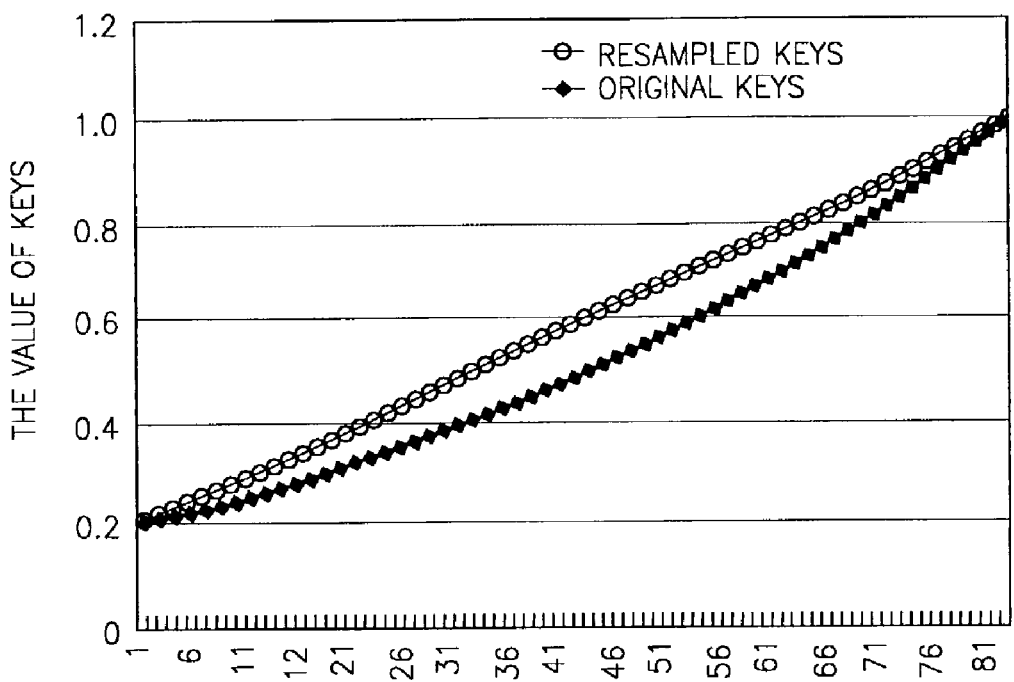
FIG. 6A is a diagram illustrating original key data and resampled key data.
Figure 6B:
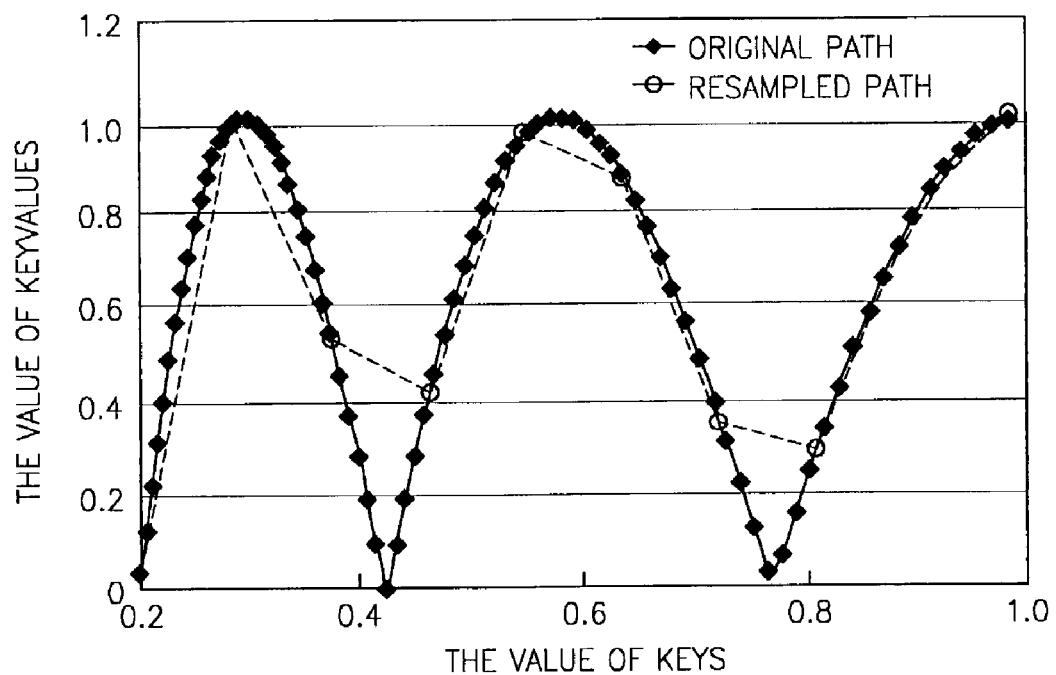
FIG. 6B is a diagram illustrating an original animation path and a resampled animation path.

FIG. 6A is a diagram illustrating original key data and resampled key data. Since the key data of the input orientation interpolator represent the locations of keyframes on a temporal axis, the key data monotonously increase, but intervals among the key data are irregular, as shown in FIG. 6A.

Therefore, as shown in FIG. 6A, the resampler 43 obtains an interval of a predetermined amount of time by dividing a difference between key data respectively representing the first path point and the final path point selected in step S504 by the number of key data to be resampled and then resamples the key data to be resampled at intervals of the predetermined amount of time.

In step S508, the resampler 43 generates key value data corresponding to the key data generated by resampling by linear interpolation using the original animation path. In other words, key value data corresponding to the resampled key data are linearly interpolated using key value data corresponding to key data right after the resampled key data and key value data corresponding to key data right before the resampled key data.

Thereafter, in step S510, the resampler 43 verifies if the resampling process has been performed on all the key data to be resampled and repeatedly performs steps S506 and S508 until all the key data and their corresponding key value data are resampled.

Figure 5C:
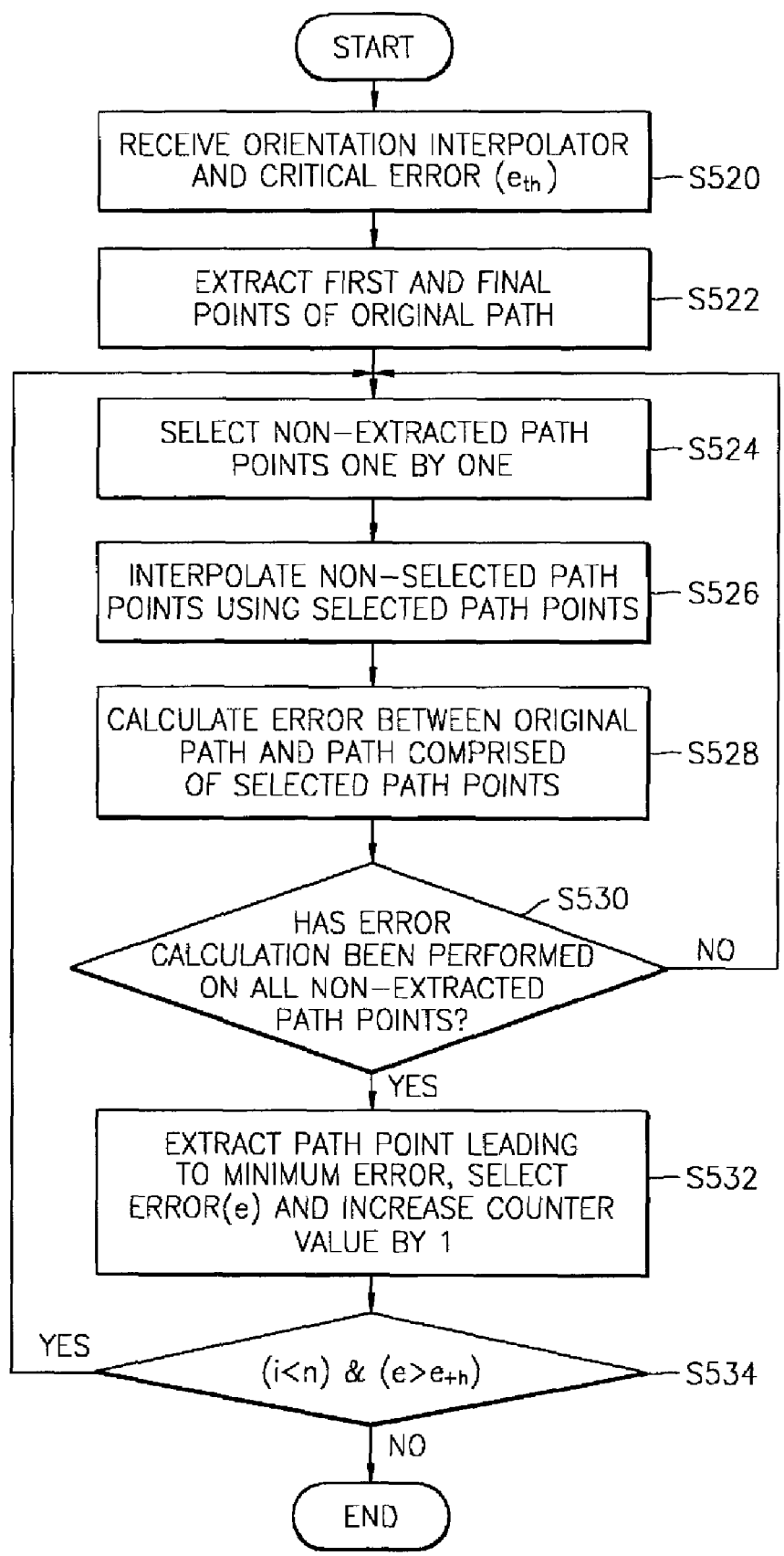
FIG. 5C is a flowchart of a method of extracting break points according to a preferred embodiment of the present invention.

FIG. 5C is a flowchart of a method of extracting break points according to a first embodiment of the present invention, and FIGS. 7A through 7F are diagrams illustrating each step of extracting break points from an orientation interpolator according to a preferred embodiment of the present invention.

Figure 7A:
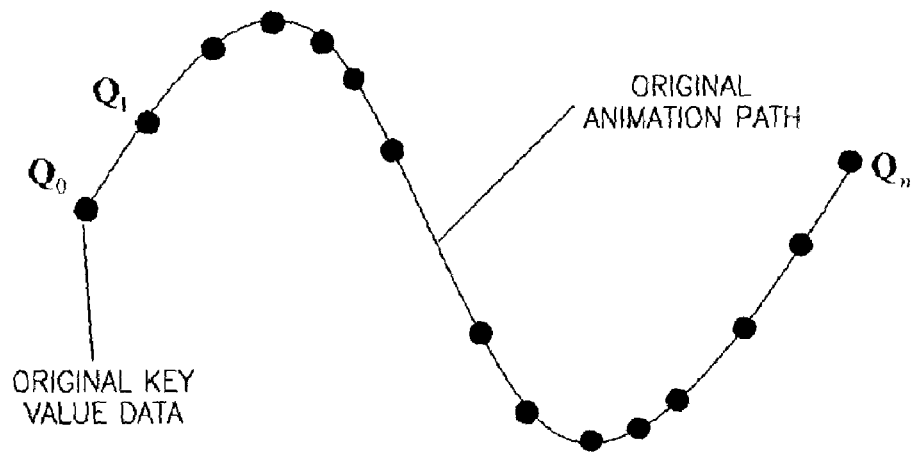
FIGS. 7A through 7F are diagrams illustrating an example of a method of extracting break points according to a preferred embodiment of the present invention.
Figure 7B:
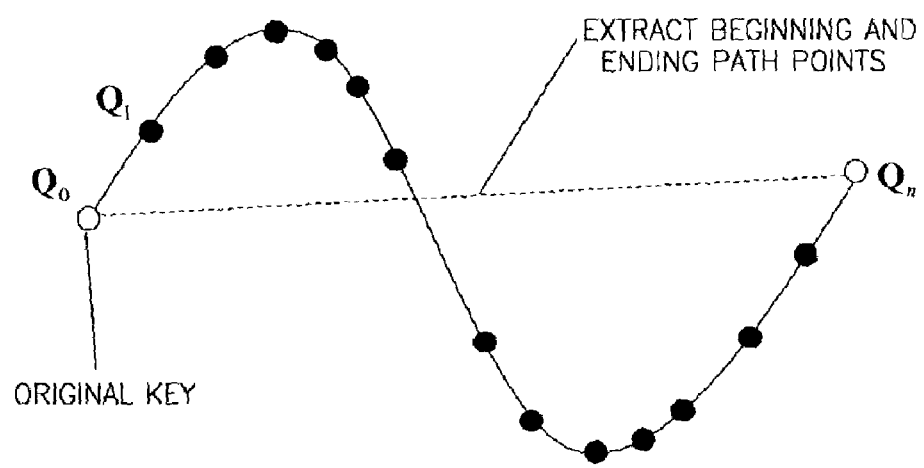

Referring to FIGS. 4A, 5C, and 7A through 7F, the linear interpolator 42a of the break point extractor 42 receives an orientation interpolator and a critical error $e_{th}$ from the selector 41 in step S520. An animation path constituted by the input orientation interpolator is shown in FIG. 7A.

The linear interpolator 42a extracts a first path point $Q_0$ and a final path point $Q_n$ of the animation path constituted by the input orientation interpolator, as shown in FIG. 7A, and sets up a counter (i) at 1 in step S522.

The linear interpolator 42a arbitrarily or sequentially selects path points between the first and final path points $Q_0$ and $Q_n$ one by one in step S524. Next, the linear interpolator 42a linearly interpolates path points, which have not been selected yet, using the selected path points and outputs the selected path points and the interpolated path points to the error calculator 42b in step S526.

The error calculator 42b calculates an error (e) between the original animation path and a candidate animation path constituted by the selected path points and the interpolated path points and outputs the error (e) to the determining unit 42c in step S528. The method of calculating the error (e) will be described later.

The error calculator 42b checks if among the path points, which have not been selected by the linear interpolator 42a, there still exists path points, which have not been considered when calculating the error (e). If there are path points, which have not been considered when calculating the error (e), the error calculator 42b calculates an error between the path points and the original animation path in step S530 by repeatedly performing steps S524 through S528.

Figure 7C:
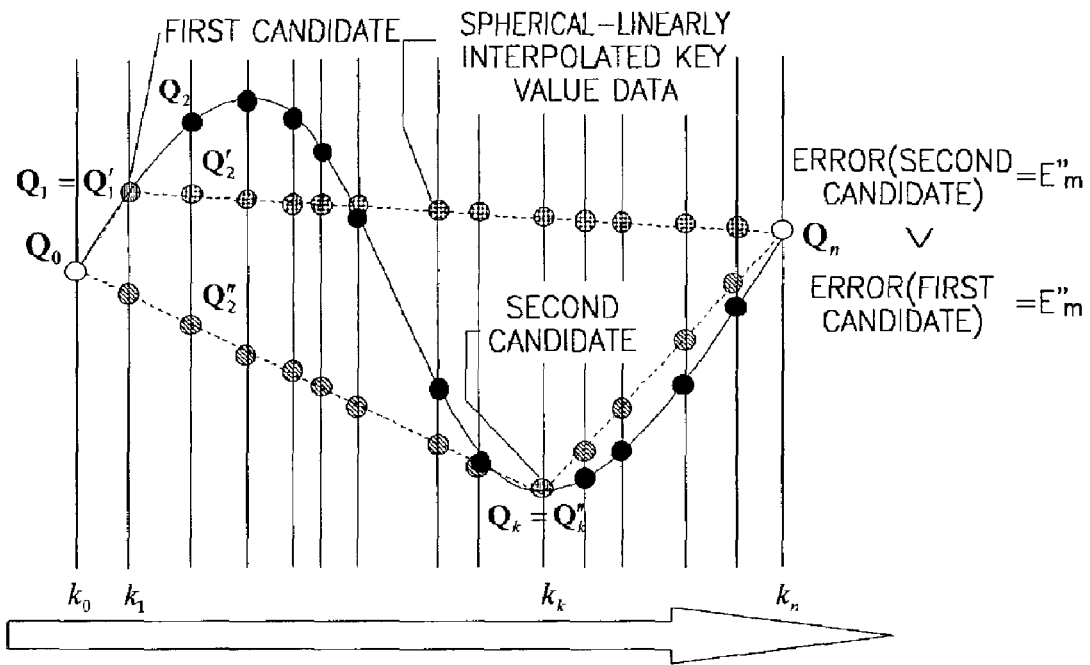
Figure 7D:
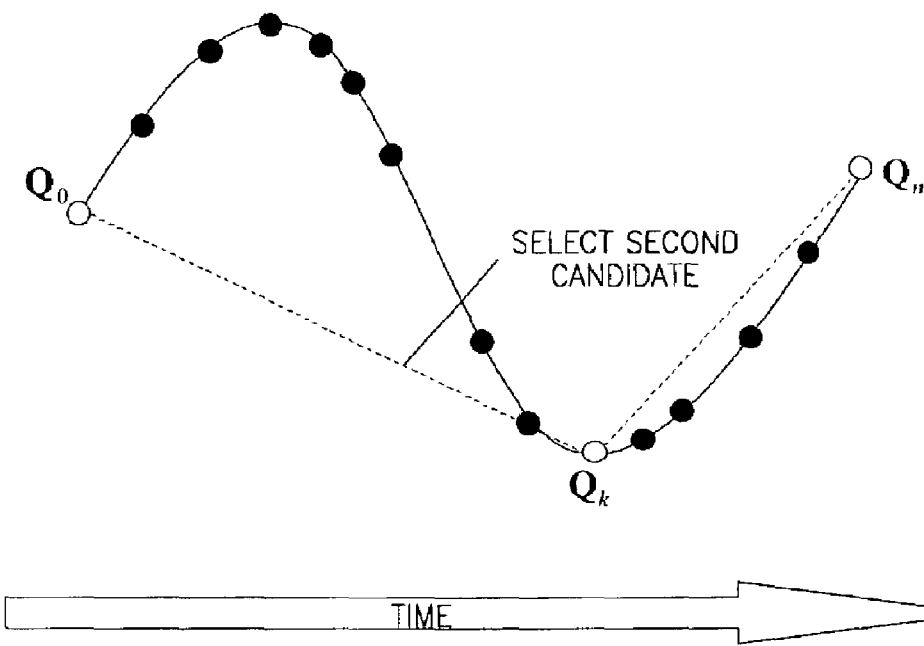
Figure 7E:
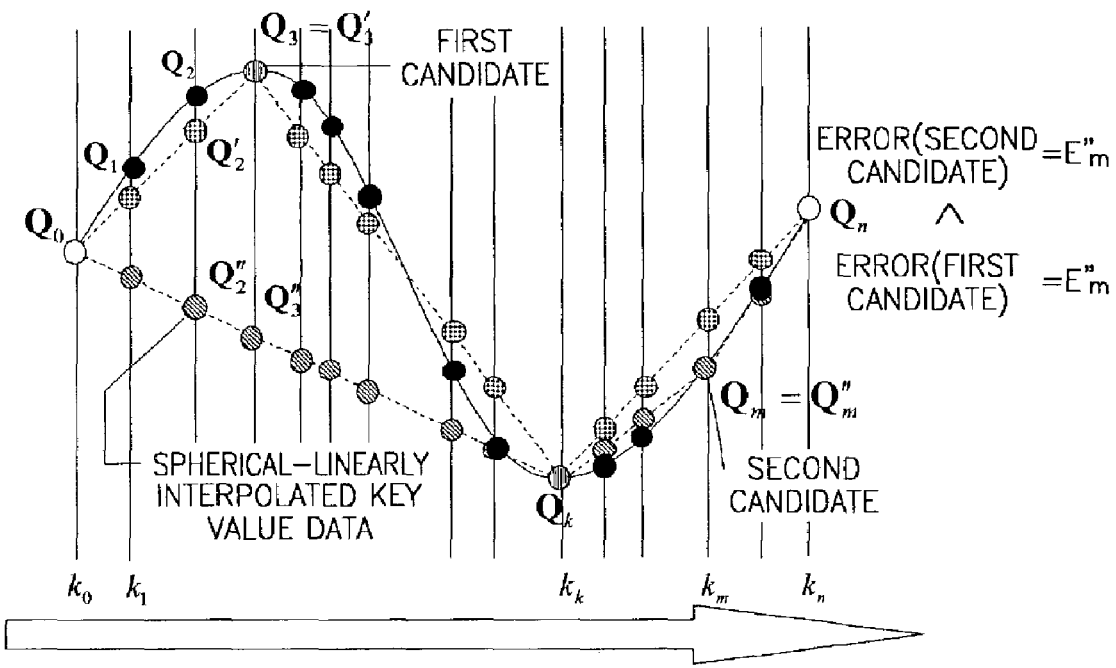
Figure 7F:
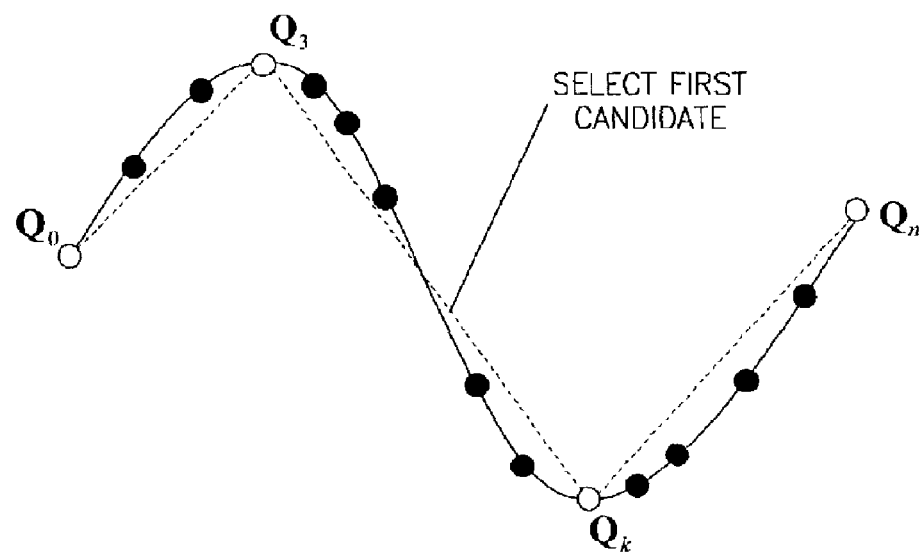

FIG. 7C is a diagram illustrating steps S524 through S530. Referring to FIG. 7C, the linear interpolator 42a extracts an break point $Q_1$ corresponding to key data at a predetermined moment of time $k_1$ and generates a first candidate animation path by linearly interpolating path points between the first path point $Q_0$ and the break point $Q_1$. The error calculator 42b calculates an error $e_1$ between the original animation path and the first candidate animation path. Thereafter, in the same manner, the linear interpolator 42a selects another break point $Q_k$ and generates a k-th candidate animation path by linearly interpolating path points between the first path point $Q_0$ and the break point $Q_k$ and between the break point $Q_k$ and the final path point $Q_n$. The error calculator 42b calculates an error ($e_k$) between the original animation path and the k-th candidate animation path.

If steps S524 through S530 have been performed on all the path points that have not been selected by the linear interpolator 42a, errors between the original animation path and candidate animation paths each generated following steps S524 through S530 are output to the determining unit 42c. Then, the determining unit 42c selects an break point, which forms a candidate animation path having the smallest error with the original animation path, and increases the value of the counter (i) by 1 in step S532.

The determining unit 42c checks if an error (e) between the original animation path and the candidate animation path constituted by the extracted break point is greater than the critical error $e_{th}$ and the value of the counter (i) is greater than the number (n) of key data, i.e., the number of path points between the first path point $Q_0$ and the final path point $Q_n$, in step S534.

If the error (e) is smaller than the critical error $e_{th}$, it means all the break points required for encoding have been extracted. If the number of break points finally selected as the ones to be encoded is equal to 'n', which means that all the path points of the process of extracting break points is completed.

However, if the number of extracted break points is smaller than n and the error (e) is greater than the critical error $e_{th}$, which means there still exists break points to be extracted, the selected break points are output to the linear interpolator 42a, and then steps S524 through S532 are performed again.

Hereinafter, data, which are supposed to be output from the resampler 43 and the break point extractor 42 to the key data encoder 200 and the key value data encoder 300 when the generation mode is an animation path-preserving mode, will be described in the following paragraphs.

The resampler 43 outputs sampled key data and sampled key value data to the key data encoder 200 and the key value data encoder 300, respectively, as key data and key value data to be encoded, respectively.

Hereinafter, key data and key value data output from the break point extractor 42 depending on a generation mode will be described with reference to FIG. 8.

Figure 8:
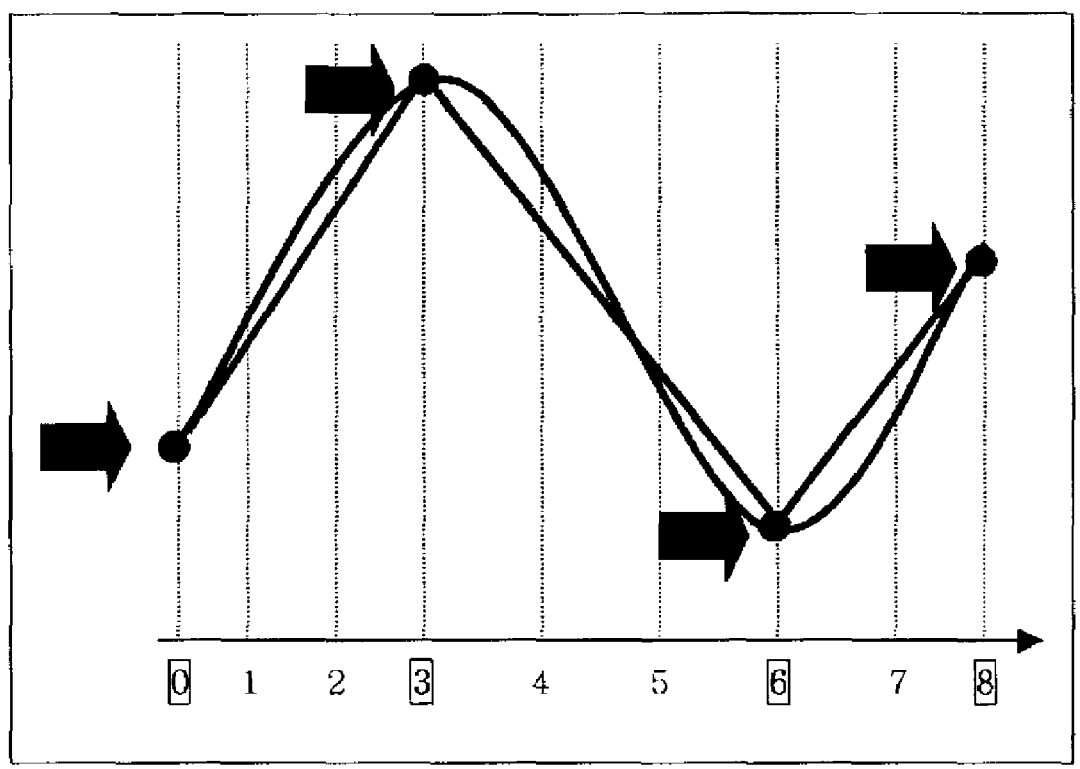
FIG. 8 is a diagram illustrating key data and key value data output from an break point extractor in an break point generation mode.

As shown in FIG. 8, supposing finally extracted break points are referred to as 0, 3, 6, and 8, key data and key value data corresponding to the break points 0, 3, 6, and 8 are output with a key selection flag, which is shown in the following table.

TABLE 2

| Key Data of Original Path | P0 | P1 | P2 | P3 | P4 | P5 | P6 | P7 | P8 |
|---|---|---|---|---|---|---|---|---|---|
| Key Selection Flag | 1 | 0 | 0 | 1 | 0 | 0 | 1 | 0 | 1 |

The structure of the analyzer 40 according to the first embodiment of the present invention has been described above. However, the analyzer 40 may be only constituted by the break point extractor 42 without the selector 41 and the resampler 43 or may be only constituted by the resampler 43 without the selector 41 and the break point extractor 42, which is obvious to one skilled in the art.

Hereinafter, another example of the analyzer 40 according to a second embodiment of the present invention will be described.

Figure 4B:
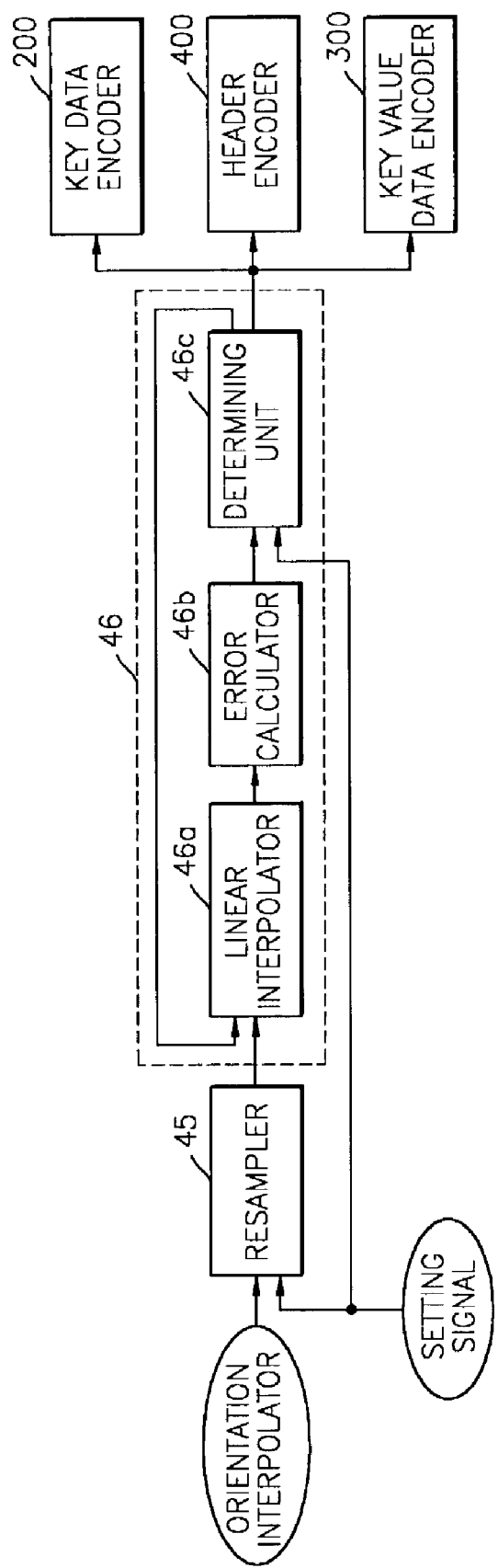

Referring to FIG. 4B, the analyzer 40 according to the second embodiment of the present invention includes a resampler 45, which receives and resamples an orientation interpolator, and an break point extractor 46, which extracts break points of the resampled orientation interpolator and outputs key data and key value data to be encoded. The break point extractor 46 in the second embodiment of the present invention, like the one in the first embodiment of the present invention, also includes a linear interpolator 46a, an error calculator 46b, and a determining unit 46c.

When an orientation interpolator is input into the analyzer 40, the resampler 45 resamples a first animation path constituted by the orientation interpolator into a predetermined number of sections having an interval of a predetermined amount of time with one another.

The resampler 45 outputs the orientation interpolator consisting of sampled key data and sampled key value data to the linear interpolator 46a of the break point extractor 46.

The linear interpolator 46a interpolates an orientation interpolator by performing steps S522 through S526 shown in FIG. 5C and outputs the interpolated orientation interpolator to the error calculator 46b. The error calculator 46b calculates an error between the first animation path and a second animation path constituted by the interpolated orientation interpolator by performing steps S528 and S530. The determining unit 46c selects a path point, which will lead to a minimum error between the first and second animation paths, verifies if the corresponding error is greater than a critical error $e_{th}$ and if all path points of the first animation path have been selected, and generates key data and key value data to be encoded.

As described above, in the analyzer 40 according to the second embodiment of the present invention, the operation of the resampler 45 and the break point extractor 46 is the same as the operation of the corresponding elements in the first embodiment of the present invention except that the break point extractor 46 receives an orientation interpolator consisting of the key data and key value data output from the resampler 45 and the process of extracting break points s performed on an animation path constituted by the orientation interpolator input from the resampler 45.

Hereinafter, an example of the analyzer 40 according to a third embodiment of the present invention will be described with reference to FIG. 4C.

Figure 4C:
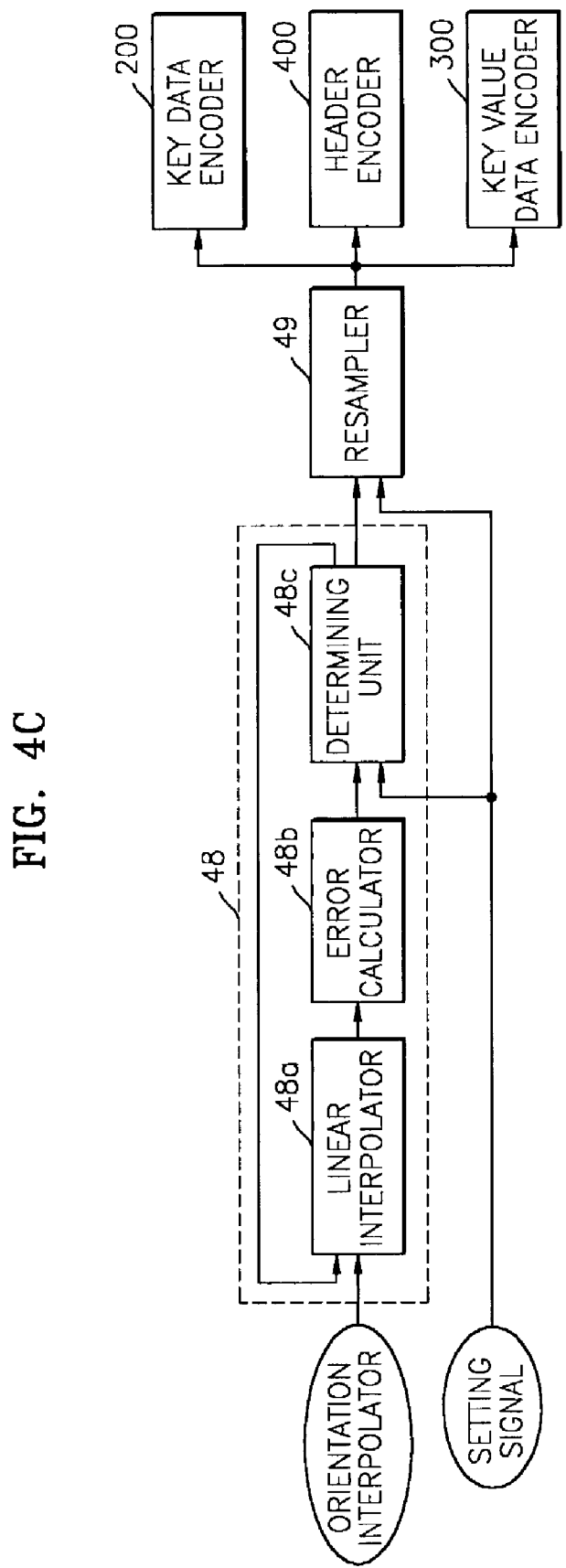

Referring to FIG. 4C, the analyzer 40 includes an break point extractor 48, which receives an orientation interpolator, extracts break points from a first animation path constituted by the orientation interpolator, and outputs key data and key value data, and a resampler 49, which resamples a second animation path constituted by an orientation interpolator consisting of the key data and key value data input from the break point extractor 48 at intervals of a predetermined amount of time. The break point extractor 48, like the ones in the first and second embodiments of the present invention, also includes a linear interpolator 48a, an error calculator 48b, and a determining unit 48c.

The break point extractor 48, like the one in the first embodiment of the present invention, outputs the key data and key value data extracted from the first animation path to the resampler 49.

The resampler 49 resamples an animation path constituted by an orientation interpolator consisting of the key data and key value data input from the break point extractor 48 at intervals of a predetermined amount of time and outputs the key data and key value data to be encoded. The function of the resampler 49 is the same as the ones in the first and second embodiments of the present invention, and thus its description will not be repeated here.

The key data and the key value data output from the analyzer 40 in the first through third embodiments of the present invention are output to the key data encoder 200 and the key value data encoder 300, respectively.

Hereinafter, the structure and operation of the key data encoder 200 will be described with reference to FIGS. 9A through 12J.

Figure 9A:
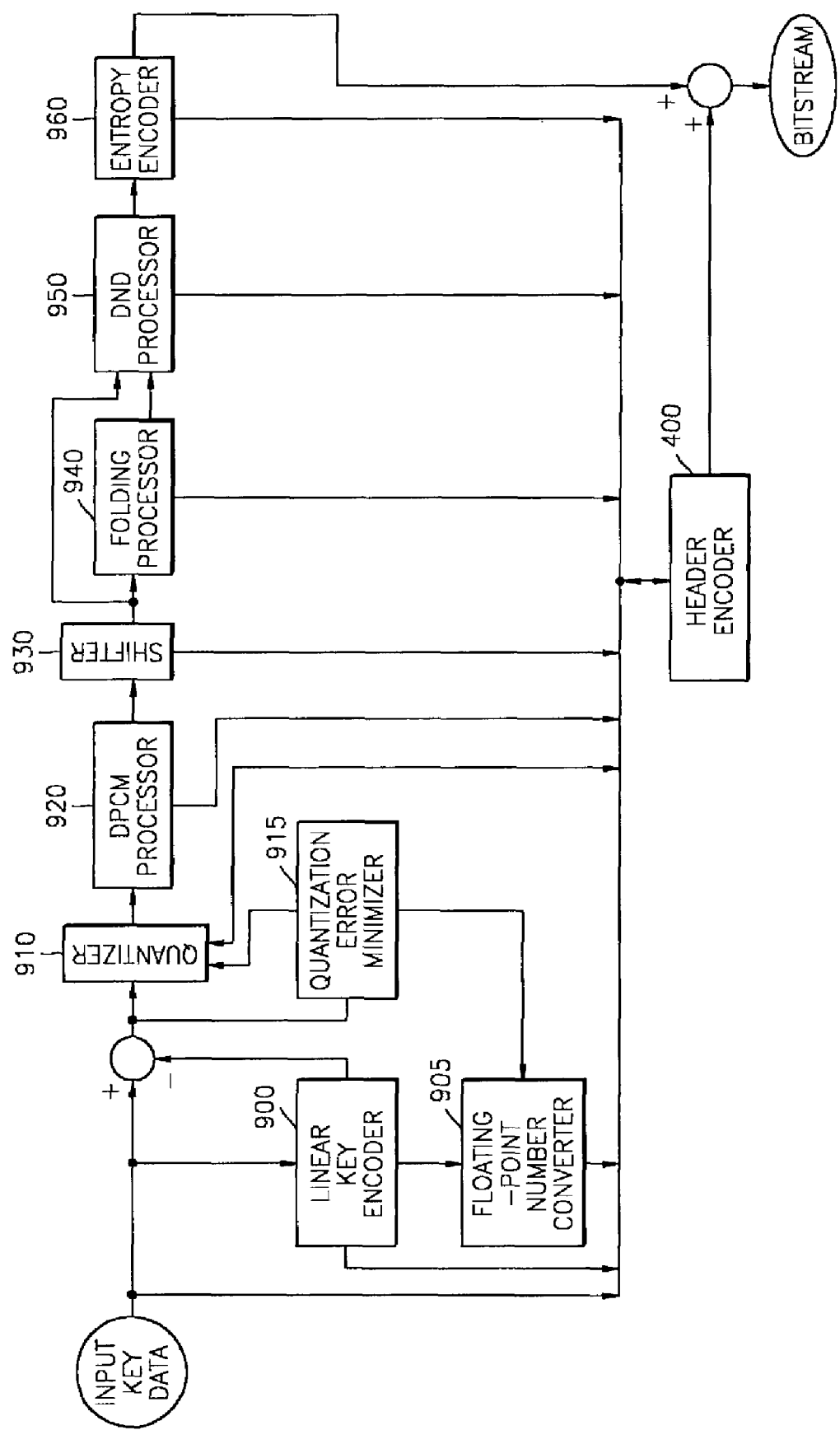
FIG. 9A is a block diagram of a key data encoder according to a preferred embodiment of the present invention.

FIG. 9A is a block diagram of a key data encoder according to a preferred embodiment of the present invention. Referring to FIG. 9A, a key data encoder 200 includes a linear key encoder 900, a quantizer 910, a DPCM processor 920, a shifter 930, a folding processor 940, a DND processor 950, and an entropy encoder 960.

The linear key encoder 900 identifies a region where key data linearly increase in an entire key data range and encodes the region. The quantizer 910 quantizes key data input thereinto using a quantization method capable of minimizing a quantization error. The DPCM processor 920 receives quantized key data and generates differential data of key data. The shifter 930 subtracts a differential datum having the highest frequency among all differential data from the differential data. The folding processor 940 transfers all differential data to either a positive number region or a negative number region. The DND processor 950 reduces the range of differential data of key data by performing a divide operation and then selectively performing a divide-up operation or a divide-down operation. The entropy encoder 960 encodes differential data using a function SignedAAC or UnsignedAAC on each bit plane.

Figure 10A:
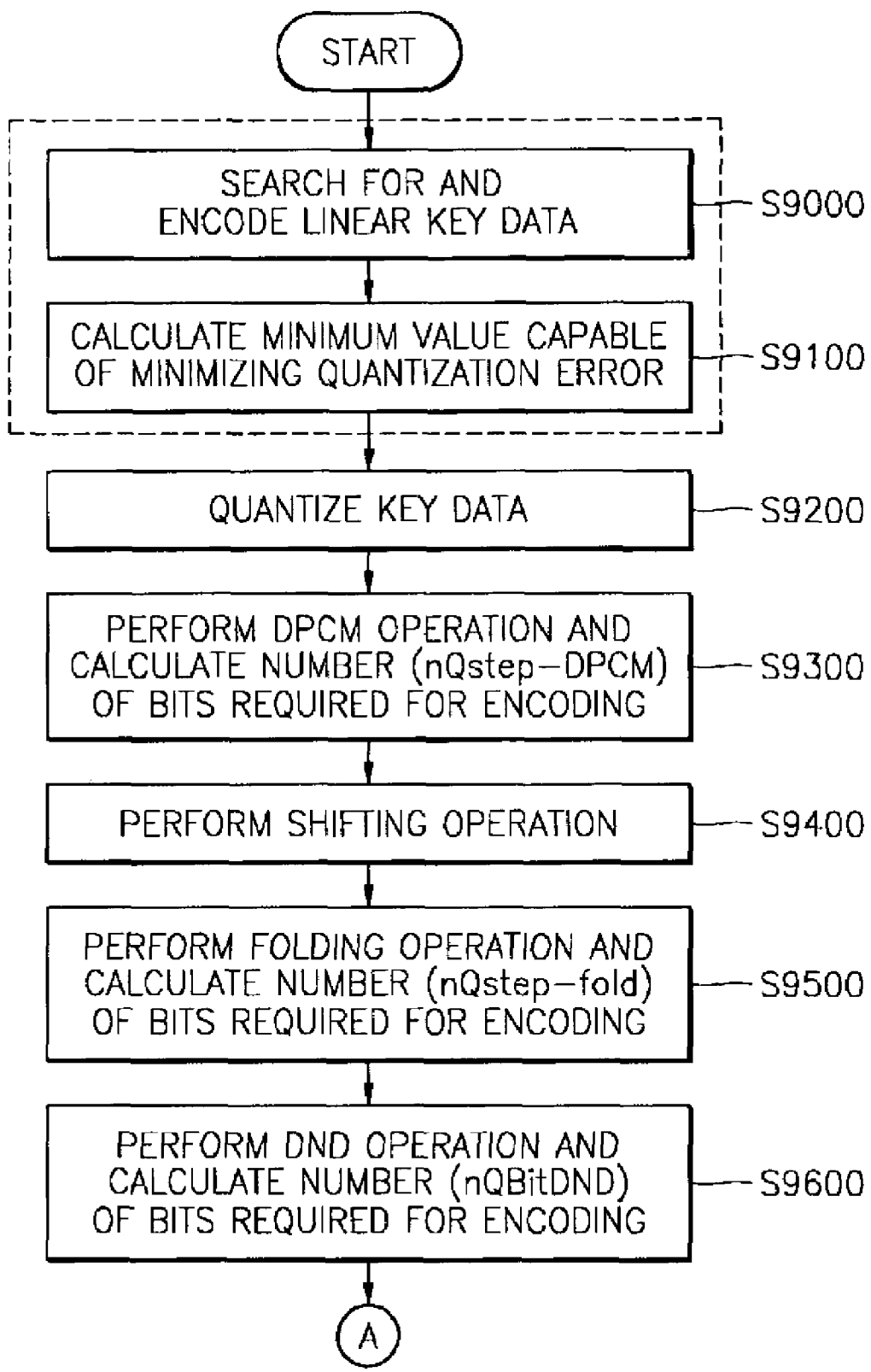
FIGS. 10A through 10G are flowcharts of a method of encoding key data according to a preferred embodiment of the present invention.

Hereinafter, the operation of the key data encoder 200 will be described more fully with reference to FIG. 10A. FIG. 10A is a flowchart of a method of encoding key data according to a preferred embodiment of the present invention. When key data are input into an apparatus for encoding an orientation interpolator, information, such as the number of key data and the number of digits of each of the key data, is input into the header encoder 400 and is encoded. The linear key encoder 900 searches for a region in the input key data where key frames exist at certain temporal intervals, key data have the same difference, and the key data changes linearly, and the searched linear region is encoded first in step S9000.

Famous 3D application software, such as 3DMax or Maya, generates key-frame based animation using keys having a predetermined time interval therebetween in specific regions. In this case, it is possible to easily encode key data using the beginning and ending key data of a linear key data region and the number of key frames existing between them. Accordingly, linear prediction is very useful for encoding keys in a certain region using an interpolator.

The following equation is used for linear prediction.

$$t(i) = \frac{t_E - t_S}{E - S} + t_S \quad (0 \le i \le E - S, S < E) \quad (4)$$

Here, $t_S$ represents the data of a key where a partially linear region begins, $t_E$ represents the data of a key where the partially linear region ends, S represents an index of $t_S$, and E represents an index of $t_E$. The error between real key data in a specific region ranging from S-th key data to E-th key data and key data linearly predicted following Equation (4) can be calculated using the following equation.

$$e_i = t(i) - t_{i+S} = \frac{t_E - t_S}{E - S} i + t_S - t_{i+S} \quad (5)$$

If a maximum value among errors calculated using Equation (5) is not greater than a predetermined error limit, $t_i$ can be considered co-linear in region $[t_S, t_E]$ or within a certain range of errors. Whether or not the maximum error value $t_i$ is co-linear with the specific region is determined using the following Equation (6).

$$E_p = \underset{i=0,\ldots,(E-S)}{\text{MAX}} |e_i| = \underset{i=0,\ldots,(E-S)}{\text{MAX}} \left| \frac{t_E - t_S}{E - S} i + t_S - t_{i+S} \right| \quad (5)$$

If $$E_p \le \frac{1}{2^{nBits+1}},$$

$t_i$ is co-linear with region $[t_S, t_E]$. Here, nBits represents the number of bits used for encoding.

If the linear key encoder 900 searches for the partially linear region, the beginning and ending key data of the partially linear key data region are output to the floating-point number converter 905. The number of keys included in the linear key data region is output to the header encoder 400 and is encoded. It is possible to considerably reduce the amount of data to be encoded using linear encoding.

The beginning key data and the ending key data are encoded using floating-point number transformation, which will be described later.

The floating-point number converter 905 converts key data represented in the binary system into the decimal system in order to encode the beginning key data and the ending key data.

A computer stores floating-point numbers as 32-bit binary numbers. If a floating-point number represented in the binary system is given, the floating-point number converter 905 converts the floating-point number into a mantissa and an exponent in the decimal system, and this process is expressed by the following equation.

$$\underbrace{mantissa\_binary * 2^{exponent\_binary}}_{\text{the floating-point number in binary system}} = \underbrace{mantissa * 10^{exponent}}_{\text{the floating-point number in decimal system}} \quad (7)$$

For example, a floating-point number 12.34 can be converted into a binary number by a computer, which is shown in the following.

$$\underbrace{0}_{1} \quad \underbrace{10001010111000010100011}_{2} \quad \underbrace{10000010}_{3}$$

1: the sign
2: the mantissa in the binary system
3: the exponent in the binary system The binary number can be converted into a decimal number following Equation (7), which is shown in the following.

$$\underset{1}{0}\ \underset{2}{1234}\ \underset{3}{2}$$

1: the sign
2: the mantissa in the decimal system
3: the exponent in the decimal system In order to include a mantissa and an exponent in the decimal system in a bitstream, the numbers of bits required to represent the mantissa and the exponent must be calculated. The exponent has a value between −38 and 38 and thus can be expressed together with its sign using 7 bits. The number of bits required to represent the mantissa is dependent on the number of digits. The values of the mantissa and the number of bits required to represent the mantissa are shown in the following table.

TABLE 4

| Values of mantissa | Digits of mantissa | Number of bits required |
|---|---|---|
| 0 | 0 | 0 |
| 1–9 | 1 | 4 |
| 10–99 | 2 | 7 |
| 100–999 | 3 | 10 |
| 1000–9999 | 4 | 14 |
| 10000–99999 | 5 | 17 |
| 100000–999999 | 6 | 20 |
| 1000000–9999999 | 7 | 24 |

Figure 10B:
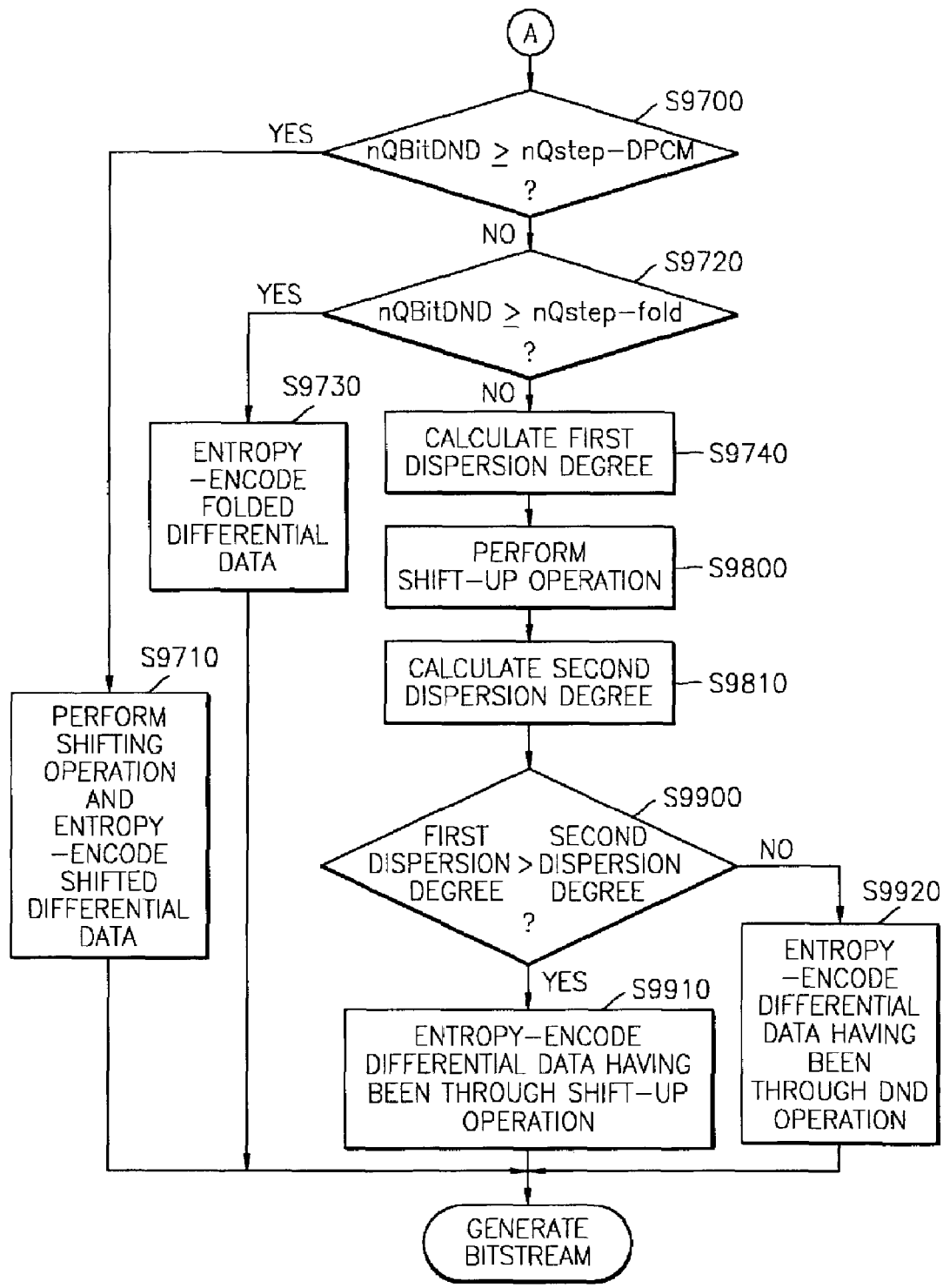

The beginning and ending key data of the linear key data region that has been searched for and converted using the above-mentioned processes are encoded following the encoding process shown in FIG. 10B, are output to the header encoder 400, and are stored in the bitstream.

FIG. 10B shows a process of encoding two input floating-point numbers performed in the floating-point number converter 905. The way the floating-point number converter 905 encodes a floating-point number will be described with reference to FIG. 10B.

The floating-point number converter 905 receives the digit number Kd of original key data, beginning key data S, and ending key data E and converts them in step S9040 following Equation (7).

The floating-point number converter 905 encodes S first. In particular, the floating-point number converter 905 checks whether or not the digit number of S is different from Kd. If the digit number of S is different from Kd, the digit number of S is obtained and is output to the header encoder 400 in step S9042. The floating-point number converter 905 obtains the digit number of S using function Digit ( ).

If the digit number of S is greater than 7, S is output to the header encoder 400 using a predetermined number of bits (in the present invention, 32 bits are used following a floating-point number manner of IEEE Standard 754) in step 9043 so that the digit number of S can be included in the bitstream.

If the digit number of S is not 0 and is smaller than 7, the floating-point number converter 905 outputs the sign of S to the header encoder 400 in step 9044. The number of bits required to encode the absolute value of the mantissa of S, is obtained using Table 4. Next, the absolute value of the mantissa of S is output to the header encoder 400 using the number of bits obtained using Table 4, in step S9045. The floating-point number converter 905 calculates the exponent of S, outputs the sign of S to the header encoder 400, and outputs the exponent to the header encoder 400 as a predetermined number of bits, for example, 6 bits, in step S9046. Such key data transformation makes it possible to considerably reduce the number of bits included in the bitstream.

If the digit number of S is 0, the encoding of the beginning key data is ended, and the method goes to a step of transforming the ending key data E because when the digit number of S is 0, the corresponding floating-point number is also 0 which does not require encoding.

After transforming and encoding the beginning key data S, the floating-point number converter 905 converts the ending key data E. The transformation of E is almost the same as that of S. In particular, the floating-point number converter 905 checks whether or not the exponent of E is the same as that of S in step S9047. If the exponent of E is the same as that of S, only a flag bit representing that the exponent of E is the same as the exponent of S is output to the header encoder 400. If the exponent of E is not the same as that of S, the exponent of E as well as the flag bit is output to the header encoder 400 in the same way as the exponent of S has been output to the header encoder 400, in step S9048.

Key data among the input key data which do not belong to the linear region are input into the quantizer 910 and quantized according to a predetermined quantization bit size, i.e., nKeyQBit.

However, in the case of decoding quantized key data using a decoder, it is impossible to perfectly recover original key data due to the error between the original key data and the quantized key data. Therefore, the quantizer 910 of the present invention obtains a maximum value and a minimum value among the input key data and quantizes the input key data using the maximum and minimum values. In addition, the present invention includes a quantization error minimizer 915 so that the error between original key data and their quantized key data can be minimized using the maximum and minimum values among the input key data.

The quantization error minimizer 915 quantizes or inverse-quantizes the input key data in advance using a method for controlling a range of quantization so that the quantization error can be minimized, in step S9100.

In particular, if a mixed maximum value used for quantization is represented by Max, a minimum value to be controlled for quantization is represented by Min, an input value is represented by $X_i$, and the number of bits used for quantization is represented by nQuantBit, then, a quantized input value $\tilde{X}_i$, an inverse-quantized value $\hat{X}_i$, and an error $e_i$ are obtained using the following equation.

$$\tilde{X}_i = \text{floor}(\frac{X_i - \text{Min}}{\text{Max} - \text{Min}} * (2^{nQuantBit} - 1) + 0.5) \quad (8)$$

$$\hat{X}_i = \frac{\tilde{X}_i * (\text{Max} - \text{Min})}{2^{nQuantBit} - 1} + \text{Min}$$

$$e_i = X_i - \hat{X}_i$$

There are two methods for reducing the sum $\Sigma e_i$ of errors. One is a method for reducing the sum of errors by continuously controlling Min until the sum of errors is minimized. The other is as follows.

First, let us assume that $X_i=(i+n)\Delta x+\epsilon_i$ where $X_i$ indicates an input key data sequence, $\Delta x$ indicates a basic step size of input data, n is an arbitrary integer, and $\epsilon_i$ indicates zero-mean random noise.

Next, when $d_i \equiv X_i - X_{i-1} = \Delta x + (\epsilon_i - \epsilon_{i-1}) \Delta' x = E[d_i]$ and Min=Max$-\Delta' x * (2^{nQuantBit}-1)$.

Min, which can make it possible to minimize a quantization error, and Max are input into the quantizer 910 and are used for quantization of key data.

The quantizer 910 receives the maximum and minimum values Max and Min which can minimize a quantization error and quantizes key data fKey$_i$ in step S9200, following Equation (9).

$$nQKey_i = \text{floor}\left(\frac{fKey_i - fKey\text{Min}}{fKey\text{Max} - fKey\text{Min}}(2^{nKeyQBit} - 1) + 0.5\right) \quad (9)$$

Here, i indicates an index of quantized key data, nQKey$_i$ indicates an array of integers of the quantized key data, fKey$_i$ indicates an array of floating-point numbers of the quantized key data, fKeyMax indicates a maximum value input from the quantization error minimizer 915, fKeyMin indicates a minimum value input from the quantization error minimizer 915, and nKeyQBit indicates a quantization bit size. In Equation (9), function floor(v) is a function which outputs a maximum integer no greater than a certain floating-point value v.

The quantizer 910 of the present invention may not use such algorithm for reducing a quantization error, in which case quantization is performed simply using the maximum and minimum values fKeyMax and fKeyMin among input key data.

Figure 10C:
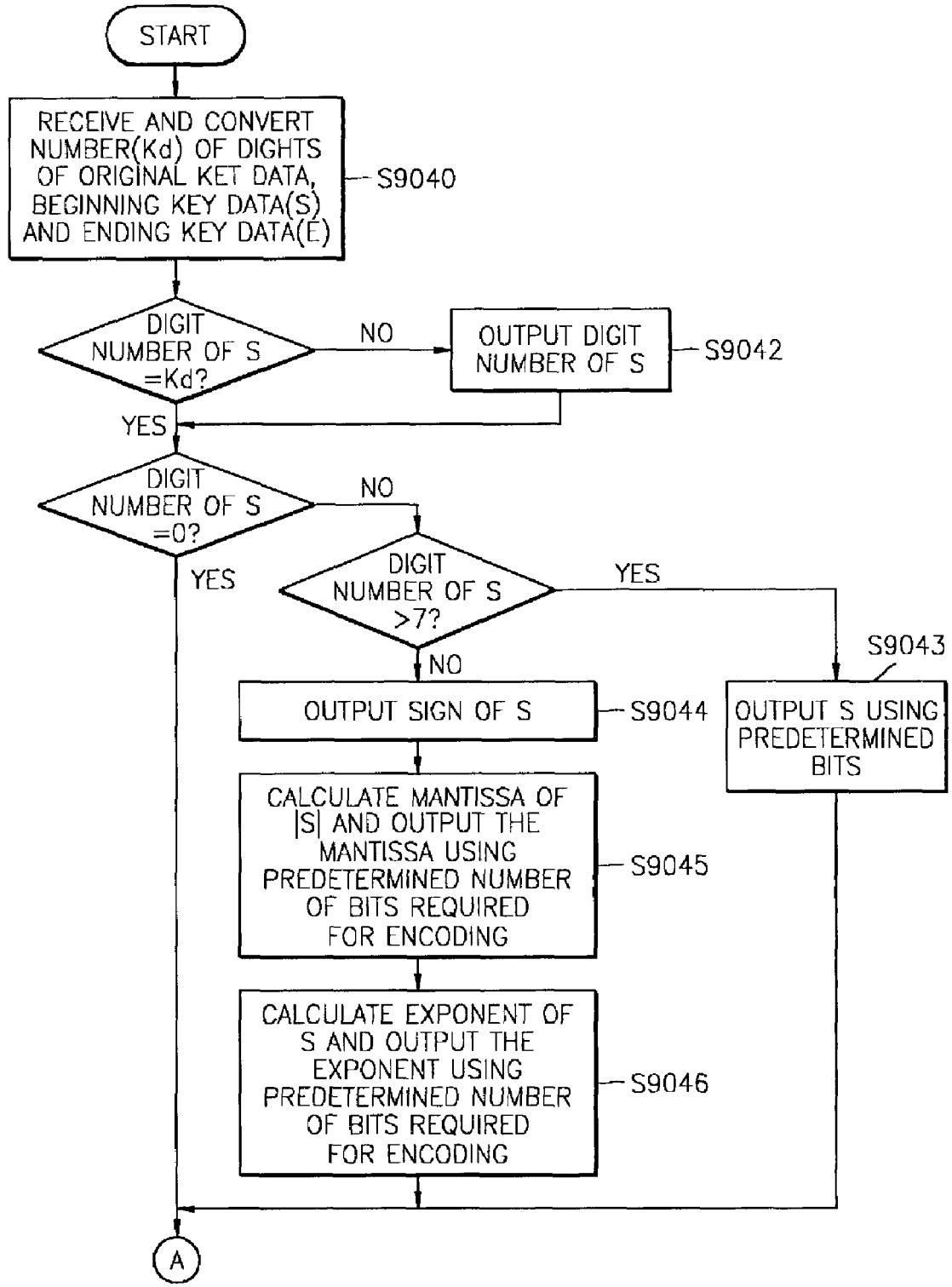
Figure 10D:
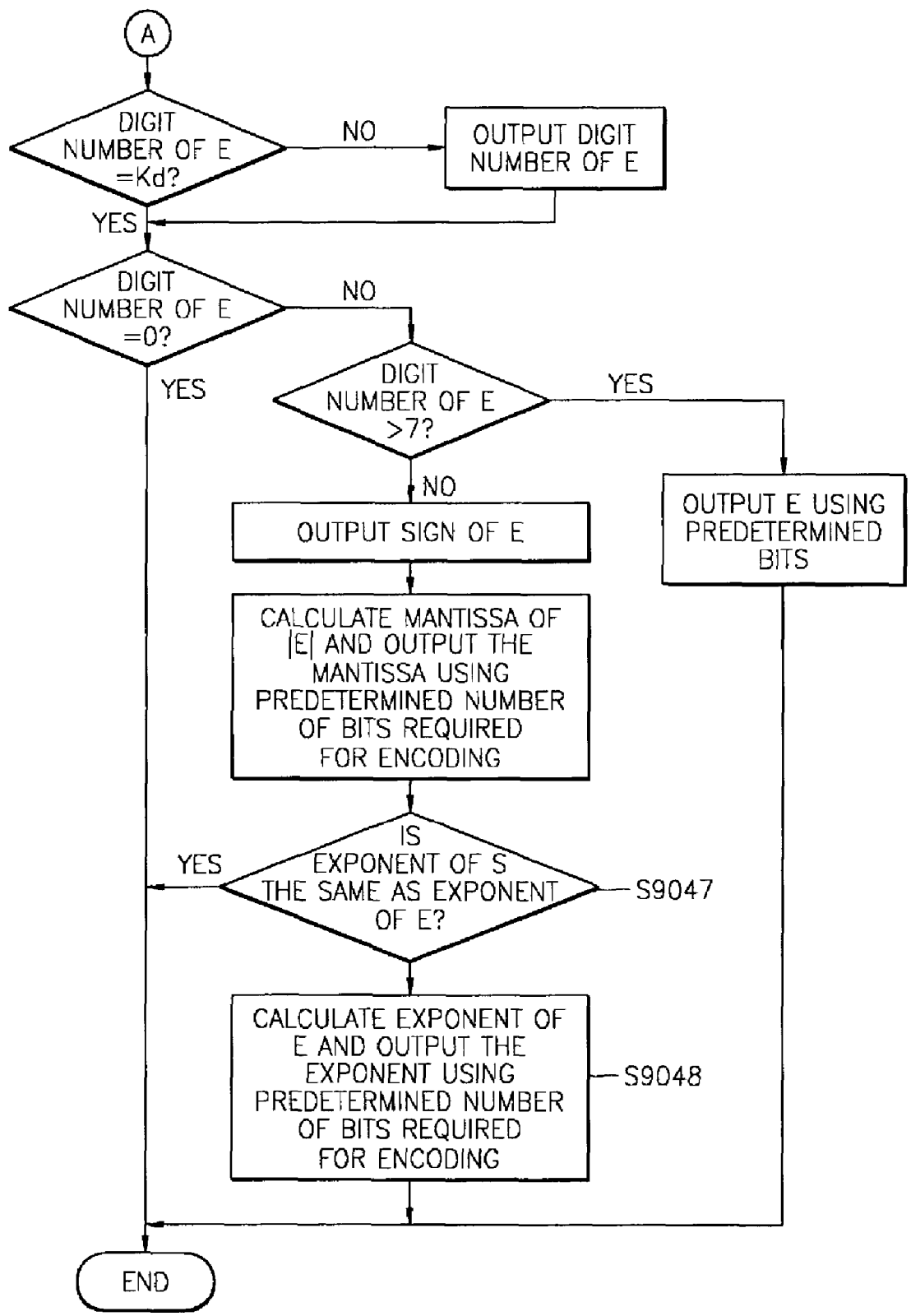
Figure 10E:
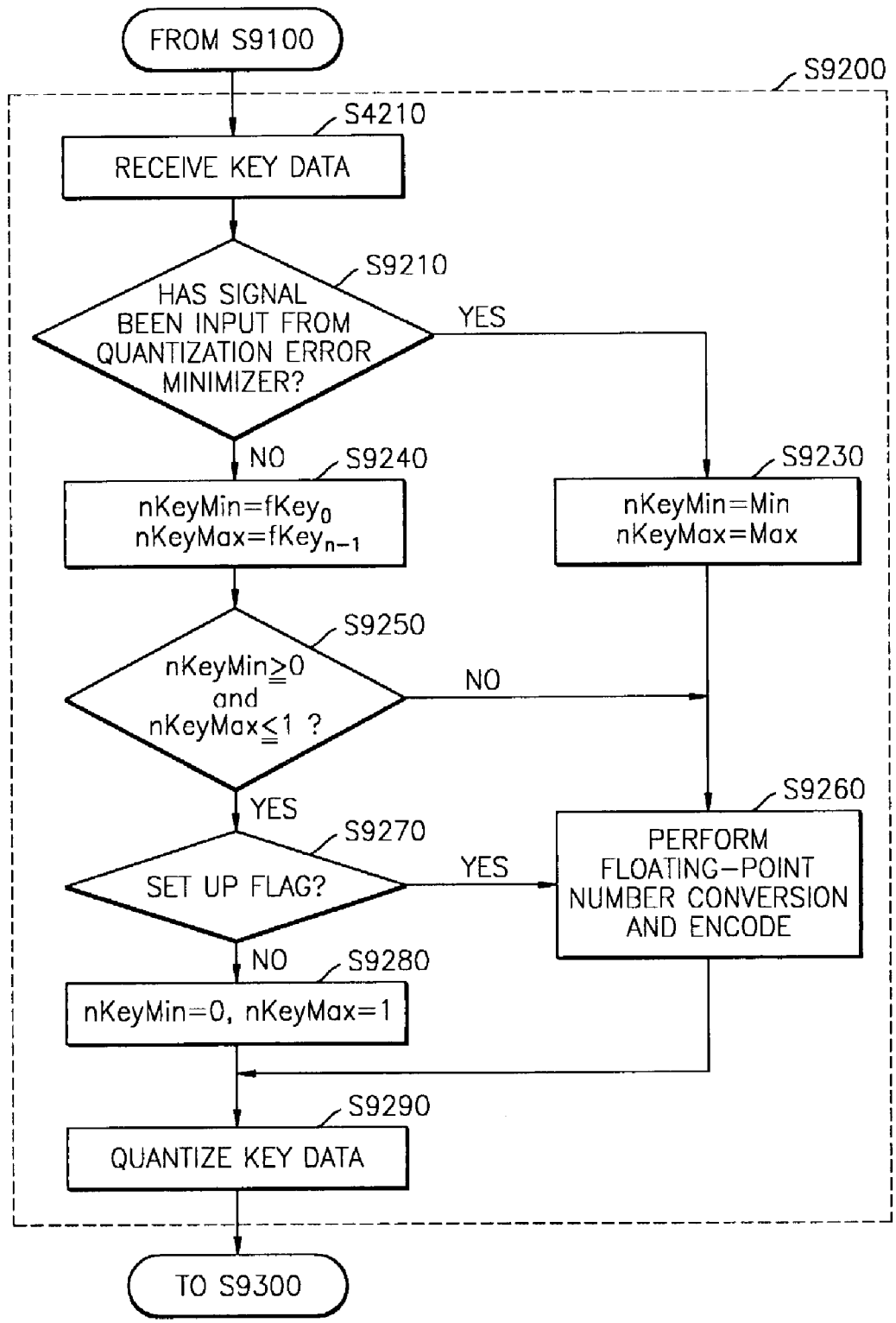

A quantization process of the present invention will be described more fully with reference to FIG. 10C.

The quantizer 910 receives key data in step S9210 and checks if the maximum and minimum values MAX and MIN are input from the quantization error minimizer 915 in step S9220.

If MAX and MIN are input, the quantizer 910 sets the maximum and minimum values fKeyMax and fKeyMin for quantization as MAX and MIN, respectively, in step 3230 and outputs the newly set maximum and minimum values fKeyMax and fKeyMin to the floating-point number converter 905. The maximum and minimum values fKeyMax and fKeyMin are converted and encoded through the above-mentioned floating-point number transformation process and are output to the header encoder 400 so that they can be included in a key header for being used in decoding.

If there is no value input from the quantization error minimizer 915, the quantizer 910 sets first key data fKEY$_0$ and final key data fKey$_{N-1}$ as the minimum value fKeyMin and the maximum value fKeyMax, respectively, in step S9240.

Next, the quantizer 910 checks whether or not the maximum value fKeyMax is smaller than 1 but greater than 0 and whether or not the minimum value fKeyMin is greater than 0 in step S9250. If the maximum value fKeyMax is not smaller than 1 or not greater than 0, the maximum and minimum values fKeyMax and fKeyMin are output to the floating-point number converter 905 and are converted and encoded through the above-mentioned floating-point number transformation. Next, the maximum and minimum values fKeyMax and fKeyMin that have been converted and encoded are included in the key header in step S9260 so that they can be used in decoding.

On the other hand, if the maximum value fKeyMax is smaller than 1 and the minimum value fKeyMin is greater than 0, a flag indicating whether the maximum and minimum values fKeyMax and fKeyMin will be included in the key header for being used in decoding is checked in step S9270. If the flag is set up so that the maximum and minimum values fKeyMax and fKeyMin can be included in the key header, step S9260 is performed so that the maximum and minimum values fKeyMax and fKeyMin are output to the header encoder 400. If the flag is not set up, the quantizer 910 does not allow the maximum and minimum values fKeyMax and fKeyMin to be included in the key header.

In a case where the maximum and minimum values fKeyMax and fKeyMin are not included in the key header, the key data encoder and the key data decoder are supposed to perform encoding and decoding, respectively, setting up the maximum and minimum values fKeyMax and fKeyMin at 1 and 0, respectively. In this case, the quantizer 910 sets up the maximum and minimum values fKeyMax and fKeyMin at 1 and 0, respectively, in step S9280. The maximum and minimum values fKeyMax and fKeyMin are already known to the key data decoder so that they do not need to be included in the key header.

The quantizer 910 quantizes the input key data by substituting the maximum and minimum values fKeyMax and fKeyMin that have been set up through the above-mentioned process into Equation (9) and outputs the quantized key data to a DPCM processor 920 in step S9290.

The DPCM processor 920 receives the quantized key data and performs DPCM on the quantized key data a predetermined number of times. Next, the DPCM processor 920 outputs the order of DPCM, by which a minimum value in the degree of dispersion can be obtained, and intra key data obtained in each cycle of DPCM, to the header encoder 400. The DPCM processor 920 outputs differential data generated by DPCM to the shifter 930 in step S9300.

Figure 10F:
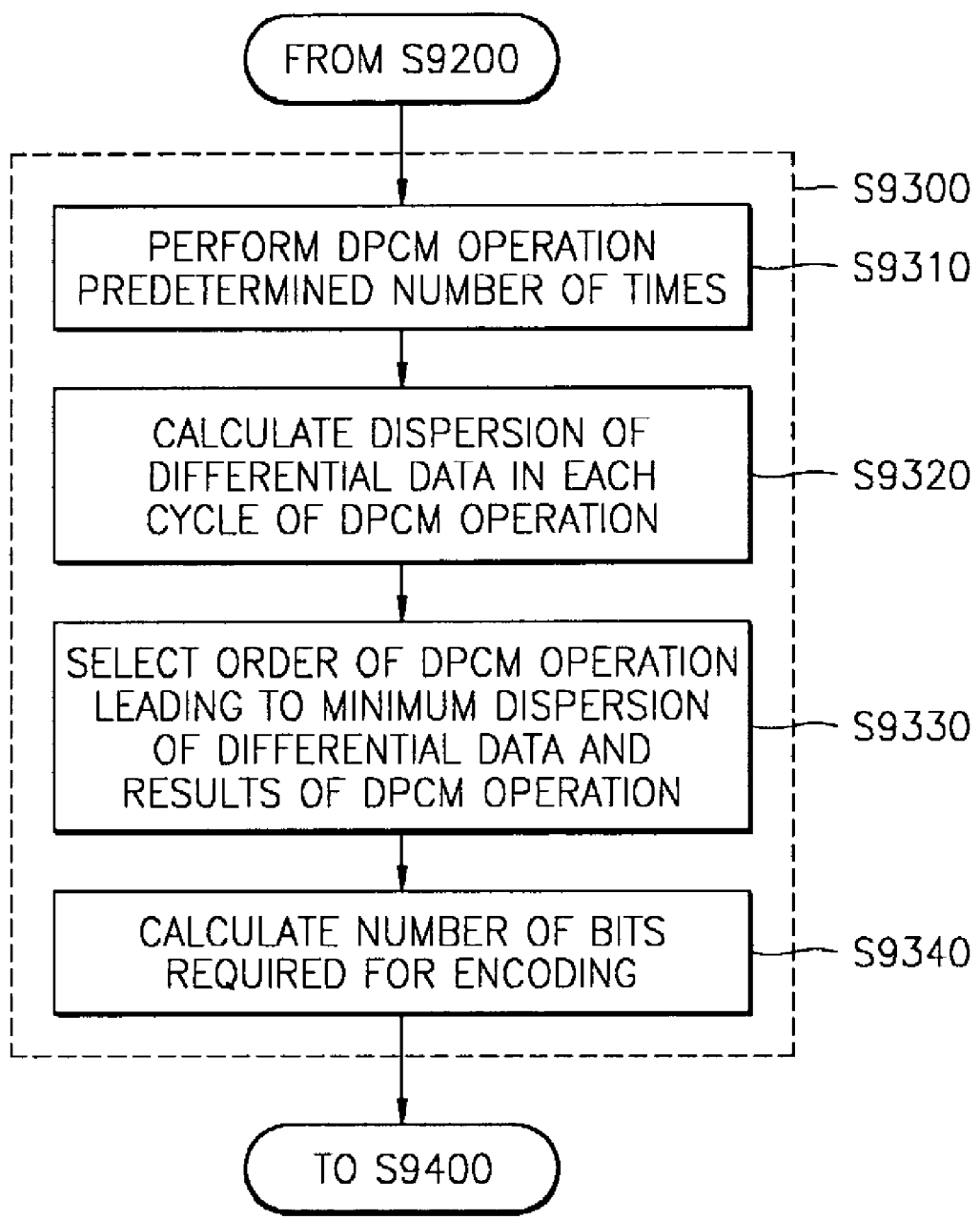

Referring to FIG. 10F, the DPCM processor 920 performs DPCM on the input key data a predetermined number of times and stores the number of cycles of DPCM as the order of DPCM in step S9310. In a preferred embodiment of the present invention, DPCM may be performed three times.

Thereafter, the DPCM processor 920 calculates the degree of dispersion of the results of each cycle of DPCM in step S9320. Here, the degree of dispersion may be represented by dispersion, standard deviation, or quartile deviation, and in a preferred embodiment of the present invention, quartile deviation may be used.

Next, the DPCM processor 920 selects a cycle of DPCM by which a minimum value in the degree of dispersion can be obtained and outputs the results of the selected order of DPCM to the shifter 930. The selected cycle of DPCM, intra key data of each cycle of DPCM and other pieces of information required for DPCM are output to the header encoder 400 in step S9330. However, in a preferred embodiment of the present invention, DPCM is performed only one time if the number of keys is smaller than 5. For example, a first cycle of DPCM is performed following Equation (10).

$$\Delta_i = nQKey_{i+1} + nQKey_i \quad (10)$$

Here, i indicates an index of quantized key data, nQKey$_i$ indicates an array of integers, and $\Delta_i$ indicates differential data.

The DPCM processor 920 calculates the number of bits required to encode the results of the selected cycle of DPCM and differential data of the key data that have been generated by DPCM in a predetermined memory (nQStep_DPCM) in step S9340. The calculation of the number of bits required for encoding may also be performed later in a subsequent step of selecting key data to be encoded, the fact which is obvious to one skilled in the art.

The shifter 930 selects a differential datum (hereinafter, referred to as a mode) which has the highest frequency from among the differential data input from the DPCM processor 920. Then, the shifter 930 subtracts the mode from all the differential data in step S9400 so that most data to be encoded are arranged around 0 and the number of bits required for encoding can be decreased.

Such shifting operation is performed by subtracting a mode nKeyShift from all the quantized key data, which is expressed by the following equation.

$$\text{shift}(nQKey_i) = nQKey_i - nKeyShift \quad (11)$$

Here, i indicates an index of quantized key data, $nQKey_i$ indicates an array of integers, and nKeyShift indicates a mode value. As a result of the shifting operation, differential data having the highest frequency become 0 so that the number of bits required for encoding can be considerably reduced.

The key data having been through the shifting operation are output to the folding processor 940 and the DND processor 950, and the mode value nKeyShift is output to the header encoder 400 so as to be included in the key header.

The folding processor 940 performs a folding operation on the outputs of the shifter 930 and outputs the results of the folding operation to the DND processor 950 in step S9500.

The folding operation is used to reduce the range of differential data that widely disperse over both a positive number region and a negative number region by concentrating them in either the positive or negative number region. In the present embodiment, the folding operation is performed following Equation (12) to concentrate the differential data in the positive number region.

$$\text{fold}(nQKey_i) = 2 \cdot nQKey_i \quad (\text{if } nQKey_i \geq 0) \quad (12)$$
$$= 2|nQKey_i| - 1 \quad (\text{if } nQKey_i < 0)$$

Here, i indicates an index of quantized key data, and $nQKey_i$ indicates an array of integers. As a result of the folding operation, positive differential data are converted into even numbers, and negative different data are converted into odd numbers.

The folding processor 940 calculates the number of bits required for encoding the differential data having been through the folding operation and stores it in a predetermined memory nQStep_fold. In this step, the calculation of the number of bits required for encoding may be performed later in a subsequent step of selecting differential data to be entropy-encoded, which is obvious to one skilled in the art. The data generated by the folding operation in the folding processor 940 are output to the DND processor 950.

In order to enhance the efficiency of entropy encoding, the DND processor 950 performs a DND operation on the input differential data of the key data a predetermined number of times, thus reducing the range of the differential data in S9600.

Figure 9B:
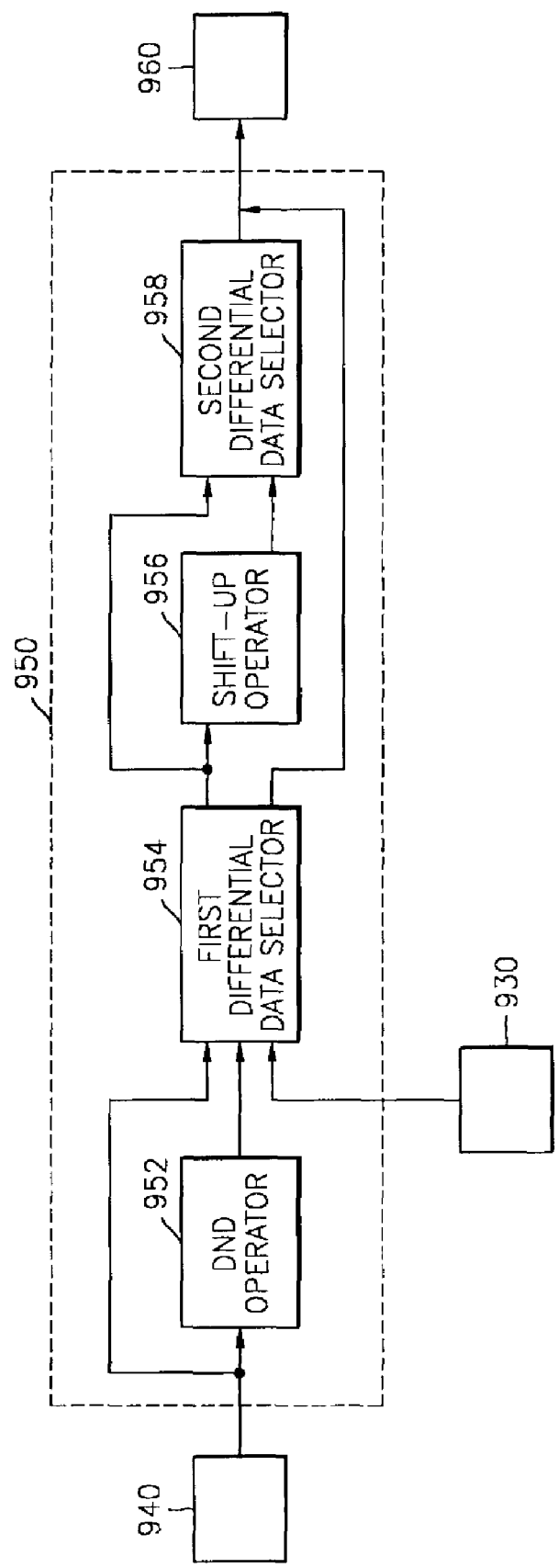
FIG. 9B is a block diagram of a DND processor shown in FIG. 9A.

Referring to FIG. 9B, the DND processor 950 includes a DND operator 952, which performs a DND operation on differential data, a first differential data selector 954, which selects differential data to be entropy-encoded based on the number of bits for encoding, a shift-up operator 956, which performs a shift-up operation on the differential data having been through a DND operation, and a second differential data selector 958, which selects from between the differential data having been through only the DND operation and the differential data having been through the shift-up operation the ones that have a lower dispersion degree and outputs the selected differential data to the entropy encoder 960.

The DND operation performed in the DND operator 952 will be described in the following.

When the differential data having been through the folding operation in the folding processor 940 are input into the DND operator 952, they are divided in two groups, and a group of differential data having a higher range than the other group of differential data is moved to the positive number region by a divide function. The divide function is defined by the following equation.

$$\text{divide}(nQKey_j, nKeyMax) = nQKey_j - (nKeyMax + 1) \quad \left(\text{if } nQKey_j > \frac{nKeyMax}{2}\right) \quad (13)$$
$$= nQKey_j \quad \left(\text{if } nQKey_j \leq \frac{nKeyMax}{2}\right)$$

Here, j indicates an index of input differential data, $nQKey_j$ indicates an array of integers, and nKeyMax indicates a maximum value among differential data having been through the folding operation. Especially, in a case where most differential data are densely populated along boundaries of the entire region accounted for by all differential data, it is possible to considerably reduce the entire region of all differential data using the divide operation.

After the divide operation, the degree of dispersion is calculated, in which case the size of bits required for encoding is used as a measure of the degree of dispersion so that a minimum value in the size of bits for encoding can be selected.

After the DND operation, a different kind of DND operation, i.e., a divide-up operation or a divide-down operation, is further performed. Whether a divide-up operation or a divide-down operation will be further performed is determined depending on both the size of a positive range of differential data and the size of a negative range of the differential data.

If the range of the differential data having positive values is larger than that of the differential data having negative values, a divide-down operation defined by the following equation is performed.

$$\text{divide-down}(nQKey_j, nKeyMax) = -2(nKeyMax - nQKey_j + 1) + 1 \quad \left(\text{if } nQKey_j > \frac{nKeyMax}{2}\right) \quad (14)$$
$$= nQKey_j \quad \left(\text{if } 0 \leq nQKey_j \leq \frac{nKeyMax}{2}\right)$$
$$= 2 \cdot nQKey_j \quad (\text{if } nQKey_j < 0)$$

On the other hand, if the range of the differential data having positive values is larger than the range of the differential data having negative values, a divide-up operation defined by the following equation is performed.

$$\text{divide-up}(nQKey_j, n\text{KeyMin}) = nQKey_j \qquad (nQKey_j \geq 0) \qquad (15)$$

$$= 2 \cdot nQKey_j \qquad \left(\frac{n\text{KeyMin}}{2} \leq nQKey_j \leq 0\right)$$

$$= 2(n\text{KeyMin} - nQKey_j - 1) + 1 \quad \left(nQKey_j < \frac{n\text{KeyMin}}{2}\right)$$

In Equations (14) and (15), j indicates an index of quantized key data, $nQKey_j$ represents an array of integers, nKeyMax indicates a maximum value of $nQKey_j$, and nKeyMin indicates a minimum value of $nQKey_j$.

Figure 10G:
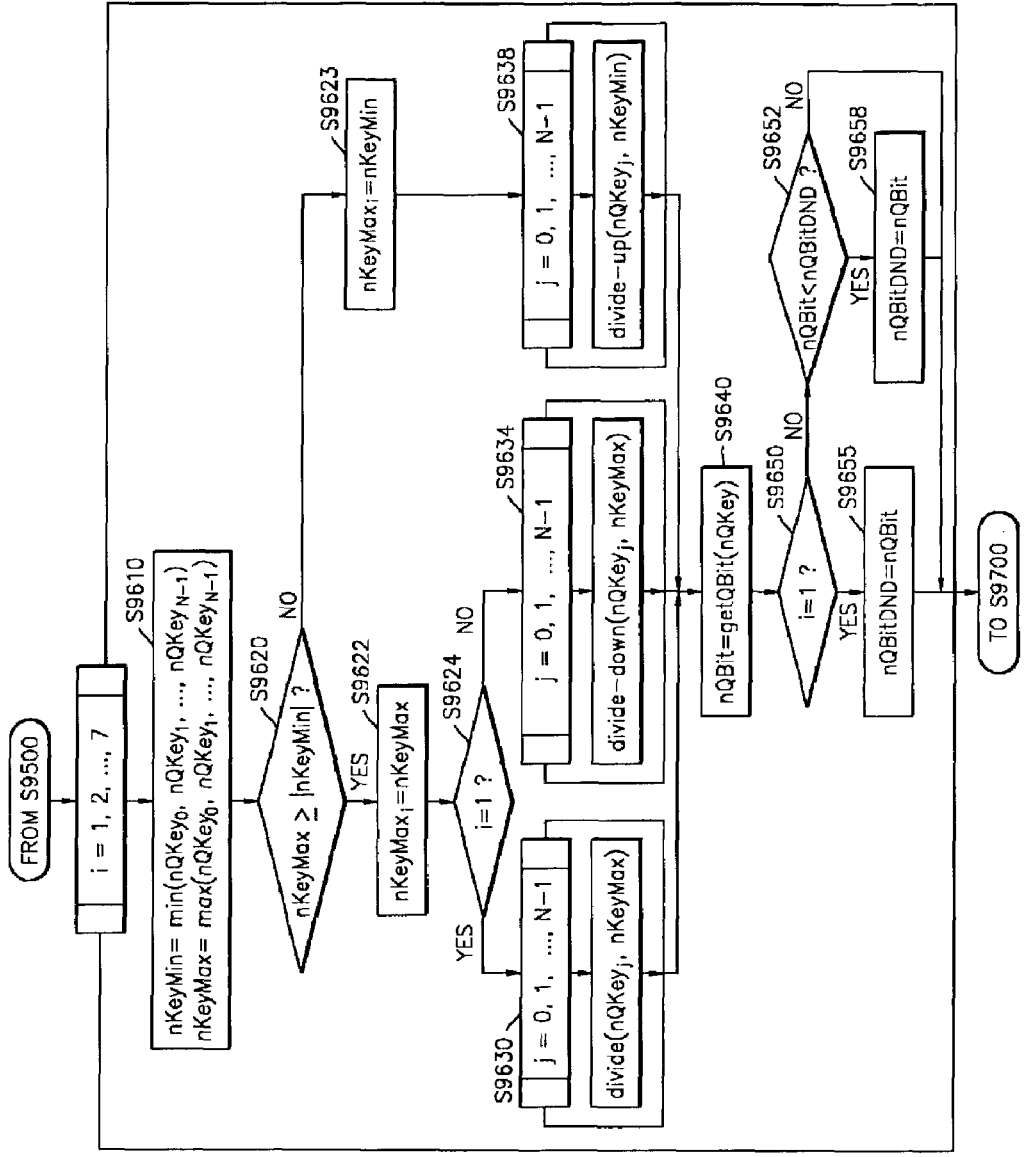

The operation of the DND operator 952 will be described in the following with reference to FIG. 10G.

When the differential data of the input key data are input from the folding processor 940, the DND operator 952 obtains the maximum value nKeyMax and the minimum value nKeyMin among the input differential data in step S9610. Then, the DND operator 952 compares the absolute value of nKeyMax with that of nKeyMin in step S9620. If nKeyMax is not smaller than the absolute value of nKeyMin, the DND operator 952 sets nKeyMax as a maximum value in the current cycle of DND operation in step S9622.

The DND operator 952 checks if the order of DND operation is 1, in other words, if the order of DND operation is 1, in step S9624, and if it is, the DND operator 952 performs a divide operation on the input differential data in step S9630 substituting the maximum value nKeyMax in Equation (13).

Thereafter, the DND operator 952 measures the size of bits required for encoding the differential data range having been reduced using the divide operation, in step S9640, using function getQBit ( ). If the order of DND operation turns out to be 1 in step S9650, the size of bits required for encoding is stored as a value nQBitDND indicating the minimum size of bits for encoding, and the order of DND operation is increased by 1 in step S9655.

Next, the DND processor 952 performs steps S9610 through S9622 again. If the order of DND operation is not 1 in step S9624, the DND operator 952 performs a divide-down operation in step S9634 substituting the maximum value nKeyMax in Equation (14). The DND operator 952 calculates the number of bits required for encoding the differential data having been through the divide-down operation, in step S9640. If the number is smaller than the minimum value nQBitDND stored in the previous cycle of DND operation, it replaces the minimum size of bits required for encoding after the DND operation in step S9658.

If the absolute value of the minimum value nKeyMin appears to be greater than that of the maximum value nKeyMax in step S9620, the maximum value in the current cycle of DND operation is renewed as a minimum value in step S9623, and then a divide-up operation is performed in step S9628 substituting the minimum value for nKeyMin in Equation 15. Thereafter, the DND operator 952 calculates the number of bits for encoding the differential data having been through the divide-up operation in step S9640. If the result of the calculation turns out to be smaller than nQBitDND that has been stored in the previous cycle of DND operation in step S9652, it replaces the minimum number nQBitDND of bits required for encoding after the DND operation in step S9658.

The DND processor 952 performs the DND operation a predetermined number of times, and the number of performance of the DND operation may vary. For example, in the present embodiment, the DND operation is performed 7 times. The DND operator 952 outputs nQBitDND and the differential data corresponding to nQBitDND to the first differential data selector 954. The DND operator 952 outputs the order of DND by which the corresponding differential data have been generated to the header encoder 400 and allows them to be included in the bitstream.

The first differential data selector 954 receives the differential data having been through the shifting operation, the differential data having been through the folding operation, and the differential data having been through the DND operation and determines which differential data among the three will be entropy-encoded.

Referring to FIG. 10A, the first differential data selector 954 selects the results of the DPCM and performs a shifting operation on them in step S9710 if the minimum number nQBitDND of bits required for encoding after the DND operation is no smaller than the size nQStep-DPCM of bits for encoding after the DPCM operation in step S9700. Next, the first differential data selector 954 outputs the results of the shifting operation to the entropy encoder 960 and allows them to be entropy-encoded in step S9710. In this case, the order of DND operation is set up as −1, is output to the header encoder 400, and is included in the key header.

However, if it turns out in step S9720 that nQBitDND is smaller than nQStep-DPCM and is not smaller than the size of bits for encoding after the folding operation, the first differential data selector 954 outputs the differential data having been through the folding operation to the entropy encoder 960 and allows them to be entropy-encoded in step S9730, in which case the order of DND operation is set up at 0, is output to the header encoder 400, and thus is included in the key header.

If the number of bits for encoding the differential data after the DND operation is smallest, the first differential data selector 954 outputs the differential data having been through the DND operation to the shift-up operator 956, and then the shift-up operator 956 calculates a first dispersion degree of the differential data input from the first differential data selector 954, in step S9740. Next, the shift-up operator 956 performs a shift-up operation defined by the following equation on the differential data having been through the DND operation, in step S9800 and calculates a second dispersion degree of the results of the shift-up operation in step S9810.

$$\text{shift-up}(nQKey_j, n\text{KeyMax}) = nQKey_j \qquad (if\ nQKey_j \geq 0) \qquad (16)$$

$$= n\text{KeyMax} - nQKey_j \quad (if\ nQKey_j < 0)$$

Here, j indicates an index of differential data of quantized key data, $nQKey_j$ indicates an array of integers, and nKeyMax indicates a maximum value among differential data.

When the differential data having been through the DND operation and the differential data having been through the shift-up operation are input, the second differential data selector 958 compares the first dispersion degree with the second dispersion degree in step S9900. If the second dispersion degree is smaller than the first dispersion degree, the second differential data selector 958 outputs the differential data having been through the shift-up operation to the entropy-encoder 960 and allows them to be entropy-encoded in step S9910. The second differential data selector 958 outputs the maximum and minimum values nKeyMax and nKeyMin used in the DND operation, and the maximum value nKeyMax used in the shift-up operation to the header encoder 400 and allows them to be included in the key header.

However, if the first dispersion degree is smaller than the second dispersion degree, the second differential data selector 958 outputs the differential data having been through the DND operation to the entropy encoder 960 and allows them to be entropy-encoded in step S9920. Then, the second differential data selector 958 outputs only the maximum and minimum values nKeyMax and nKeyMin used in the DND operation to the header encoder 400. In a preferred embodiment of the present invention, standard deviation may used as a measure of the first and second dispersion degrees.

The entropy encoder 960 performs two different functions on differential data depending on the characteristics of the differential data. For example, differential data having been through a DPCM operation and a shifting operation and differential data having been through only a divide operation have both positive and negative values, and thus it is required to perform a process of encoding the sign of each of the differential data as well as the differential data themselves. On the other hand, since differential data having been through a folding operation only have positive values, a process of encoding only the differential data is performed.

In a preferred embodiment of the present invention, function encodeSignedAAC is used for encoding the differential data and their signs as well, and function encodeUnsignedAAC is used for encoding only differential data.

FIG. 11 is a diagram of an example of function encodeSignedAAC. Referring to FIG. 11, when an input value is 74 and the number of bits for encoding the input value is 8, its sign is 0, and it is the same as a binary number of 1001010. Signs and all bit planes are encoded in the following way:

First step: a binary number is encoded on every bit plane in an order of from its most significant bit (MSB) to its least significant bit (LSB);

Second step: it is checked if the bit which is currently being encoded is 0;

Third step: if the bit currently being encoded is not 0, the sign of the binary number is encoded next; and Fourth step: the remaining bits of the binary number are encoded.

Function encodeUnsignedAAC encodes values not having a sign as an adaptive arithmetic encoding bitstream using a context regarding the values. This function is almost the same as function encodeSignedAAC except that there exists a sign context.

FIGS. 12A through 12J are graphs showing key data which have been subjected to operations according to a preferred embodiment of the present invention. In FIGS. 12A through 12J, the X-axis represents indexes of each of the key data, and the Y-axis represents the values of the key data.

Figure 12A:
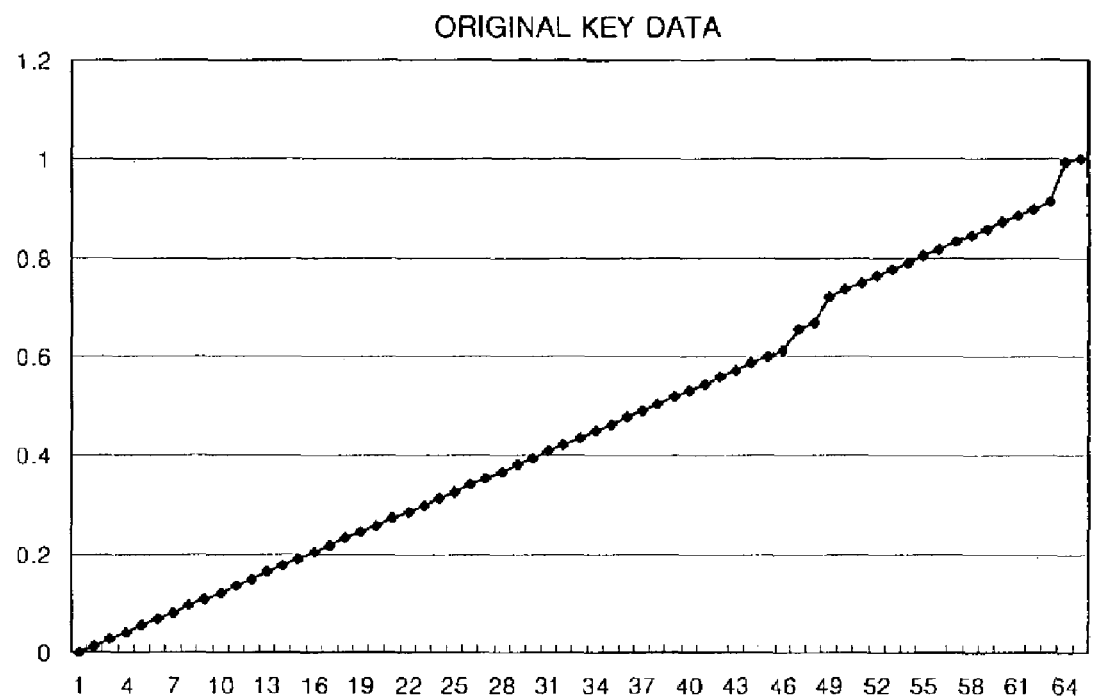
FIGS. 12A through 12J are diagrams illustrating key data obtained after performing different steps of encoding key data according to a preferred embodiment of the present invention.
Figure 12B:
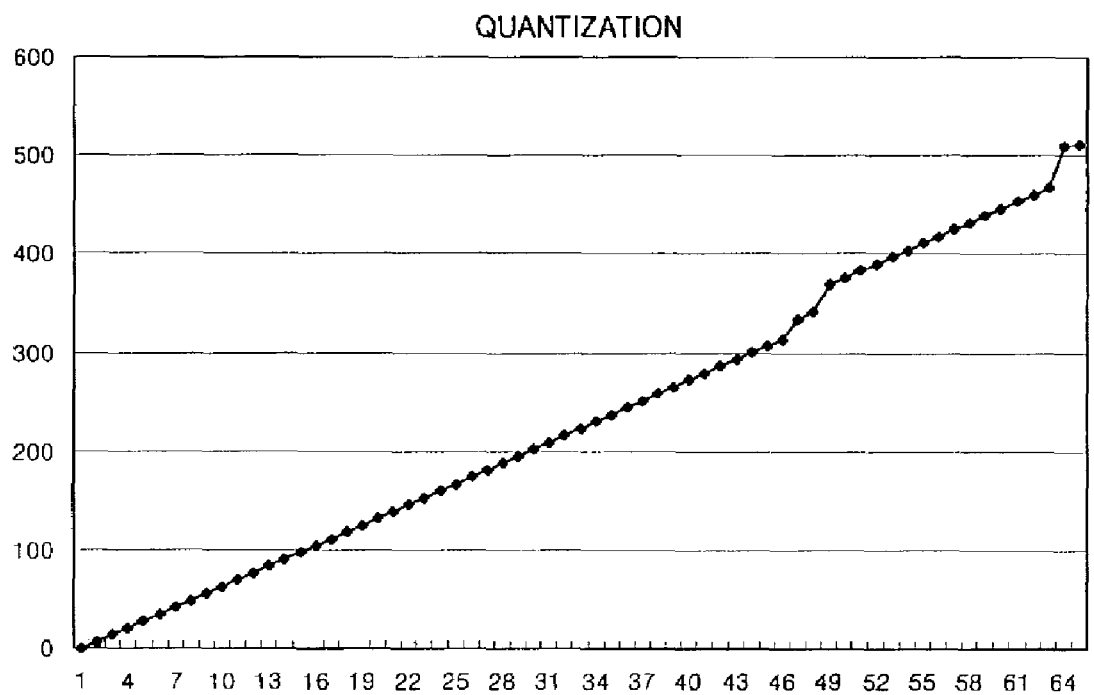
Figure 12C:
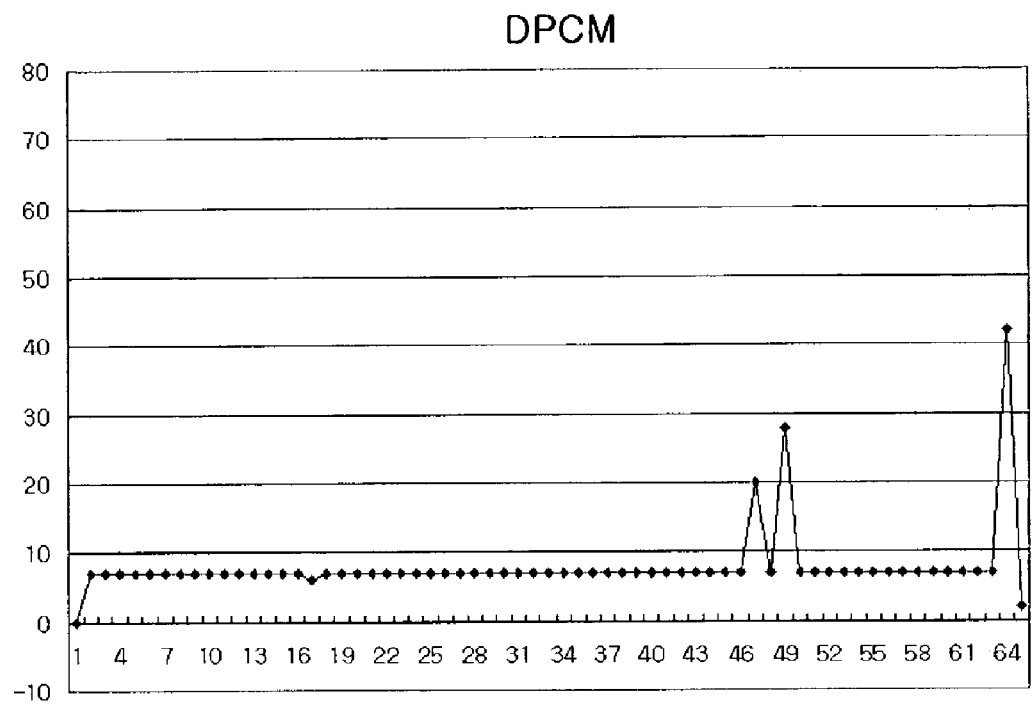

FIG. 12A is a graph showing original key data input into the encoder of the present invention. The key data shown in FIG. 12A are output to the quantizer 910 and then are quantized with nine quantization bits so that quantized key data shown in FIG. 12B are obtained. If DPCM is performed on the quantized key data shown in FIG. 12B, differential data shown in FIG. 12C are obtained.

Figure 12D:
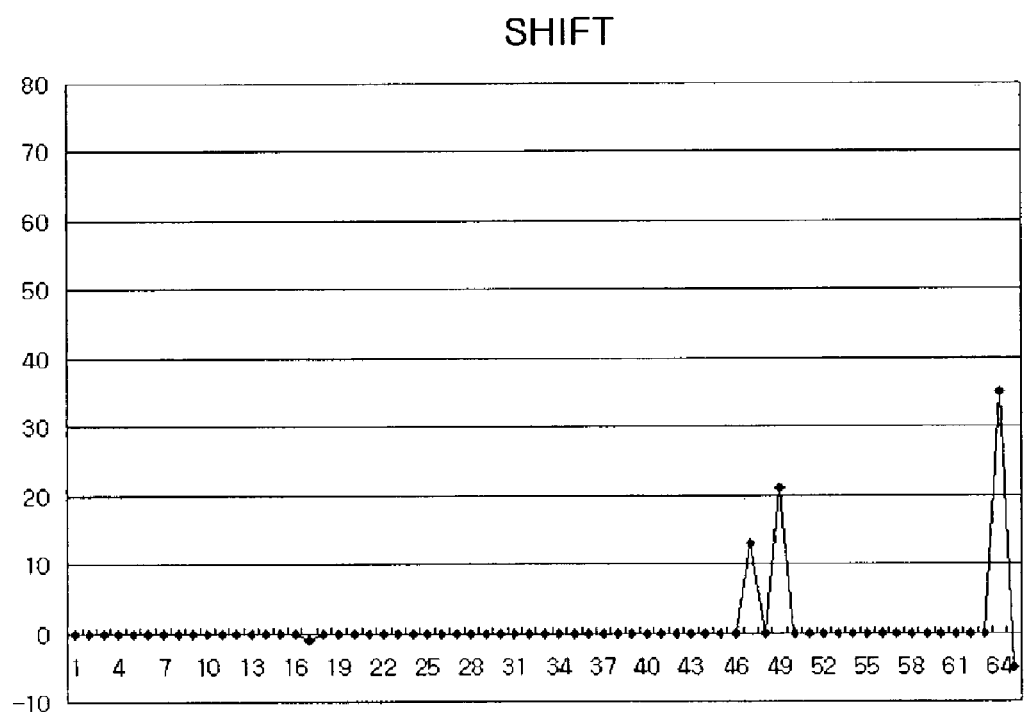

Next, the differential data of the quantized key data are shifted using a mode value of about 7 so that differential data shown in FIG. 12D are obtained. Thereafter, if a folding operation is performed on the shifted differential data, data having only positive values can be obtained, as shown in FIG. 12E.

Figure 12E:
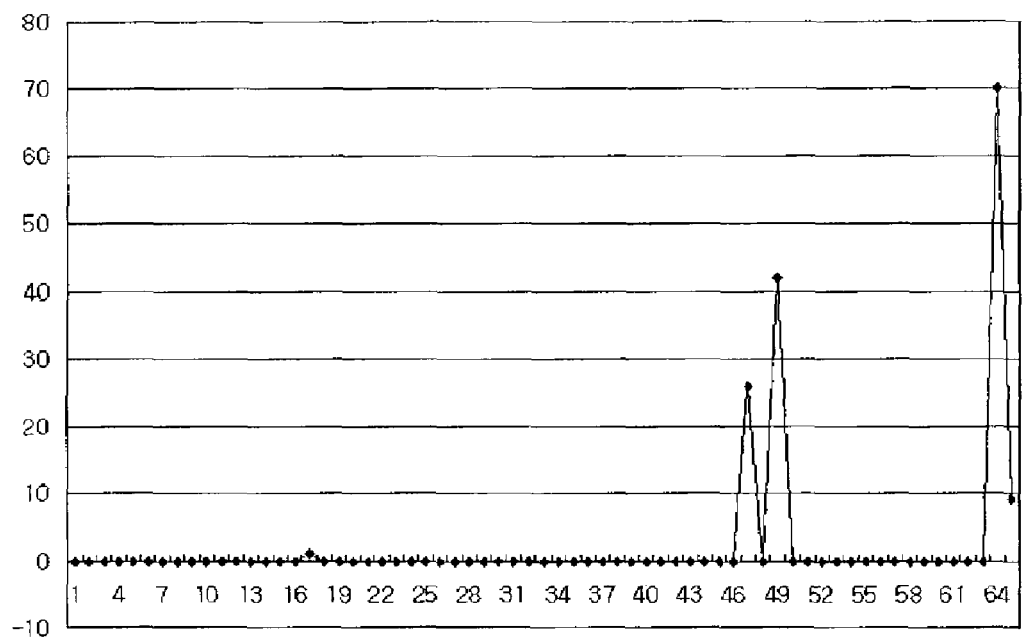
Figure 12F:
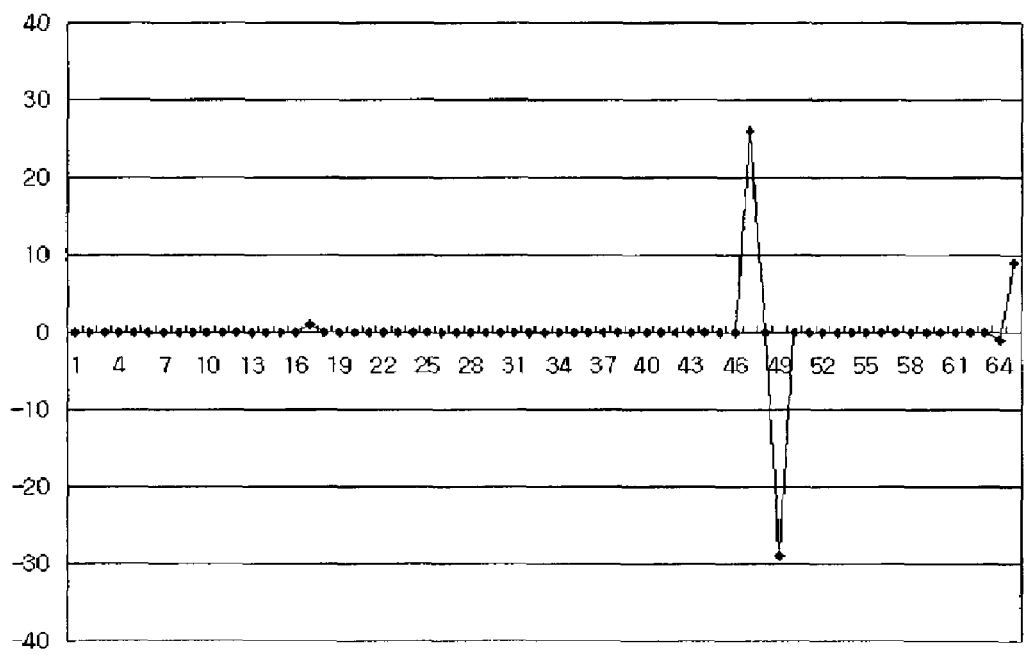
Figure 12G:
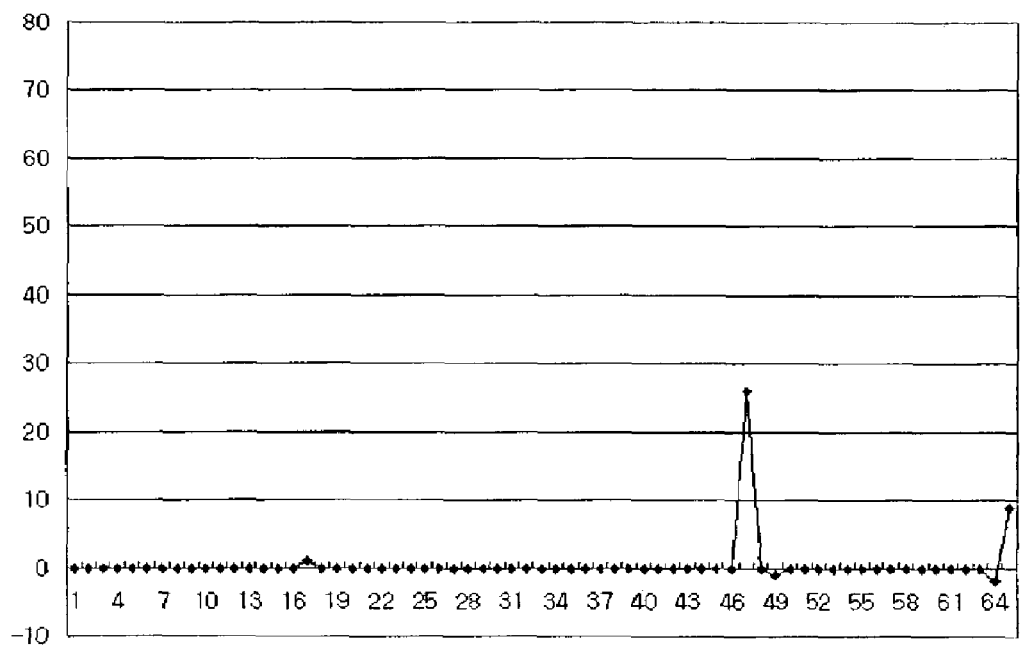
Figure 12H:
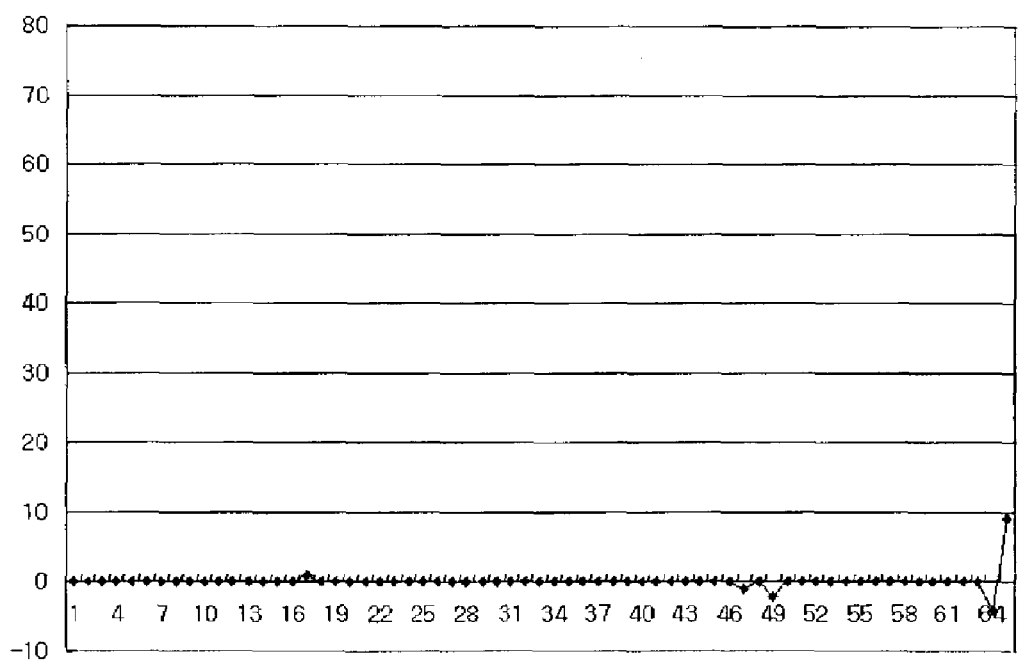

The results of performing a DND operation on the folded data shown in FIG. 12E are shown in FIGS. 12F through 12H. In particular, the results of performing a divide operation on the folded data are shown in FIG. 12F. As shown in FIG. 12F, positive key data values range from 0 to 28, and negative key data values range from −29 to 0, which means that the range of negative key data values is greater than that of positive key data values. Accordingly, it is required to perform a divide-up operation on the data shown in FIG. 12F, and the results of the divide-up operation are shown in FIG. 12G.

Figure 12I:
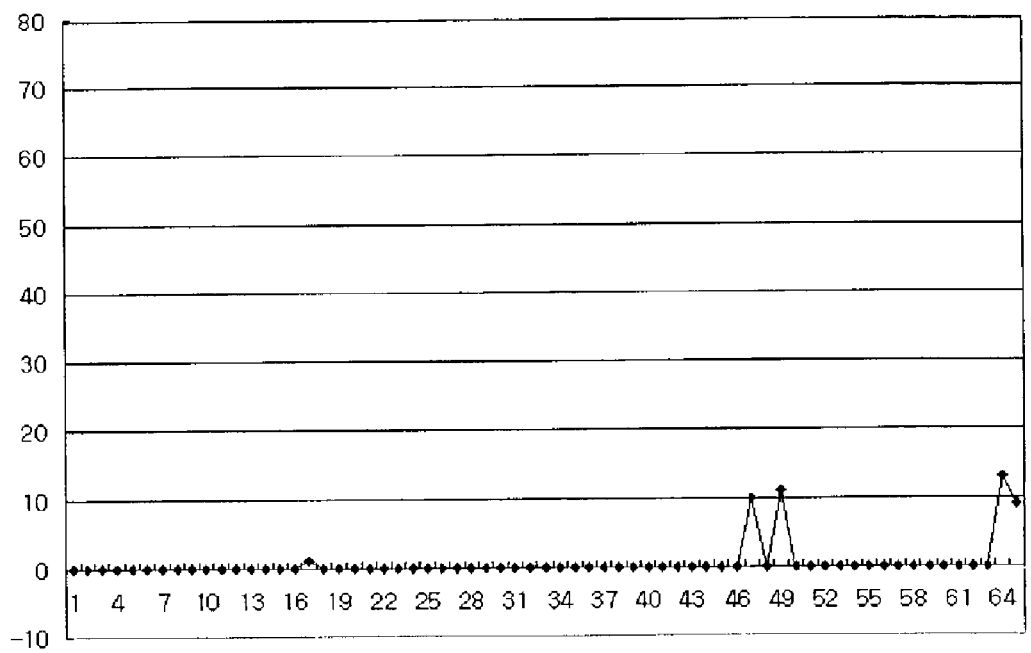

As a result of the divide-up operation, the range of negative key data values is considerably reduced so that it is much smaller than the range of positive key data values. In a subsequent cycle of DND operation, a divide-down operation is performed on the results of the divide-up operation. FIG. 12H is a diagram showing the results of performing a divide-down operation on the differential data shown in FIG. 12G. The results of performing a shift-up operation on the key data shown in FIG. 12H are shown in FIG. 12I.

Figure 12J:
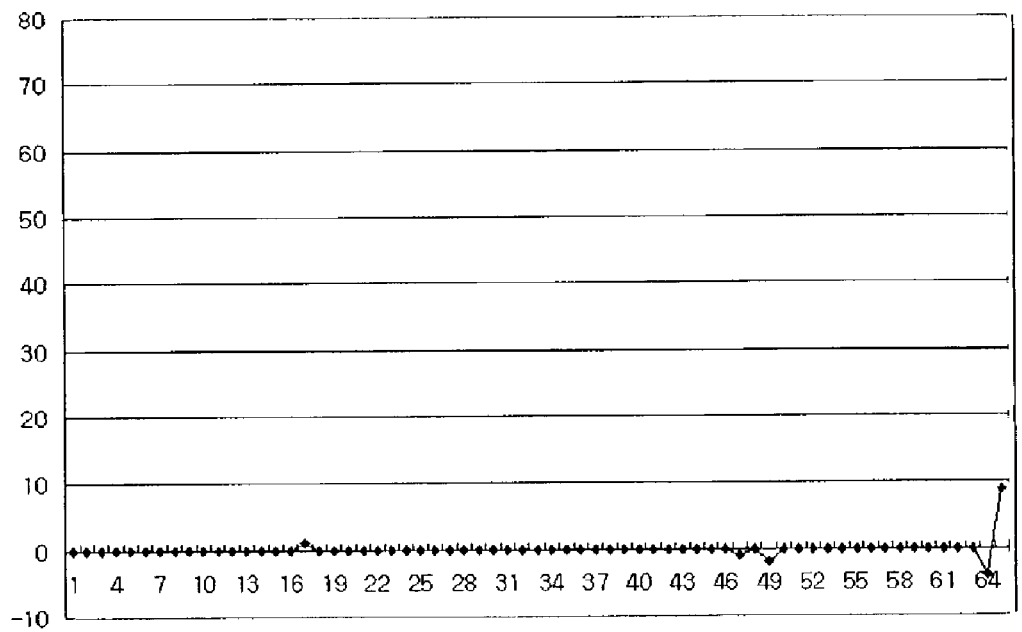

As shown in FIGS. 12A through 12G, the range of key data and differential data gradually decreases. However, as shown in FIGS. 12H and 12I, the range of differential data is increased greater after the shift-up operation than before, which shows that the differential data having been through the divide-down operation, as shown in FIG. 12H, are the ones that are to be finally encoded, as shown in FIG. 12J.

The information encoded in the header encoder 400 and stored in the key header will be described in the following.

When key data to be encoded are input, the header encoder 400 encodes the digit number of key data and the number of keys to be encoded. Next, the header encoder 400 receives information on whether or not there exists a linear key data region that has been through the linear key encoding in the input key data and the number of key data in the linear key data region from the linear key encoder 900 and receives the beginning and ending key data of the linear key data region that has been through the floating-point number transformation from the floating-point number converter 905.

In a case where the floating-point number converter 905 receives maximum and minimum values which can bring about a minimum quantization error and converts them into floating-point numbers, the converted maximum and minimum values are input into the header encoder 400 from the floating-point number converter 905 so that they can be used again for inverse quantization. In addition, the size of quantization bits is also input into the header encoder 400 and is included in the key header.

The key header encoder 400 receives the order of DPCM and intra key data in each cycle of DPCM from the DPCM processor 920 and receives a mode value which has been used for a shifting operation from the shifter 930. In addition, header encoder 400 receives from the DND processor 950 information on whether or not a shift-up operation has been performed, the order of DND by which the dispersion degree of differential data can be minimized, and maximum and minimum values in each cycle of DND operation.

Finally, the header encoder 400 receives the number of bits used for encoding from the entropy encoder 960 and encodes it as a key header.

Hereinafter, the structure and operation of a key value data encoder 300 according to a first embodiment of the present invention will be described more fully with reference to FIGS. 13A through 20B.

Figure 13A:
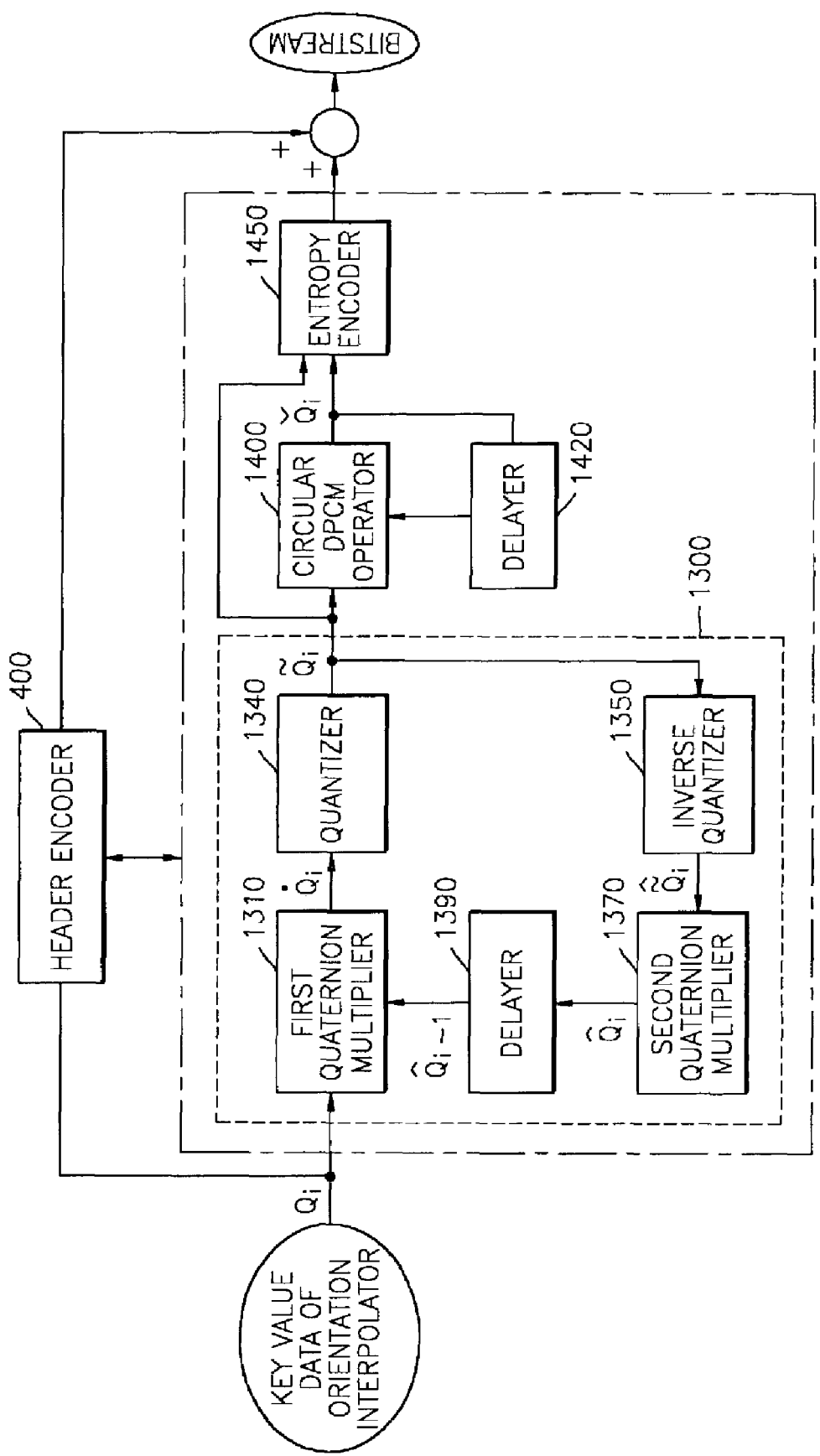
FIG. 13A is a block diagram of a key value data encoder according to a first embodiment of the present invention.

FIG. 13A is a block diagram of a key value data encoder 300 according to a first embodiment of the present invention. Referring to FIG. 13A, the key value data encoder 300 includes a rotational DPCM operator 1300, which calculates rotational differential values among rotational transformation values of an object in successive keyframes, which apply quaternion key value data of the keyframes to their respective objects, quantizes the rotational differential values, and outputs rotational differential data, a circular DPCM operator 1400, which selectively performs a linear DPCM operation and a circular DPCM operation on quantized rotational differential data, an entropy encoder 1450, which entropy-encodes rotational-DPCMed or circular-DPCMed rotational differential data, and a header encoder 400, which encodes information necessary to decode encoded key value data of an orientation interpolator node.

The rotational DPCM operator 1300 includes a first quaternion multiplier 1310, which calculates a rotational differential value between a rotational transformation value of an object in a previous keyframe and a rotational transformation value of the object in a current keyframe by quaternion-multiplying the rotational transformation value of the object in the current keyframe by the rotational transformation value of the object in the previous keyframe, a quantizer 1340, which generates quantized rotational differential data by non-linearly quantizing the rotational differential value input from the first quaternion multiplier 1310, an inverse quantizer 1350, which generates restored rotational differential data of the object in the current keyframe by inverse-quantizing quantized rotational differential data, a second quaternion multiplier 1370, which restores the rotational transformation value of the object in the current keyframe by quaternion-multiplying the rotational differential value of the object in the current keyframe by the rotational transformation values of the object in previous keyframes calculated by accumulating the rotational differential data, and a delayer 1390, which outputs the restored rotational transformation value of the object in the current keyframe to the first quaternion multiplier 1310 when a rotational transformation value of the object in a next keyframe is input.

Hereinafter, a rotational DPCM operation performed in a rotational DPCM operator according to the present invention will be described in greater detail.

In a linear DPCM method, which has been adopted in conventional MPEG-4 PMFC, a differential value between a quaternion rotational transformation value $Q_1$ ($Q_1=(q_{1,0}, q_{1,1}, q_{1,2}, q_{1,3})$) representing rotational transformation of an object in a current keyframe (or representing the degree to which an object in a current keyframe is rotationally transformed) and a quaternion rotational transformation value $Q_2$ ($Q_2=(q_{2,0}, q_{2,1}, q_{2,2}, q_{2,3})$) representing rotational transformation of the object in a next keyframe is calculated following Equation (17).

$$Q_{LinearDPCM}=(q_{1,0}-q_{2,0}, q_{1,1}-q_{2,1}, q_{1,2}-q_{2,2}, q_{1,3}-q_{2,3}) \quad (17)$$

However, the linear DPCM method only calculates a differential value between quaternion components, which does not reflect any meaningful rotational differential value, i.e., an actual rotational differential value. Accordingly, the linear DPCM method cannot reduce redundancy among successive key value data to be encoded effectively. In addition, in the linear DPCM method, three components of a quaternion except for one component having the greatest value are encoded. Therefore, it is necessary to additionally encode 2-bit long information on the one component, which has not been encoded, and transmit the 2-bit long information to a decoder from an encoder.

In order to solve the above problem with the conventional linear DPCM method by reducing redundancy among successive key value data, the key value data encoder 300 according to the first embodiment of the present invention provides a rotational DPCM operation, in which actual rotational differential values are considered.

When $\hat{x}$ represents a reference vector representing a reference position of an object in a current keyframe, $(\hat{n}_{i-1}, \theta_{i-1})$ represents key value data when key data are equal to $k_{i-1}$, and $\hat{y}_{i-1}$ is a displacement vector of $\hat{x}$ obtained by rotationally transforming the object in the current keyframe, rotational transformation in a quaternion space can be expressed by the following equation.

$$Y_{i-1}=Q_{i-1} \times X_0 \times Q_{i-1}^* \quad (18)$$

In Equation (18), $X_0$, $Y_{i-1}$, $Q_{i-1}$, and $Q_{i-1}^*$ represent unit quaternions of $\hat{x}$, $\hat{Y}_{i-1}$, $(\hat{n}_{i-1}, \theta_{i-1})$ and $(\hat{n}_{i-1}, \theta_{i-1})^*$, respectively. In addition, $Q_{i-1}^*$ represents a quaternion complex conjugate of $Q_{i-1}$, and x represents quaternion multiplication.

In this manner, when key data are equal to $k_i$, rotational transformation in a quaternion space can be expressed by the following equation.

$$Y_i=Q_i \times X_0 \times Q_i^* \quad (19)$$

A rotational differential value among successive rotational transformation values of successive key value data can be calculated with Equation (20) below.

$$Y_i=Q_i \times X_0 \times Q_i^* = Q_i \times Q_{i-1}^* \times Y_{i-1} \times Q_{i-1} \times Q_i^* = \dot{Q}_i \times Y_{i-1} \times \dot{Q}_i^* \quad (20)$$

Accordingly, a rotational differential value can be defined by the following equation.

$$\dot{Q}_i = Q_i \times Q_{i-1}^* \quad (21)$$

In order to prevent a quantization error from propagating to a next rotational differential value, the key value data encoder 300 according to the first embodiment of the present invention redefines the rotational differential value defined by Equation (21) using a rotational transformation value in a next keyframe and a restored rotational transformation value $\hat{Q}_{i-1}^*$ a previous keyframe, which is shown in Equation (22).

$$\dot{Q}_i = Q_i \times \hat{Q}_{i-1}^* \quad (22)$$

Figure 13B:
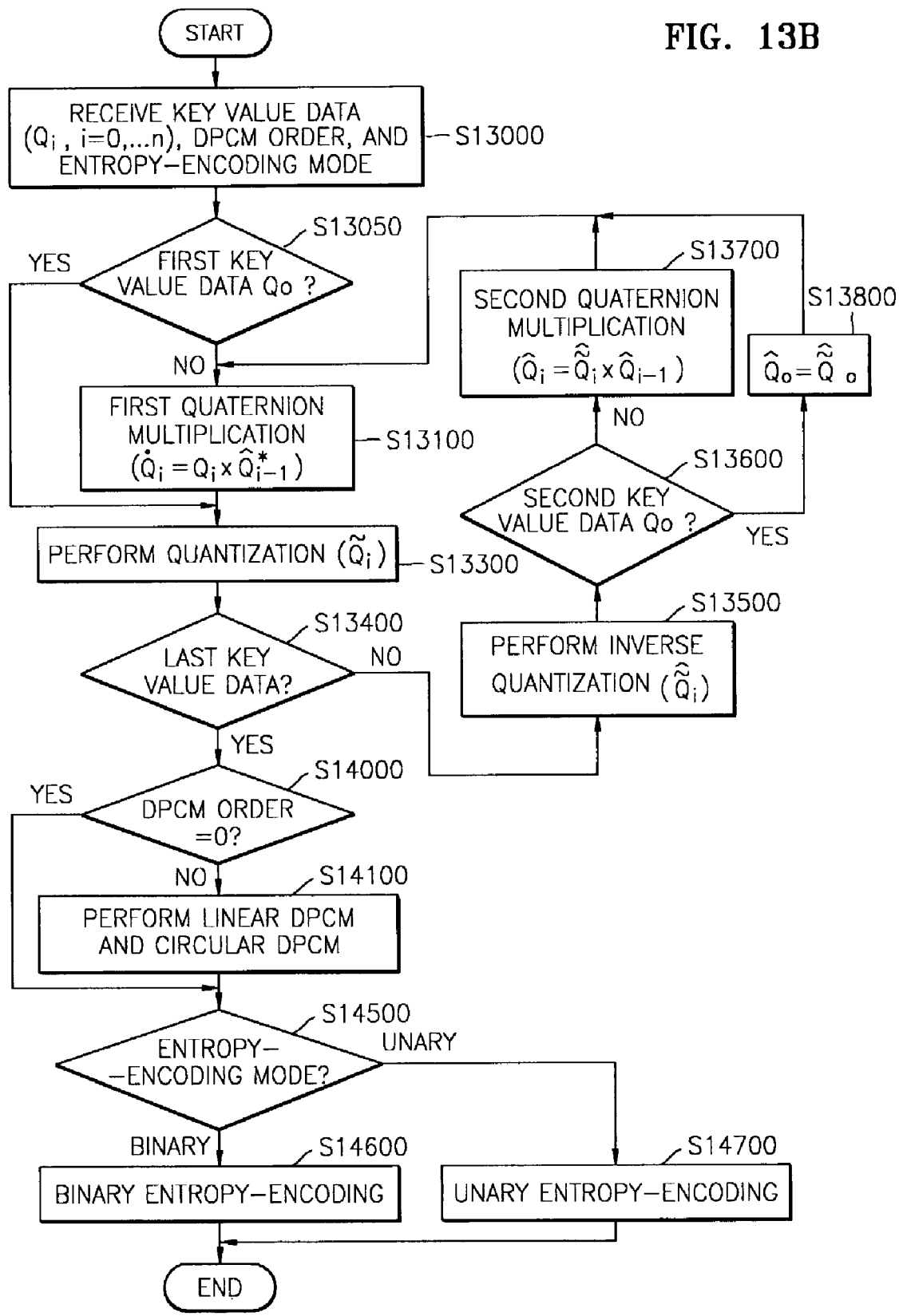
FIG. 13B is a flowchart of a method of encoding key value data according to a first embodiment of the present invention.

Hereinafter, a method for encoding key value data according to a first embodiment of the present invention will be described with reference to FIG. 13B. FIG. 13B is a flowchart of a method for encoding key value data according to a first embodiment of the present invention.

The key value data encoder 300 according to the first embodiment of the present invention receives the order of DPCM, an entropy-encoding mode, and key value data in step S13000.

Next, the first quaternion multiplier 1310 receives key value data $Q_i$ represented by a quaternion and checks whether or not the input key value data $Q_i$ are first key value data $Q_0$ in step S13050. If the input key value data $Q_i$ are the first key value data $Q_0$, it means that there is no accumulated quaternion transformation value used for quaternion multiplication.

Accordingly, the first quaternion multiplier 1310 outputs the input key value data $Q_i$ to the quantizer 1340. If the input key value data $Q_i$ are not the first key value data $Q_0$, the first quaternion multiplier 1310 calculates a quaternion differential value $\dot{Q}_i$, which is a differential value between the key value data of the current keyframe and the key value data of the previous keyframe, in step S13100 by quaternion-multiplying $(Q_i \times \hat{Q}^*_{i-1})$ the restored quaternion transformation value $\hat{Q}^*_{i-1}$ (complex conjugate of $\hat{Q}_{i-1}$) in the previous keyframe by the input key value data $Q_i$ represented by a quaternion transformation value.

The quantizer 1340 receives the first key value data $Q_0$ or the quaternion rotational differential value $\dot{Q}_i$ from the first quaternion multiplier 1310 and quantizes the input using a predetermined number of quantization bits in step S13300.

Since all rotational quaternion differential values are each represented by unit quaternion, a norm of a quaternion representing a rotational differential value is always 1. Therefore, a component among four components of a quaternion, which has not been encoded, can be decoded using the other three components. The key value data encoder 300 according to the first embodiment of the present invention encodes only three components among the four components of a quaternion in order to reduce the amount of data to be encoded. Accordingly, the quantizer 1340 quantizes only the three components which will be encoded.

The quantizer 1340 according to the present invention performs non-linear quantization rather than general linear quantization, and the reason will be described below with reference to FIG. 14A.

Figure 14A:
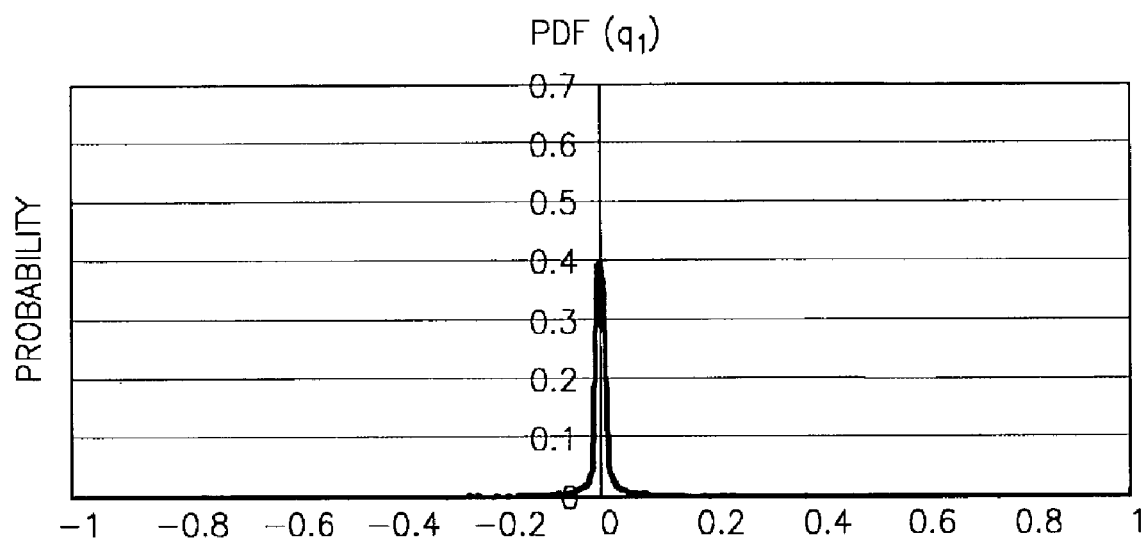
FIG. 14A is a diagram illustrating a typical example of a probability distribution function (PDF) in each component of a rotational differential value.

FIG. 14A is a diagram illustrating a typical example of a probability distribution function (PDF) in each component of a rotational differential value. As shown in FIG. 14A, component values of rotation differential values generally concentrate around 0, which is called energy compaction and means it is possible to reduce redundancy among pieces of rotation information effectively. Accordingly, in order to quantize rotational differential values, reflecting lower component values of each of the rotational differential values more sufficiently, quantization needs to be performed on the lower component values more elaborately, and that is why the quantizer 1340 according to the present invention performs non-linear quantization. Here, the quantizer 1340 uses an arc-tangent curve in order to allot a non-linear scale factor to each of the rotational differential values.

Figure 14B:
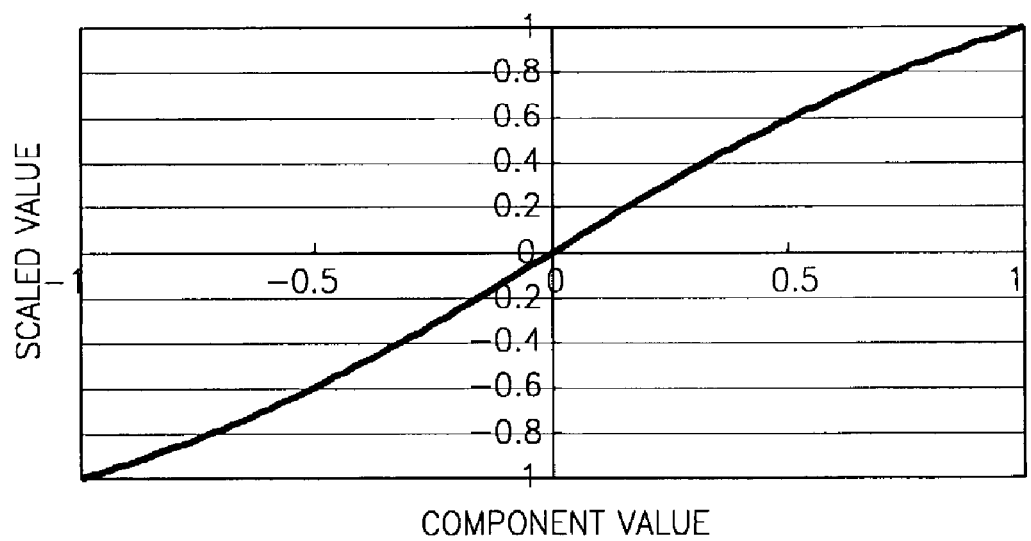
FIG. 14B is an arc-tangent curve for nonlinear quantization.

FIG. 14B is an arc-tangent curve used for quantization according to the present invention. As shown in FIG. 14B, the arc-tangent curve provides an appropriate resolution to higher input values and provides a much higher resolution to lower input values. The quantizer 1340 quantizes a rotational differential value in step S13330 using a non-linear scale function, which is shown in the following equation.

$$\tilde{q}_i = \text{floor}(q'_i \cdot (2^{nQBits-1} - 1) + 0.5) \qquad (q'_i \geq 0) \qquad (23)$$
$$= -\text{floor}(-q'_i \cdot (2^{nQBits-1} - 1) + 0.5) \quad (q'_i < 0)$$
$$\left( q'_i = \frac{4}{\pi} \cdot \tan^{-1}(q_i), i = 1, 2, 3, -1 \leq q_i \leq 1 \right)$$

Here, $\dot{q}_i$ represents each component of the rotational differential value input into the quantizer 1340, $q_i'$ represents a scaled value of $\dot{q}_i$, nQBits represents a predetermined number of quantization bits used for quantization, and floor(x) represents a function for transforming an input value x into a maximum integer of no greater than x.

The quantizer 1340 performs quantization on the input rotational differential value and then checks whether or not the quantized rotational differential data correspond to last key value data to be encoded. If the quantized rotational differential data correspond to the last key value data, the quantizer 1340 outputs the quantized rotational differential data to the circular DPCM operator 1400. If the quantized rotational differential data do not correspond to the last key value data, the quantizer 1340 outputs the quantized rotational differential data to the inverse quantizer 1350.

In step S13400, the inverse quantizer 1350 inverse-quantizes the quantized rotational differential data input from the quantizer 1340 and outputs a restored rotational differential value in step S13500.

Figure 21A:
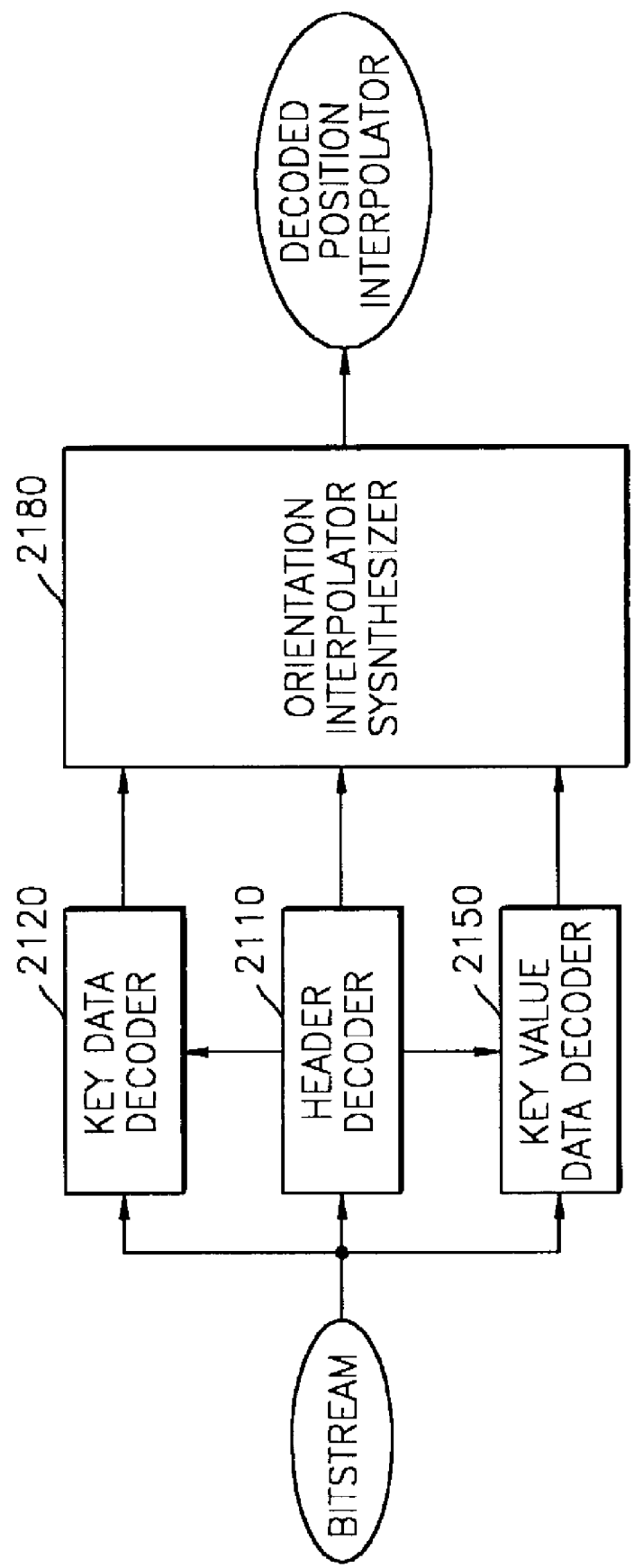
FIG. 21A is a block diagram of an apparatus for decoding an orientation interpolator according to a preferred embodiment of the present invention.

As described above, the key value data encoder 300 according to the first embodiment of the present invention encodes only three components of a quaternion representing a rotational differential value by quantizing the three components other than the first component. An inverse quantizer 2430 of an key value data decoder, which is shown in FIG. 21A, and the inverse quantizer 1350, which has been described above, are supposed to restore the other one, which has not been encoded, among the four components of the rotational differential value, using the three encoded components. Since all rotational differential values are each represented by a unit quaternion, the norm of a quaternion representing a rotational differential value is always 1. Therefore, it is possible to restore the first component among the four components of the rotational differential value using the following equation.

$$\hat{q}_0 = \sqrt{1 - (\hat{q}_1^2 + \hat{q}_2^2 + \hat{q}_3^2)} \quad (\hat{q}_0 \geq 0) \qquad (24)$$

In Equation (24), $\hat{q}_1$, $\hat{q}_2$, and $\hat{q}_3$ represent three restored components of a rotational differential value, and $\hat{q}_0$ represents a first component restored using the three restored components $\hat{q}_1$, $\hat{q}_2$ and $\hat{q}_3$.

In order to restore the first component $\hat{q}_0$ following Equation (11), the first component $\hat{q}_0$ must have a positive value, and this condition can be satisfied by taking advantage of the characteristics of a quaternion, which appear when applying a quaternion to rotational transformation of an object in a 3D space and are shown in Equation (25).

$$Y = Q \times X \times Q^* = (-Q) \times X \times (-Q)^* \qquad (25)$$

Equation (25) shows that rotational transformation values Q and −Q have the same physical meaning when applying rotational transformation to an object in a 3D space. Accordingly, if the first component of a rotational differential value in the key value data encoder 300 according to the first embodiment of the present invention has a negative value, the rotational differential value can be easily converted into a positive number by multiplying each of the components of the rotational differential value by −1. In this case, however, the sum of the square of each of the components of a restored rotational differential value except for the first component may exceed 1 due to a quantization error. In this case, $\hat{q}_0$ cannot be determined by Equation (24) and is considered a value which is close to 0 and is smaller than a minimum value which can be quantized by the quantizer 1340. The fact that $\hat{q}_0$ has such a value means that the object has been rotationally transformed by as much as about 180 degrees. Accordingly, an apparatus for decoding an orientation interpolator needs a method for determining $\hat{q}_0$ while minimizing the effect of the restored first component value $\hat{q}_0$ on the three restored component values $\hat{q}_1$, $\hat{q}_2$, and $\hat{q}_3$, and the method will be also applied to the inverse quantizer 1350 of the key value data encoder 300 according to the first embodiment of the present invention. For example, the minimum value, which can be quantized by the quantizer 1340, multiplied by a predetermined integer may be determined as $\hat{q}_0$. The following equation may be used to determine $\hat{q}_0$.

$$\hat{q}_0 = a \cdot 2^{-m} \quad (26)$$

In Equation (26), 'a' represents an arbitrary constant, and m represents a predetermined number of quantization bits.

While 2-bit long information on each key value data is required for decoding in the conventional MPEG-4 BIFS PMFC method, the 2-bit long information is not necessary in the present invention, and thus the number of bits to be encoded can be decreased by as much as 2N when encoding N key value data.

The restored rotational differential value output from the inverse quantizer 350 is input into the second quaternion multiplier 1370, and the second quaternion multiplier 1370 checks if an input keyframe is a first keyframe to be encoded in step S13600. If the input keyframe is the first keyframe to be encoded, the second quaternion multiplier 1370 accumulates the restored rotational differential value of the first keyframe input from the inverse quantizer 1350 ($\hat{Q}_0 = \hat{Q}_0$)) and outputs the accumulated value to the delayer 1390 in step S13800.

If the input keyframe is not the first keyframe to be encoded, the second quaternion multiplier 1370 restores a rotational transformation value $\hat{Q}_i$ of a current keyframe in step S13700 by quaternion-multiplying a rotational differential value $\hat{Q}_i$ of the current keyframe and a restored rotational transformation value $\hat{Q}_{i-1}$ of a previous keyframe ($\hat{Q}_i = \hat{Q}_i \times \hat{Q}_{i-1}$).

The second quaternion multiplier 1370 outputs the restored rotational transformation value $\hat{Q}_i$ of the current keyframe to the delayer 1390, and then the delayer 1390 keeps $\hat{Q}_i$ until a rotational transformation value of a next keyframe is input so that $\hat{Q}_i$ is equal to $\hat{Q}_{i-1}$ and then outputs $\hat{Q}_{i-1}$ to the first quaternion multiplier 1310.

When a rotational transformation value $Q_i$ of a current keyframe is input into the first quaternion multiplier 1310, the first quaternion multiplier 1310 also receives the restored rotational transformation value $\hat{Q}_{i-1}$ of a previous keyframe from the delayer 1390 and generates a rotational differential value $\dot{Q}_i$ between the rotational transformation value of the current keyframe and the restored rotational transformation value of the previous keyframe in step S13100 by quaternion-multiplying the restored quaternion transformation value $\hat{Q}^*_{i-1}$ in the previous keyframe by $Q_i$. ($Q_i \times \hat{Q}^*_{i-1}$).

The generated rotational differential value is output to the quantizer 340 and then is quantized by the quantizer 1340 in step S13300, as described above. The quantizer 1340 outputs rotational differential data generated by quantizing a rotational differential value to the circular DPCM operator 1400 in step S13400 if the input rotational differential value correspond to the last key value data.

The circular DPCM operator 1400 checks if the order of DPCM of the quantized rotational differential data input from the quantizer 1340 is 0. If the order of DPCM is 0, the circular DPCM operator 1400 outputs the quantized rotational differential data to the entropy encoder 1450 in step S14000 without performing a linear DPCM operation and a circular DPCM operation. If the order of DPCM is not 0, the circular DPCM operator 1400 performs a linear DPCM operation and a circular DPCM operation on the quantized rotational differential data in step S14100.

Figure 15A:
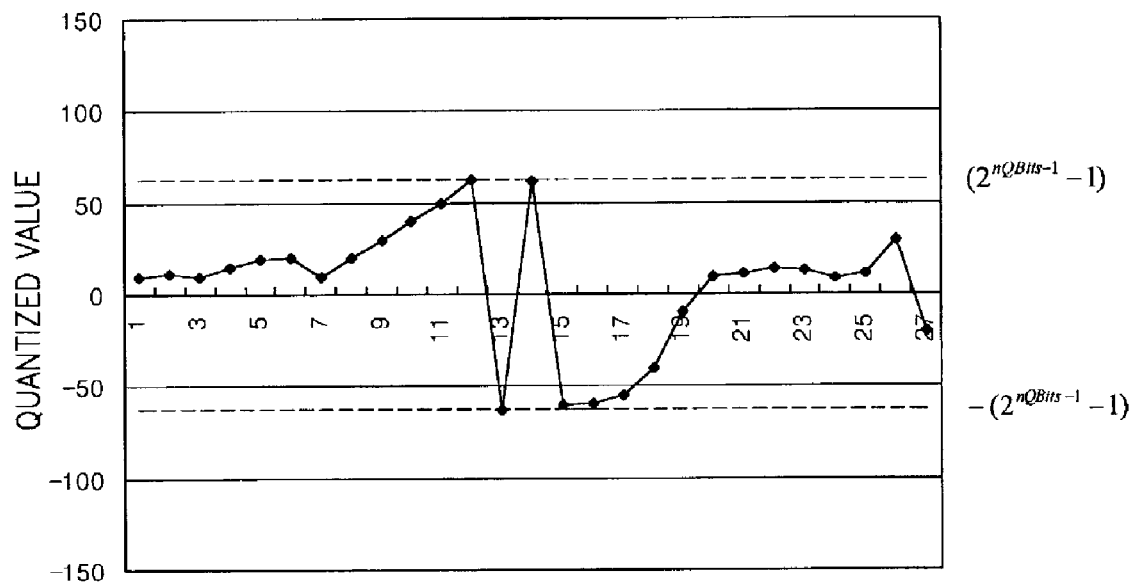
FIG. 15A is an example of rotational differential data output from a quantizer included in a key value data encoder according to a preferred embodiment of the present invention.
Figure 15B:
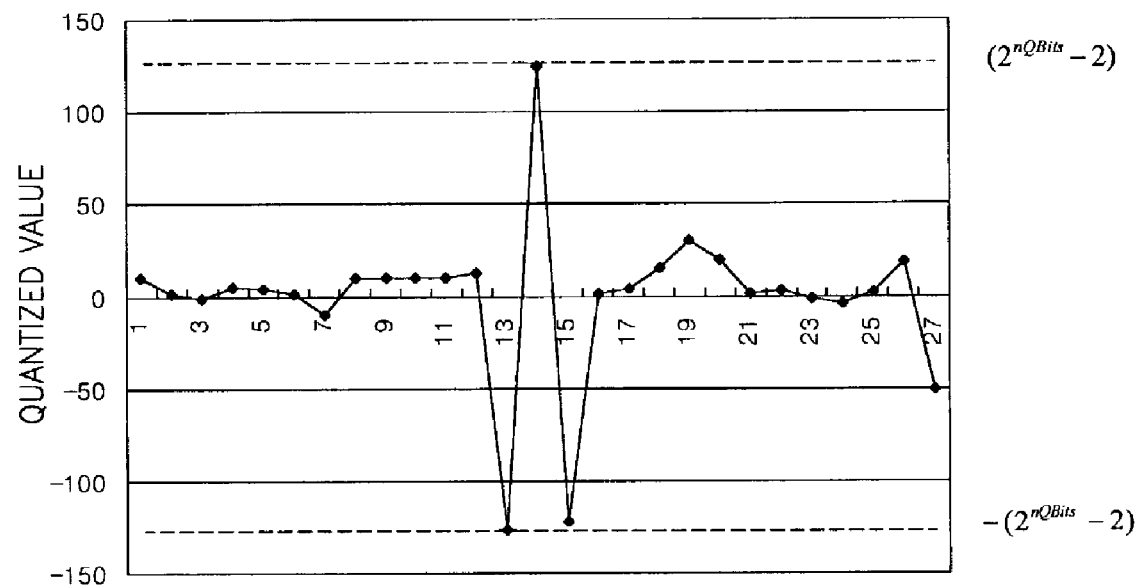
FIG. 15B is a diagram illustrating the results of performing a linear DPCM operation on the differential data shown in FIG.

FIG. 15A is a diagram illustrating an example of differential data output from the quantizer 1340, and FIG. 15B is a diagram illustrating the results of performing a linear DPCM operation on the differential data output from the quantizer 1340.

As shown in FIG. 15B, as a result of a linear DPCM operation, the range of differential data to be encoded can be increased two times larger than it used to be. The purpose of the performance of the circular DPCM operation is to maintain the range of differential data within the range of quantized differential data.

The circular DPCM operation is performed on the assumption that a maximum value and a minimum value in a quantization range are circularly connected to each other. Accordingly, if differential data, which are the results of performing linear DPCM on two consecutive quantized data, are greater than half of the maximum value in the quantization range, they can be represented by smaller values by subtracting the maximum value from the differential data.

If the differential data are smaller than half of the minimum value in the quantization range, they can be represented by even smaller values by adding the maximum value in the quantization range to the differential data.

When $Q_i$ and $Q_{i-1}$ represent quantized rotational differential data at two successive moments of time $t_i$ and $t_{i-1}$, respectively, a linear DPCM operation is performed on the two successive quantized rotational differential data $Q_i$ and $Q_{i-1}$ following Equation (27).

$$X_i = \tilde{Q}_i - \tilde{Q}_{i-1} = (\tilde{q}_{i,1} - \tilde{q}_{i-1,1}, \tilde{q}_{i,2} - \tilde{q}_{i-1,2}, \tilde{q}_{i,2} - \tilde{q}_{i-1,3})^T \quad (27)$$

In addition, a circular DPCM operation is performed on the differential data obtained using Equation (27), following Equation (28).

$$\check{Q}_i = \min(|X_i|, |X'_i|)$$

$$X'_i = X_i - (2^{nQBits} - 1) \text{ (if } X_i \geq 0)$$

$$X'_i = X_i + (2^{nQBits} - 1) \text{ (otherwise)} \quad (28)$$

Figure 15C:
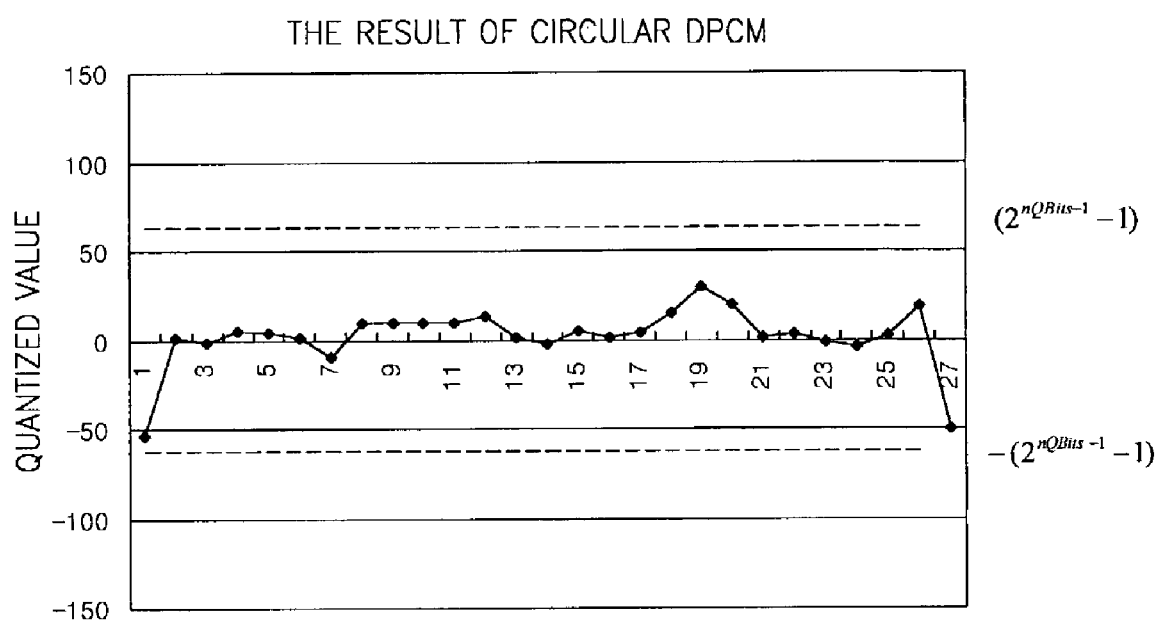
FIG. 15C is a diagram illustrating the results of performing a circular DPCM operation on the linear-DPC-Med differential data shown in FIG. 15B.
Figure 16:
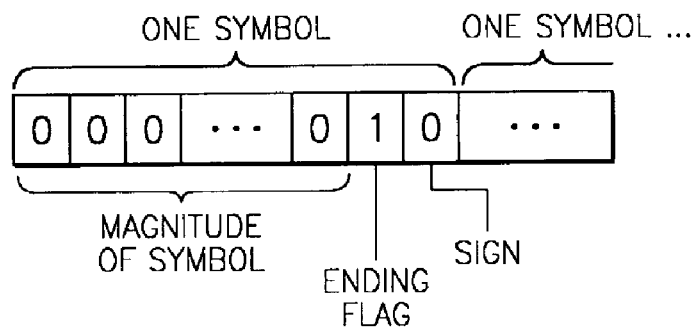
FIG. 16 is a diagram illustrating an example of a function UnaryAAC( ) used for entropy encoding.

In Equation (28), nQBits represents a predetermined number of quantization bits. FIG. 15C is a diagram illustrating the results of performing a circular DPCM operation on the DPC-Med differential data shown in FIG. 15B. As shown in FIG. 15C, the range of the circular-DPCMed differential data is much smaller than the range of the linear-DPCMed differential data.

The entropy encoder 1450 receives the rotational differential data or the circular-DPCMed rotational differential data from the circular DPCM operator 1400 depending on the order of DPCM of the rotational differential data and then encodes the input differential data by removing bit redundancy.

Referring to FIG. 13B again, the entropy encoder 1450 checks an entropy encoding mode in step S14500.

If the entropy encoding mode is a binary entropy encoding mode, the entropy encoder 1450 encodes the input differential data using a function Signed AAC( ) in step S14600. If the entropy encoding mode is a unary entropy encoding mode, the entropy encoder 1450 encodes the input differential data using a function Unary AAC( ) in step S14700.

The function Signed AAC( ) is used to encode differential data using an adaptive binary arithmetic encoder, which encodes the sign and magnitude of the differential data on each bit plane, and the encoding method has been described above with reference to FIG. 11.

On the other hand, the function Unary AAC( ) is used to encode symbols by transforming a value to be encoded into a series of 0s, a flag bit '1' indicating the series of 0s ends, and another bit indicating the sign of the value. The number of series of 0s corresponds to the magnitude of the value.

Hereinafter, the function Unary AAC( ) will be described more fully with reference to FIG. 16B. For example, 256 is encoded into a series of bits consisting of two hundred fifty six 0s, 1 which is a flag bit indicating the series of 0s ends, and 0 which represents the sign of 256, i.e., a plus sign by the function Unary AAC( ). Due to Unary AAC( ), redundancy among the bits representing the symbol to be encoded increases, which enhances the efficiency of encoding the symbol.

Hereinafter, a key value data encoder 300 according to a second embodiment of the present invention will be described. The key value data encoder 300 according to the second embodiment of the present invention includes a means for correcting a rotation direction error occurring during quantization as well as all the elements of the key value data encoder 300 data according to the first embodiment of the present invention.

Figure 17:
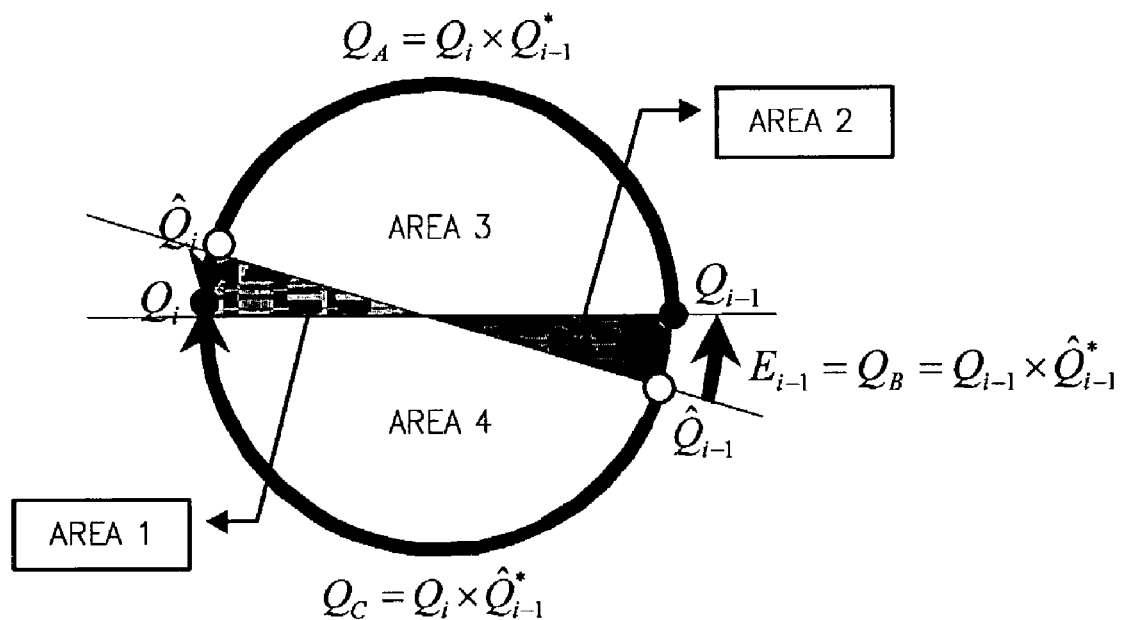
FIG. 17 is a diagram illustrating a rotation direction error occurring during encoding quaternion rotational transformation values using a rotational differential value.

FIG. 17 is a diagram illustrating a rotation direction error generated during encoding quaternion rotational transformation values using rotational differential values. The rotation direction error occurs because the quaternion encoding method performed in the key value data encoder 300 according to the present invention is a loss encoding method.

In FIG. 17, when $Q_i$, $Q_{i-1}$, $\hat{Q}_i$, and $\hat{Q}_{i-1}$ represent a rotational transformation value currently being applied to an object in an i-th keyframe, a rotational transformation value applied to the object in a previous keyframe, a value restored from $Q_i$, and a value restored from $Q_{i-1}$, respectively, the locations of the object rotated by as much as rotation transformations respectively indicated by $Q_i$, $Q_{i-1}$, $\hat{Q}_i$, and $\hat{Q}_{i-1}$ may be represented by four different areas, as shown in FIG. 17.

In other words, if the object rotates from $Q_{i-1}$ to $Q_i$ along a shortest arc so that the object is located in area 1 and area 3 after rotating by $Q_i$ and $Q_{i-1}$, the object is considered to have rotated from $Q_{i-1}$ to $Q_i$ counterclockwise. Meanwhile, if the object rotates from $Q_{i-1}$ to $Q_i$ along a shortest way so that the object is located in area 2 and area 4 after rotating by $Q_{i-1}$ and $Q_i$, the object is considered to have rotated from $Q_{i-1}$ to $Q_i$ clockwise.

On the other hand, if the object rotates following rotation information which has been encoded and then decoded, an apparatus for decoding an orientation interpolator rotates the object using $\hat{Q}_i$ and $\hat{Q}_{i-1}$ corresponding to $Q_i$ and $Q_{i-1}$, respectively. Accordingly, if the relative location of the object rotated by $\hat{Q}_i$ with respect to the location of the object rotated by $\hat{Q}_{i-1}$ is area 2 or 3 $\hat{Q}_{i-1}$, the object rotates counterclockwise. If the relative location of the object rotated by $\hat{Q}_i$ with respect to the location of the object rotated by $\hat{Q}_{i-1}$ is area 1 or 4, the object rotates clockwise. In areas 1 and 2, the rotation direction of the object when using an original rotational transformation value may be opposite to the rotation direction of the object when using a decoded rotational transformation value, because $Q_i$ and $\hat{Q}_i$ are different due to loss encoding, which is performed to encode quaternion rotational transformation values. In order to solve this problem, it is required to minimize the degree to which the object rotates in a wrong direction, which is opposite to a desired direction, or to correct the rotation direction of the object when the object rotates in a wrong direction so that the object rotate in a desired direction. In the present invention, the method for correcting the rotation direction of the object so as to make the object rotate in a desired direction is adopted.

Referring to FIG. 17 again, the concept of correction of a rotation direction error according to the present invention will be described briefly in the following. If a rotation direction error, like the phenomenon occurring in areas 1 and 2, is detected, quaternion rotational differential values to be encoded are controlled so as to rotate in a right direction, in which case the inconsistency in rotation directions still occurs in area 2. However, in area 2, unlike in area 1, differences between original quaternion values and restored quaternion values are relatively small. Accordingly, rotation direction correction according to the second embodiment of the present invention is performed on only area 1.

Hereinafter, the key value data encoder 300, which performs rotation direction correction, according to the second embodiment of the present invention will be described with reference to FIGS. 18A through 19B. The key value data encoder 300 according to the second embodiment of the present invention has almost the same structure as the key value data encoder 300 according to the first embodiment of the present invention. The only difference between them is the structure of a rotational DPCM operator, and thus only the structure of a rotational DPCM operator in the key value data encoder 300 according to the second embodiment of the present invention will described in the following paragraphs.

Figure 18A:
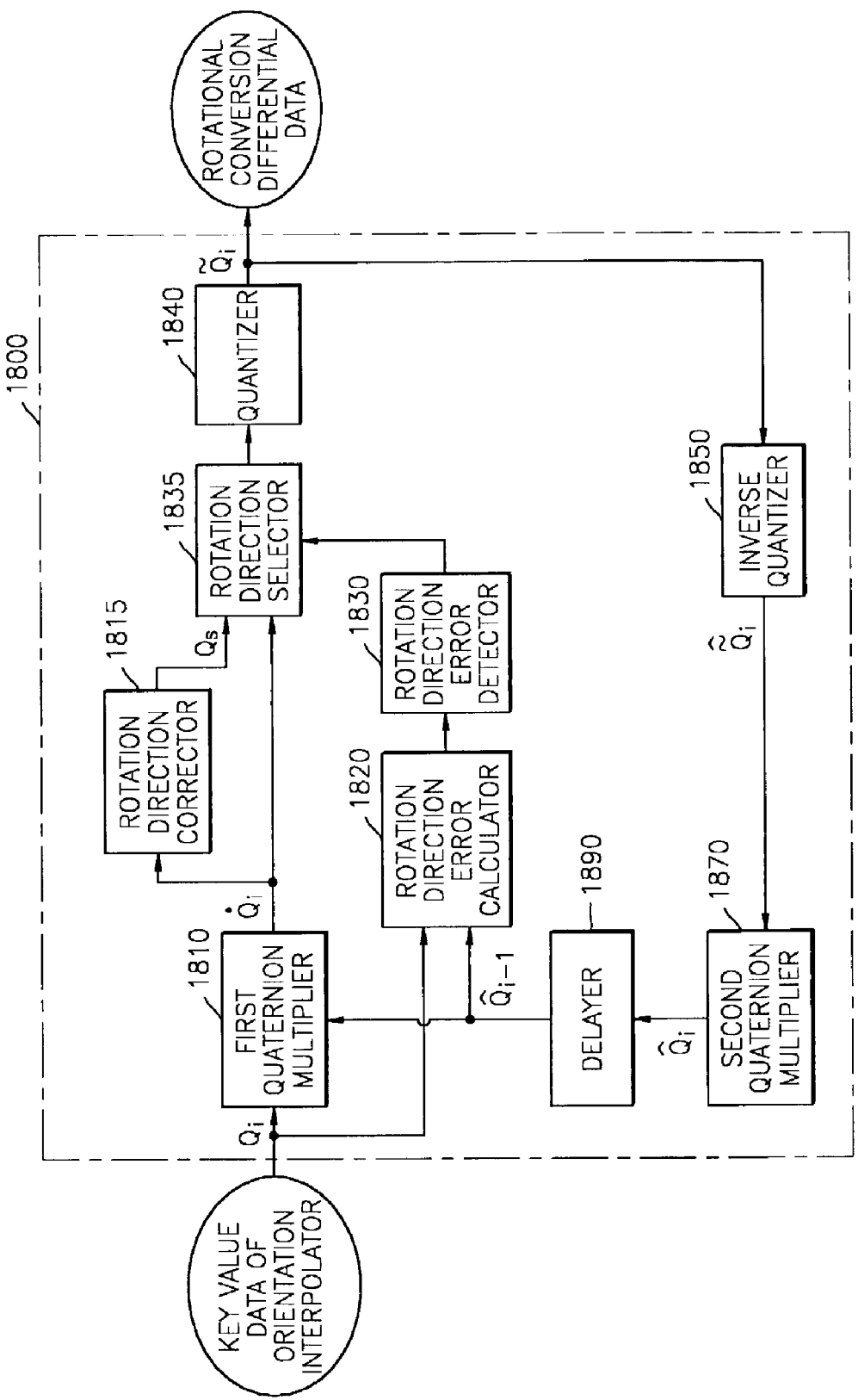
FIG. 18A is a block diagram of a rotational DPCM operator of a key value data encoder according to a second embodiment of the present invention.
Figure 18B:
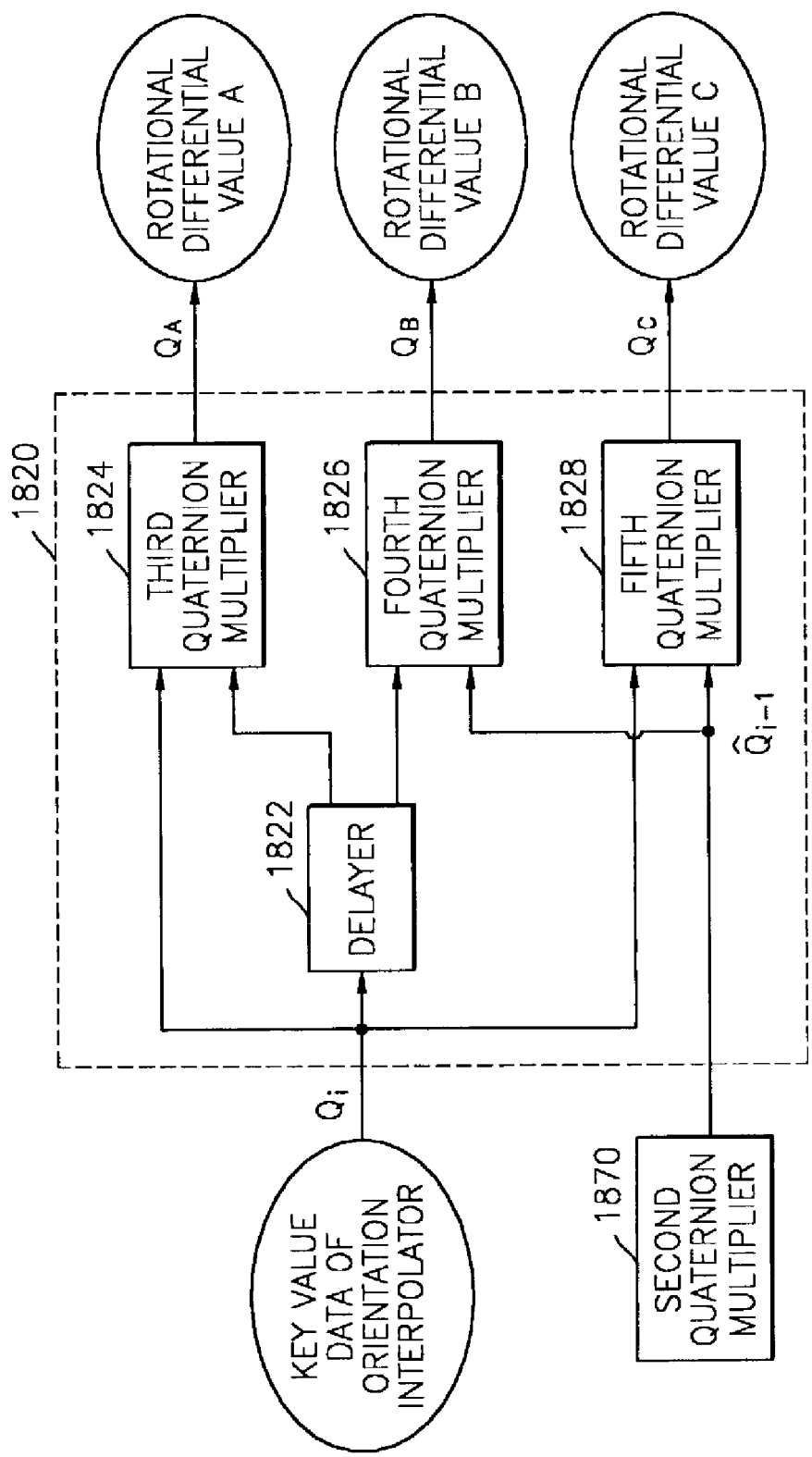
FIG. 18B is a block diagram of a rotation direction error calculator shown in FIG. 18A.

FIG. 18A is a block diagram of a rotational DPCM operator 1800 according to the second embodiment of the present invention, and FIG. 18B is a block diagram of a rotation direction error calculator 1820 shown in FIG. 18A.

Referring to FIG. 18A, the rotational DPCM operator 1800 includes a rotation direction error calculator 1820, which receives a rotational transformation value of an object in a current keyframe and a restored rotational transformation value of the object in a previous keyframe and calculates rotation direction errors, a rotation direction error detector 1830, which detects based on the rotation direction errors input from the rotation direction error calculator 1820 whether or not an error sufficient to change the rotation direction of the object has occurred during decoding, a rotation direction corrector 1815, which corrects and outputs a rotational differential value input from the first quaternion multiplier 1810 so that the object, which is located by adapting a transformation of a decoded rotational transformation value of the previous keyframe, can rotate further by as much as 180 degrees in an original rotation direction, and a rotation direction selector 1835, which selects the rotational differential value input from the rotation direction corrector 1815 or the rotational differential value input from the first quaternion multiplier 1810 depending on a value input from the rotation direction error detector 1830 and outputs the selected value to the quantizer 840.

Referring to FIG. 18B, the rotation direction error calculator 1820 shown in FIG. 18A includes a delayer 1822, which stores an input rotational transformation value until a rotational transformation value of a next keyframe is input, a third quaternion multiplier 1824, which receives the input rotational transformation value and a rotational transformation value of a previous keyframe output from the delayer 1822 and calculates a rotational differential value between the input rotational transformation value and the rotational transformation value of the previous keyframe by quaternion multiplication, a fourth quaternion multiplier 1826, which calculates a rotational differential value between the rotational transformation value of the previous keyframe output from the delayer 1822 and the restored rotational transformation value of the previous keyframe, and a fifth quaternion multiplier 1828, which calculates between the input rotational transformation value and the restored rotational transformation value of the previous keyframe.

Hereinafter, a rotational DPCM operation according to a second embodiment of the present invention will be described in greater detail with reference to FIG. 19A.

Key value data $Q_i$ of an orientation interpolator node, which are about to be encoded, are input into the first quaternion multiplier 1810 and the rotation direction error calculator 1820 of the rotational DPCM operator 1800 in step S19000.

The first quaternion multiplier 1810, like the first quaternion multiplier in the key value data encoder 300 according to the first embodiment of the present invention, generates a rotational differential value $\dot{Q}_i$ by quaternion-multiplying ($Q_i \times \hat{Q}^*_{i-1}$) an input rotational transformation value of a current keyframe by a restored rotational transformation value of a previous keyframe input from the second quaternion multiplier 1870 and outputs the generated rotational differential value $\dot{Q}_i$ to the rotation direction corrector 1815 and the rotation direction selector 1835 in step S19100.

The rotation direction corrector 1815 corrects a rotational differential value input thereinto following Equation (29) and outputs the corrected rotational differential value $Q_S$ to the rotation direction selector 1835. The rotation direction error calculator 1820 receives the rotational transformation value $Q_i$ of the current keyframe and the restored rotational transformation value $\hat{Q}_{i-1}$ of the previous keyframe input from the second quaternion multiplier 1870 and calculates rotational transformation values $Q_A$, $Q_B$, and $Q_C$, which will be described later. The rotation direction error detector 1830 detects using the rotational differential value input from the rotation direction error calculator 1820 whether or not a rotation direction error has occurred and outputs the result of the detection to the rotation direction selector 1835 in step S19200.

$$Q_S = \begin{pmatrix} |\delta_T| \\ -\frac{1}{\sqrt{(q_{R,1})^2 + (q_{R,2})^2 + (q_{R,3})^2}} q_{R,1} \\ -\frac{1}{\sqrt{(q_{R,1})^2 + (q_{R,2})^2 + (q_{R,3})^2}} q_{R,2} \\ -\frac{1}{\sqrt{(q_{R,1})^2 + (q_{R,2})^2 + (q_{R,3})^2}} q_{R,3} \end{pmatrix} \quad (29)$$

In Equation (29), $\delta_T$ represents a constant very close to 0, and $(\dot{q}_{R,0}, \dot{q}_{R,1}, \dot{q}_{R,2}, \dot{q}_{R,3})^T$ represents the rotational differential value $\dot{Q}_i$ output from the first quaternion multiplier 1810. The rotation direction error calculator 1820, the rotation direction error detector 1830, and the rotation direction corrector 1815 will be described later with reference to FIG. 19B.

The rotation direction selector 1835 checks whether or not a rotation direction error has occurred so that the object rotates in the opposite direction to a desired direction when decoding an encoded key value data using a logic value input from the rotation direction error detector 1830. If a rotation direction error has not occurred, the rotation direction selector 1835 outputs the rotation differential value input from the first quaternion multiplier 1810 to the quantizer 1840 in step S19300. If a rotation direction error has occurred, the rotation direction selector 1835 outputs the corrected rotational differential value input from the rotation direction corrector 1815 in step S19300.

The quantizer 1840 quantizes the original rotational differential data $\dot{Q}_i$ or the corrected rotational differential data $Q_S$ in steps S19400 and S19500 in the same quantization method as in the first embodiment of the present invention.

The quantizer 1840 checks whether or not quantized rotational differential data $\mathcal{Q}_i$ belong to the last key value data in step S19600. If the quantized rotational differential data $\mathcal{Q}_i$ correspond to the last key value data, the quantizer 1840 outputs the quantized rotational differential data $\mathcal{Q}_i$ to a circular DPCM operator 1400 in step S19700. If the quantized rotational differential data $\mathcal{Q}_i$ do not correspond to the last key value data, the quantizer 1840 outputs the quantized rotational differential data $\mathcal{Q}_i$ to the inverse quantizer 1850.

The inverse quantizer 1850 inverse-quantizes the quantized rotational differential data $\mathcal{Q}_i$ in the same inverse quantization method as in the first embodiment of the present invention and outputs restored rotational differential data $\hat{\mathcal{Q}}_i$ to the second quaternion multiplier 1870 in step S19800.

The second quaternion multiplier 1870 generates a restored rotational transformation value $\hat{Q}_i$ of a current keyframe by quaternion-multiplying the restored rotational differential value $\hat{\mathcal{Q}}_i$ by a rotational transformation value $\hat{Q}_i$ of a previous keyframe. The second quaternion multiplier 870 outputs a rotational transformation value of a current keyframe to the first quaternion multiplier 1810 and the rotation direction error calculator 1820 via the delayer 1890 in step S19900.

Hereinafter, the operations of the rotation direction error calculator 1820, the rotation direction error detector 1830, and the rotation direction corrector 1815 will be described with reference to FIG. 19B.

The rotation direction error calculator 1820 calculates rotational differential values corresponding to areas 2 through 4, which have been described above with reference to FIG. 17.

The rotation direction error calculator 1820 receives a rotation transformation value, which corresponds to key value data of a keyframe to be encoded, receives a restored rotational transformation value of a previous keyframe prior to the current keyframe, and calculates a rotation direction error in step S19220.

The rotational transformation value corresponding to the key value data of an orientation interpolator of the current keyframe are directly input into the third quaternion multiplier 1824 and the fifth quaternion multiplier 1828 and are input into the fourth quaternion multiplier 1826 via the delayer 1822 when a rotational transformation value of a next keyframe is input. In addition, the restored rotational transformation value of the previous keyframe output from the second quaternion multiplier 1870 is input into the fourth quaternion multiplier 1826 and the fifth quaternion multiplier 1828.

The third quaternion multiplier 1824 generates the rotational differential value $Q_A$ by quaternion-multiplying ($Q_A = Q_i \times Q^*_{i-1}$) the rotational transformation value of the current keyframe by the rotational transformation value of the previous keyframe and outputs $Q_A$ to the rotation direction error detector 1830. The rotational differential value $Q_A$ represents an original rotation direction of an object during a time interval $[t_{i-1}, t_i]$.

The fourth quaternion multiplier 1826 generates the rotational differential value $Q_B$ by quaternion-multiplying ($Q_B = Q_{i-1} \times \hat{Q}^*_{i-1}$) the rotational transformation value of the previous keyframe by the restored rotational transformation value of the previous keyframe and outputs $Q_B$ to the rotation direction error detector 1830. The rotational differential value $Q_B$ calculated by the fourth quaternion multiplier 1826 represents the rotation direction error and rotation direction of an object, which are affected by a quantization error, at a predetermined moment of time $t_{i-1}$ and corresponds to area 2 shown in FIG. 17.

The fifth quaternion multiplier 1828 generates the rotational differential value $Q_c$ by quaternion-multiplying ($Q_C = Q_i \times \hat{Q}^*_{i-1}$) the rotational transformation value of the current keyframe by the restored rotational transformation value of the previous keyframe and outputs $Q_c$ to the rotation direction error detector 1830. The rotational differential value $Q_c$ calculated by the fifth quaternion multiplier 1828 represents a rotational differential value to be encoded at the predetermined moment of time $t_i$ and corresponds to area 4 shown in FIG. 17.

The rotation direction error detector 1830 checks using the rotational differential values $Q_A$, $Q_B$, and $Q_C$ input from the rotation direction error calculator 1820 whether or not the object rotates in an opposition direction to an original direction in the process of decoding encoded key value data in step S19240. For doing this, the rotation direction error detector 1830 checks whether or not the rotational differential values $Q_A$, $Q_B$, and $Q_C$ satisfy Inequalities (30) through (34). First of all, the rotation direction error detector 1830 checks if the rotational differential values $Q_A$ and $Q_C$ satisfy Inequality (30).

$$\begin{pmatrix} q_{A,1} \\ q_{A,2} \\ q_{A,3} \end{pmatrix} \cdot \begin{pmatrix} q_{C,1} \\ q_{C,2} \\ q_{C,3} \end{pmatrix} < 0 \tag{30}$$

In Inequality (30), when the rotational differential value $Q_A$ input from the rotation direction error calculator 1820 is expressed by $Q_A = (q_{A,0}, q_{A,1}, q_{A,2}, q_{A,3})^T$, $$\begin{pmatrix} q_{A,1} \\ q_{A,2} \\ q_{A,3} \end{pmatrix}$$

represents a three-dimensional vector $(q_{A,1}, q_{A,2}, q_{A,3})^T$ consisting of the four components $q_{A,0}$, $q_{A,1}$, $q_{A,2}$ and $q_{A,3}$ of $Q_A$ except for the first component $q_{A,0}$.

$$\begin{pmatrix} q_{C,1} \\ q_{C,2} \\ q_{C,3} \end{pmatrix}$$

represents a three-dimensional vector $(q_{C,1}, q_{C,2}, q_{C,3})^T$ consisting of the four components $q_{C,0}$, $q_{C,1}$, $q_{C,2}$, and $q_{C,3}$ of $Q_C$ except for the first component $q_{C,0}$. Inequality (30) shows a condition that a inner product of the two 3D vectors $(q_{A,1}, q_{A,2}, q_{A,3})^T$ and $(q_{C,1}, q_{C,2}, q_{C,3})^T$ is smaller than 0.

If the inner product in Inequality (30) is smaller than 0, the rotation direction of an object when using $Q_A$ is opposite to the rotation direction of the object when using $Q_C$. When the inner product is smaller than 0, a value of a logic expression shown in Inequality (30) is set as 'true'. When the inner product is greater than 0, the value of the logic expression is set as 'false'.

$$\begin{pmatrix} q_{B,1} \\ q_{B,2} \\ q_{B,3} \end{pmatrix} \cdot \begin{pmatrix} q_{C,1} \\ q_{C,2} \\ q_{C,3} \end{pmatrix} < 0 \tag{31}$$

In Inequality (31), when the rotational differential value $Q_B$ input from the rotation direction error calculator 1820 is expressed by $Q_B = (q_{B,0}, q_{B,1}, q_{B,2}, q_{B,3})^T$, $$\begin{pmatrix} q_{B,1} \\ q_{B,2} \\ q_{B,3} \end{pmatrix}$$

represents a three-dimensional vector $(q_{B,1}, q_{B,2}, q_{B,3})^T$ consisting of the four components $q_{B,0}$, $q_{B,1}$, $q_{B,2}$, and $q_{B,3}$ of $Q_B$ except for the first component $q_{B,0}$.

$$\begin{pmatrix} q_{C,1} \\ q_{C,2} \\ q_{C,3} \end{pmatrix}$$

represents a three-dimensional vector $(q_{C,1}, q_{C,2}, q_{C,3})^T$ consisting of the four components $q_{C,0}$, $q_{C,1}$, $q_{C,2}$, and $q_{C,3}$ of $Q_C$ except for the first component $q_{C,0}$. Inequality (31) shows a condition that a inner product of the two 3D vectors $(q_{B,1}, q_{B,2}, q_{B,3})^T$ and $(q_{C,1}, q_{C,2}, q_{C,3})^T$ is smaller than 0.

If the inner product of in Inequality (31) is smaller than 0, the rotation direction of an object when using $Q_B$ is opposite to the rotation direction of the object when using $Q_C$. When the inner product is smaller than 0, a value of a logic expression shown in Inequality (31) is set as 'true'. When the inner product is greater than 0, the value of the logic expression is set as 'false'.

$$A_{TH} < 2 \cos^{-1} |q_{A,0}| \tag{32}$$

In Inequality (32), $q_{A,0}$ represents the first component of the rotational differential value $Q_A$, and $A_{TH}$ is set to a predetermined constant close to 0. When in Inequality (32), 2 $\cos^{-1}|q_{A,0}|$ is greater than $A_{TH}$, a value of a logic expression shown in Inequality (32) is defined as 'true'. When 2 $\cos^{-1}|q_{A,0}|$ is not greater than $A_{TH}$, the value of the logic expression is defined as 'false'. When Inequality (32) is set as 'false', it means that a rotation angle $\theta$ ($=2 \cos^{-1}|q_{A,0}|$) smaller than the predetermined constant $A_{TH}$ can be ignored when realizing an key value data encoder 300 according to the present invention. Even though there exists as much a rotation direction error as the rotation angle $\theta$, the rotation direction error does not cause severely distorted images to human eyes, especially when using an error measurement method proposed by the present invention.

$$A_{TH} < 2 \cos^{-1}|q_{B,0}| \tag{33}$$

In Inequality (33), $q_{B,0}$ represents the first component of the rotational differential value $Q_B$, and $A_{TH}$ is the same as the corresponding one in Inequality (32). When in Inequality (33), 2 $\cos^{-1}|q_{B,0}|$ is greater than $A_{TH}$, a value of a logic expression shown in Inequality (33) is defined as 'true'. When 2 $\cos^{-1}|q_{B,0}|$ is not greater than $A_{TH}$, the value of the logic expression is defined as 'false'.

$$A_{TH} < 2 \cos^{-1}|q_{C,0}| \tag{34}$$

In Inequality (34), $q_{C,0}$ represents the first component of the rotational differential value $Q_C$, and $A_{TH}$ is the same as the corresponding one in Inequality (32). When in Inequality (34), $2\cos^{-1}|q_{C,0}|$ is greater than $A_{TH}$, a value of a logic expression shown in Inequality (34) is defined as 'true'. When $2\cos^{-1}|q_{C,0}|$ is not greater than $A_{TH}$, the value of the logic expression is defined as 'false'.

The rotation direction error detector 1830 performs an AND operation on the logic values of Inequalities (30) through (34) and outputs the result of the AND operation to the rotation direction selector 1835.

The first quaternion multiplier 1810 has two input values $Q_i$ and $\hat{Q}_{i-1}$ at a predetermined moment of time t. The first quaternion multiplier 1810 outputs a rotational differential value using the two input values $Q_i$ and $\hat{Q}_{i-1}$. As described above, in area 1, the apparatus for decoding encoded key value data, which receives rotational differential data, rotates an object clockwise. However, the object must rotate from a place where it is currently located after rotating by predetermined degrees indicated by $Q_{i-1}$ to a place where it is supposed to be located after rotating by predetermined degrees indicated by $Q_i$, and thus the original rotation direction of the object must be a counterclockwise direction.

Accordingly, the rotation direction corrector 1815 corrects the rotation direction of the object so that the object can rotate by as much as a rotation angle indicated by $\hat{Q}_{i-1}$ in the same direction as it has rotated based on $\hat{Q}_i$, as shown in FIG. 17, i.e., so that the object can rotate counterclockwise from the place where it is currently located after rotating based on $\hat{Q}_{i-1}$ to the place where it is supposed to be located after rotating by as much as a rotation angle indicated by $\hat{Q}_i$.

For doing this, the rotation direction corrector 1815 sets up new rotation information to make the object rotate counterclockwise by as much as 180 degrees from a place where it is currently located after rotating by predetermined degrees following $\hat{Q}_{i-1}$. Accordingly, the rotation direction of the object is corrected to be the same as the original one, and a rotation direction error can be minimized. The rotation direction corrector 1815 receives the rotational differential data $\dot{Q}_i$ of the current keyframe from the first quaternion multiplier 1810, generates rotational differential data having a corrected rotation direction, and outputs the corrected rotational differential data to the rotation direction selector 1835 in step S19260.

Figure 19A:
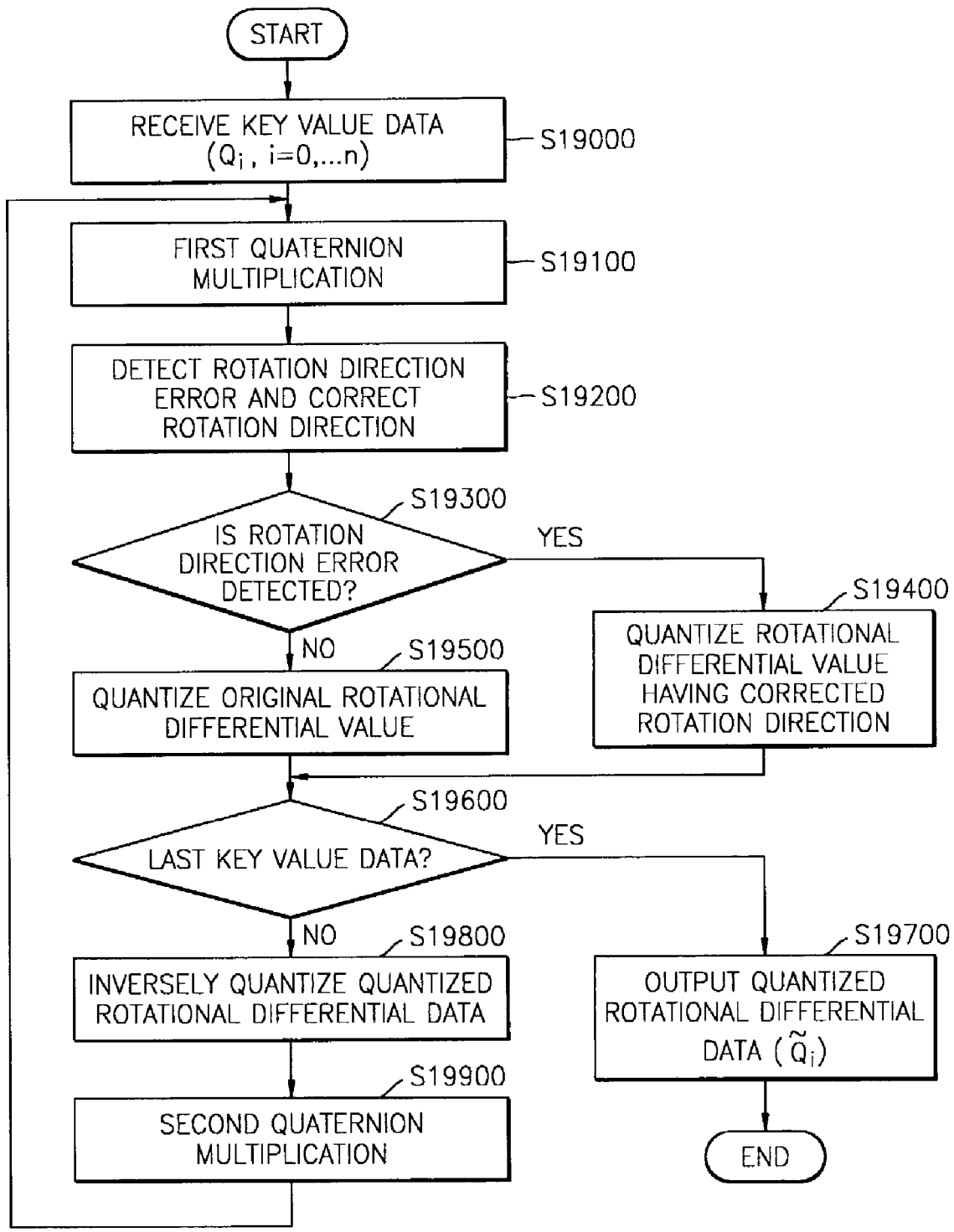
FIG. 19A is a flowchart of a rotational DPCM operation according to a second embodiment of the present invention.
Figure 19B:
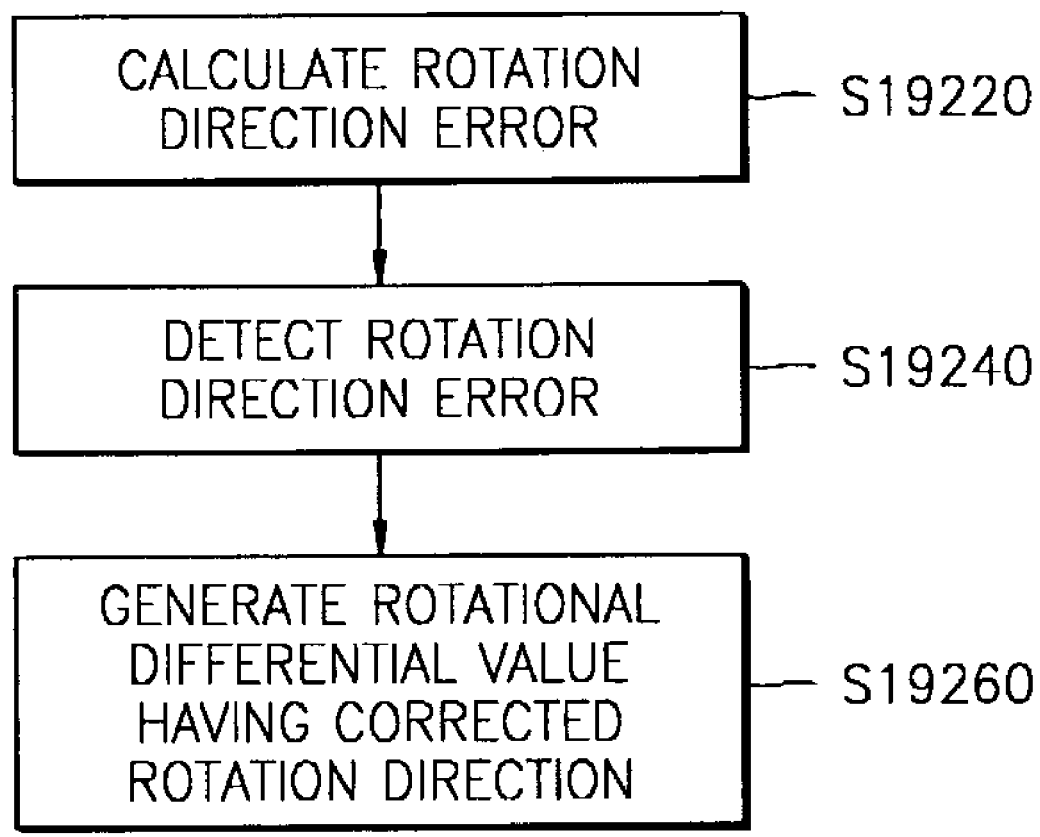
FIG. 19B is a flowchart illustrating the operations of a rotation direction error calculator, a rotation direction error detector, and a rotation direction corrector shown in FIG. 9A.

Referring to FIG. 19A, the rotation direction selector 1835 checks if the logic values input from the rotation direction error detector 1830 are true in step S19300. If the input logic values are true, the rotation direction selector 1835 determines that the same phenomenon as has occurred in area 1 shown in FIG. 17 has occurred and outputs the corrected rotational differential value $Q_S$ defined by Equation (29) to the quantizer 1840 in step S19400.

On the other hand, if the input logic values are false, the rotation direction selector 1835 determines that the same phenomenon as has occurred in area 1 has not occurred and outputs the rotational differential value $\dot{Q}_i$ input from the first quaternion multiplier 1810 to the quantizer 1840 in step S19500.

Hereinafter, a key value data encoder 300 according to a third embodiment of the present invention will be described.

Since the key value data encoders 300 according to the first and second embodiments of the present invention encode only three components among the four components of a rotational differential value, they may not be able to restore a first component value of the quaternion using Equation (24) because of a quantization error. For example, a first component of a restored rotational differential value may be an imaginary number.

In order to prevent the problem with encoding only three components of a quaternion, the key value data encoder 300 according to the third embodiment of the present invention includes a quantizer, which can appropriately adjust three quantized component values so that when decoding encoded key value data, the other component can be restored into a positive real number and distortion of images can be minimized.

The key value data encoder 300 according to the third embodiment of the present invention is the same as the key value data encoders 300 according to the first or second embodiments of the present invention except for the structure of a quantizer 2000, and thus only the structure of the quantizer 2000 will be described in the following.

Figure 20A:
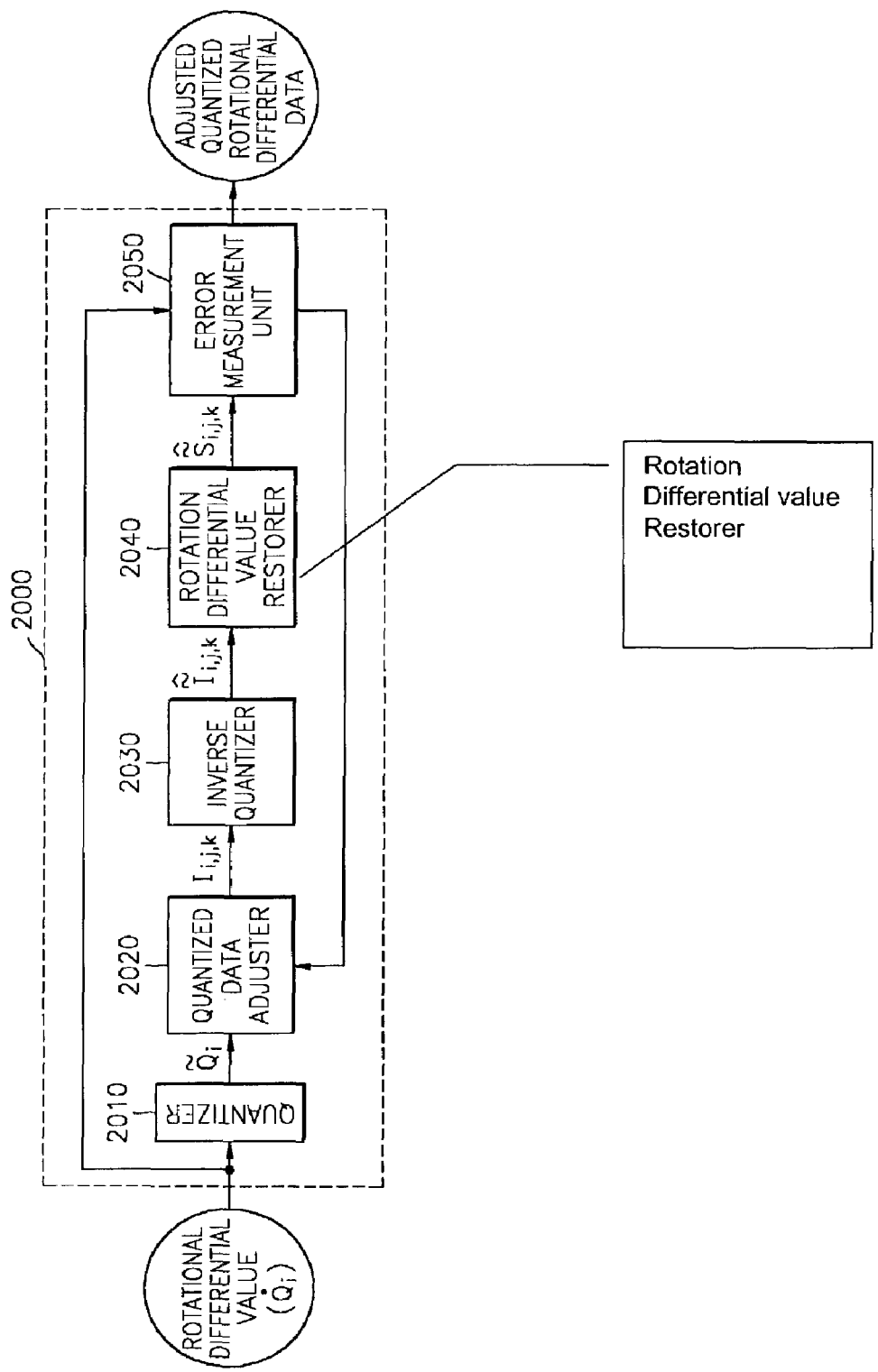
FIG. 20A is a block diagram of a quantizer of a key value data encoder to a third embodiment of the present invention.

FIG. 20A is a block diagram of the quantizer 2000 included in the key value data encoder 300 according to the third embodiment of the present invention. Referring to FIG. 20A, the quantizer 2000 includes a quantization unit 2010, which quantizes a rotational differential value input thereinto, a quantization data adjustor 2020, which adjusts a quantized rotational differential value, an inverse quantizer 2030, which inverse-quantizes quantized rotational differential data, a rotational differential value restorer 2040, which restores all component values of quantized rotational differential data by restoring a first component of the quantized rotational differential data using the inverse-quantized components, and an error measurement unit 2050, which measures an error between a restored differential value and an originally input rotational differential value and renews quantized rotational differential data.

Figure 20B:
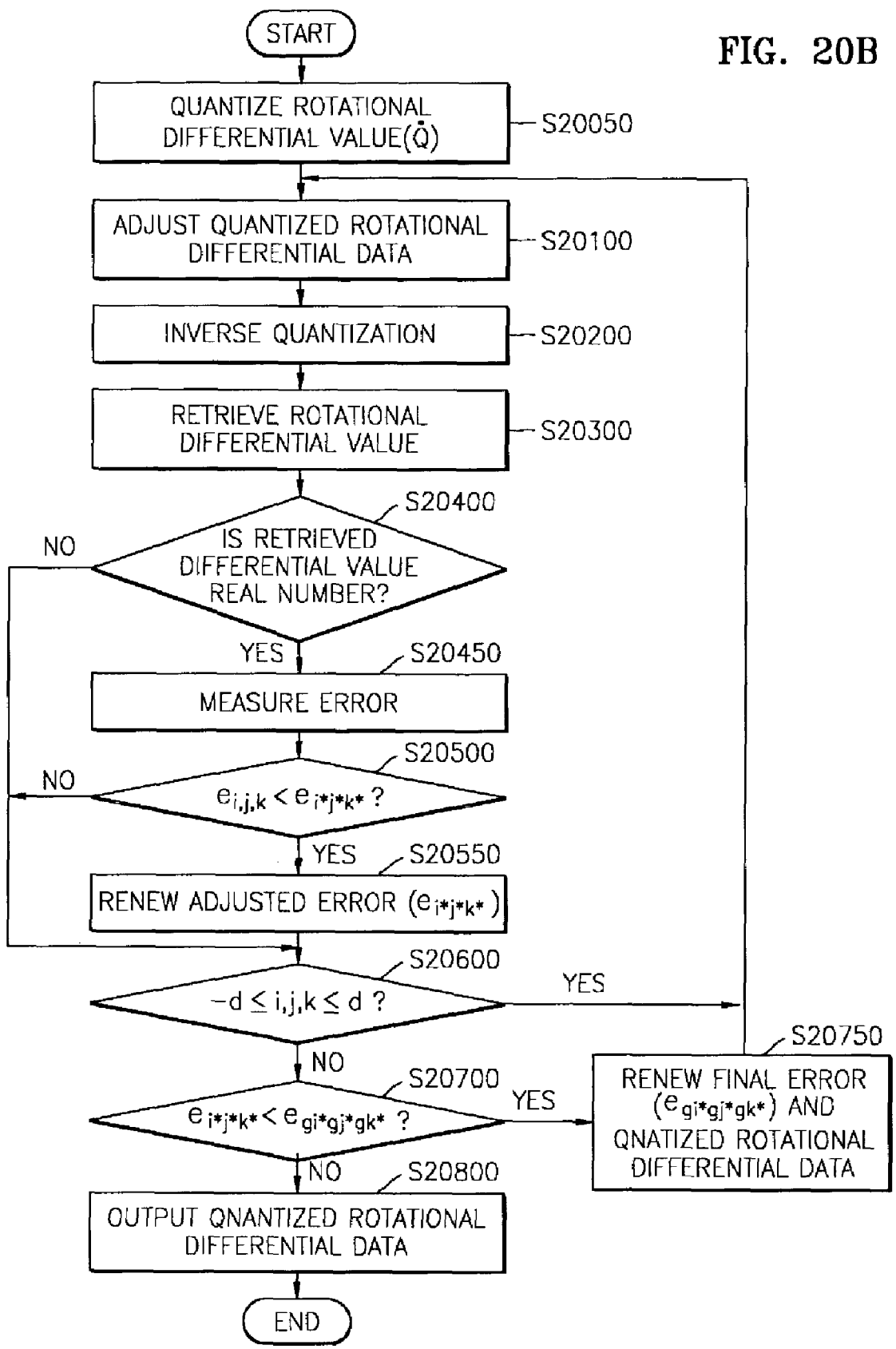
FIG. 20B is a flowchart of the operation of a quantizer according to a third embodiment of the present invention.

FIG. 20B is a flowchart of the operation of the quantizer 2010. Referring to FIG. 20B, when a rotational differential value $\dot{Q}$ is input from a first quaternion multiplier, the quantizer 2010 quantizes the input rotational differential value $\dot{Q}$ using Equation (23) and outputs quantized rotational differential data $\mathbb{Q}$ to the quantization data adjustor 2020 in step S20050.

The quantization data adjustor 2020 adjusts three components of the quantized rotational differential data $\mathbb{Q}$ following Equation (35) in step S20100.

$$I_{ijk} = \tilde{Q} + D_{ijk} D_{ijk} = (i,j,k)^T \ (-d \leq i,j,k \leq d \text{ where } i, j, k, \text{ and } d \text{ are integers}) \quad (35)$$

In Equation (35), i, j, and k are variables, which will be added to rotational differential data so as to adjust the rotational differential data, and d is used to define the range of i, j, and k. The three adjusted components of the quantized rotational differential data $\mathbb{Q}$ are output to the inverse quantizer 2030.

The inverse quantizer 2030 inverse-quantizes adjusted quantized rotational differential data $l_{ijk}$ and outputs inverse-quantized rotational differential value $\hat{l}_{ijk}$ (or the results of the inverse quantization) to the rotational differential value restorer 2040 in step S20200.

The rotational differential value restorer 2040, which receives three components of the inverse-quantized rotational differential value $\hat{l}_{ijk}$, restores a first component of rotational differential data following Equation (24) and outputs a restored rotational differential value to the error measurement unit 2050 in step S20300.

The error measurement unit 2050 checks a first component value of a rotational differential value input thereinto. If the first component value is a real number, the error measurement unit 2050 performs error measurement. On the other hand, if the first component value is an imaginary number, the method moves on to step S20600 in step S20400.

When the first component of the input rotational differential value is a real number, the error measurement unit 2050 measures an error $e_{ijk}$ between an original rotational differential value and a restored rotational differential value in step S20450 and checks if $e_{ijk}$ is smaller than an adjusted error $e_{i^*j^*k^*}$ in step S20500. The method of measuring $e_{ijk}$ between the original rotational differential value and the restored rotational differential value will be described later with reference to FIG. 27.

If the measured error $e_{ijk}$ is smaller than the adjusted error $e_{i^*j^*k^*}$, $e_{ijk}$ replaces $e_{i^*j^*k^*}$ in step S20550 and then it is checked whether or not the variables i, j, and k belong to an adjustment range [−d, +d] in step S20600. If the variables i, j, and k belong to the adjustment range [−d, +d], the error measurement unit 2040 repeatedly performs steps S20100 through S20550. In step S20100 during each cycle of steps S20100 through S20550, 1 is added to second through fourth components of quantized rotational differential data in a nested loop fashion.

For example, a quantized data adjustor 2020 maintains the second and third components, tries to make the restored first component become a real value by adding a value of k to the fourth component value while gradually increasing the value of k by continuously adding 1 to the value of k (−d≦k≦d) before the value of k exceeds +d, and then finds four adjusted component values, which can minimize an error between an input rotational differential value and a restored rotational differential value.

If the value of k reaches +d, the quantized data adjustor 1020, tries to make the restored first component become a real value by initializing the value of k with −d and adding a value of j to the third component value while increasing the value of j by adding 1 to the value of j (−d≦j≦d) and adding a value of k to the fourth component value while gradually increasing the value of k by continuously adding 1 to the value of k (−d≦k≦d) before the value of k exceeds +d, and then finds adjusted four component values, which can minimize an error between an input rotational differential value and a restored rotational differential value.

If the value of j reaches +d, the quantized data adjustor 1020, tries to make the restored first component become a real value by initializing the values of j and k with −d and adding a value of i to the second component value while increasing the value of i by adding 1 to the value of i (−d≦i≦d) and adding a value of j to the third component value and adding a value of k to the fourth component value while gradually increasing the value of k by continuously adding 1 to the value of k (−d≦k ≦d) before the value of k exceeds +d, and then finds adjusted four component values, which can minimize an error between an input rotational differential value and a restored rotational differential value.

It is repeated until all i, j, k reach +d and then finds adjusted four component values, which can minimize an error between an input rotational differential value and a restored rotational differential value.

The error measurement unit 2050 checks if the adjusted error $e_{i^*j^*k^*}$ is smaller than a final error $\dot{e}_{gi^{*hd}\ gj^*gk^*}$ in step S20700 while changing the second through fourth component values. If $e_{i^*j^*k^*}$ is smaller than $\dot{e}_{gi^*gj^*gk^*}$, $e_{i^*j^*k^*}$ replaces $\dot{e}_{gi^*gj^*gk^*}$ and quantized rotational differential data are corrected following Equation (36) in step S20750.

$$\hat{Q}^* = (\tilde{q}_1, \tilde{q}_2, \tilde{q}_3,)^T + (i^*, j^*, k^*)^T \quad (36)$$

Thereafter, the error measurement unit 2050 outputs the corrected rotational differential data to the quantized data adjustor 2020.

The quantized data adjustor 2020 sets the values of the variables i, j, and k to −d and performs steps S20100 through S20600 again on rotational differential data input thereinto. Then, the quantized data adjustor 2020 checks if there exists rotational differential data having a smaller error with the input rotational differential data than a previously stored final error.

If the adjusted error $e_{i^*j^*k^*}$ is not smaller than the final error $\dot{e}_{gi^*gj^*gk^*}$, the error measurement unit 2050 outputs quantized rotational differential data $Q^{g*} = Q^* = (\hat{q}_1^*, \tilde{q}_2^*, \tilde{q}_3^*)^T$ corresponding to the currently stored final error $\dot{e}_{gi^*gj^*gk^*}$ to a circular DPCM operator in step S20800.

Hereinafter, an apparatus and a method for decoding a bitstream, into which an orientation interpolator is encoded, according to a preferred embodiment of the present invention will be described more fully with reference to FIGS. 21A through 25.

Figure 21B:
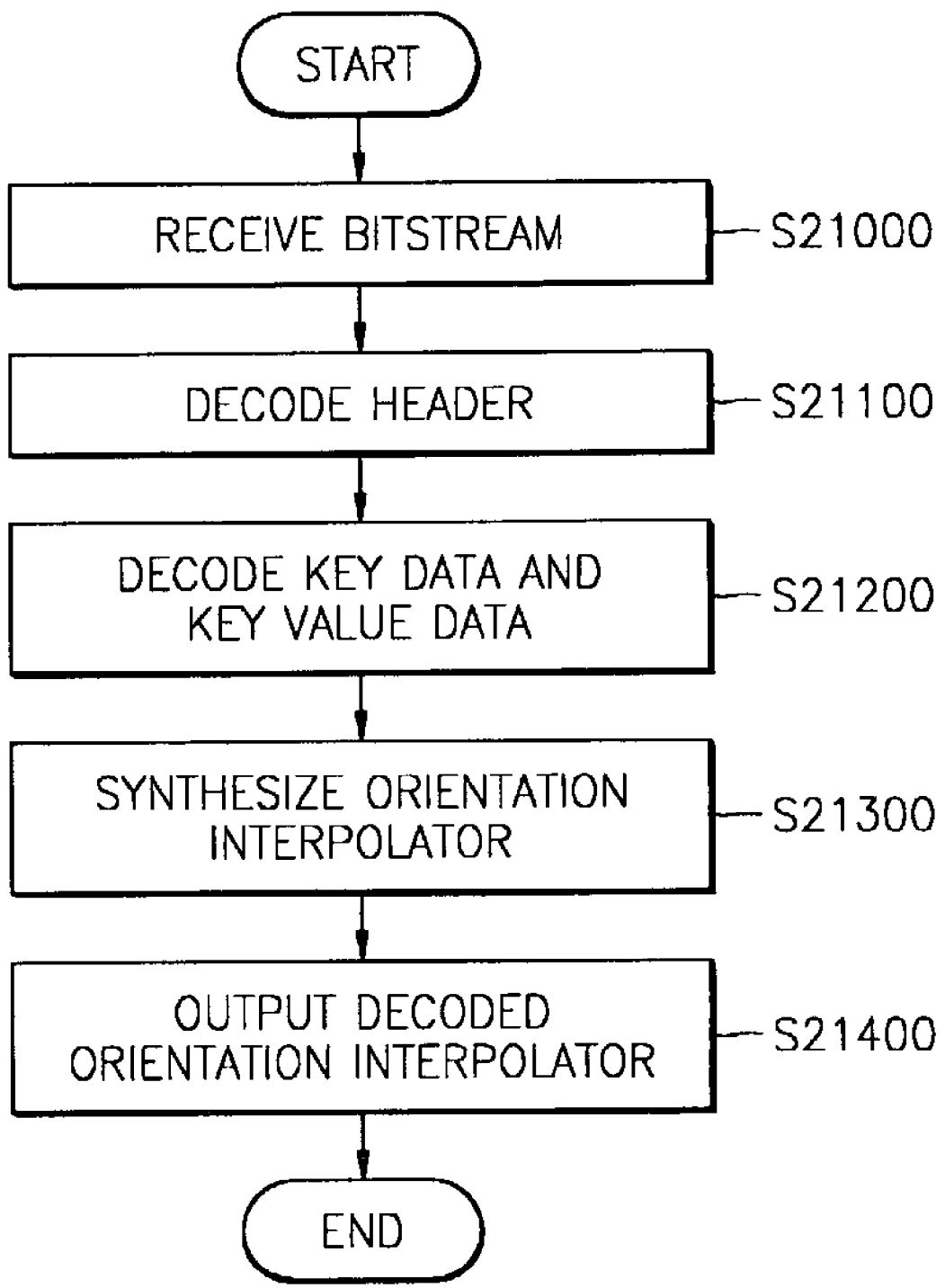
FIG. 21B is a flowchart of a method for decoding an orientation interpolator according to a preferred embodiment of the present invention.

FIG. 21A is a block diagram of an apparatus for decoding an orientation interpolator according to a preferred embodiment of the present invention, and FIG. 21B is a flowchart of a method for encoding an orientation interpolator according to a preferred embodiment of the present invention.

Referring to FIG. 21A, the apparatus for decoding an orientation interpolator includes a key data decoder 2120, which decodes key data from an input bitstream, a key value data decoder 2150, which decodes key value data from the input bitstream, a header decoder 2110, which decodes header information from the input bitstream and outputs the decoded header information to the key data decoder 2120 and the key value data decoder 2150, and an orientation interpolator synthesizer 2180, which synthesizes the decoded key data and the decoded key value data and thus outputs a decoded orientation interpolator.

Referring to FIG. 21B, a bitstream encoded by the apparatus for encoding an orientation interpolator shown in FIG. 3 is input into the key data decoder 2120, the key value data decoder 2150, and the header decoder 2110 in step S21000.

The header decoder 2110 decodes header information from the input bitstream and provides the decoded header information to the key data decoder 2120, the key value data decoder 2150, and the orientation interpolator synthesizer 2180 in step S21100.

The key data decoder 2120 entropy-decodes key data from the input bitstream, generates decoded key data by performing a predetermined inverse DND operation, an inverse folding operation, and an inverse shifting operation, and outputs the decoded key data to the orientation interpolator synthesizer 2180. The key value data decoder 2150 entropy-decodes key value data from the input bitstream, generates a rotational differential value used to rotate an object by as much as a difference between rotational transformations applied to the object by quaternion key value data of each keyframe by inverse-quantizing decoded rotational differential data, restores a rotational transformation value of a current keyframe by quaternion-multiplying a rotational differential value of the current keyframe by a rotational transformation value of a previous keyframe, and outputs the rotational transformation value of the current keyframe to the orientation interpolator synthesizer 2180 in step S21200.

The orientation interpolator synthesizer 2180 restores an orientation interpolator by synthesizing key data and key value data input thereinto following an break point generation mode and a key selection flag, which are input from the header decoder 2110, and outputs the restored orientation interpolator in step S21400.

Hereinafter, a key data decoder 2120 according to a preferred embodiment of the present invention and a method of decoding key data according to a preferred embodiment of the present invention will be described with reference to FIGS. 22 through 23B.

FIG. 22 is a block diagram of the key data decoder 2120. The key data decoder 2120 receives an encoded bitstream and reconstitutes it into key data by decoding.

The key data decoder 2120 includes an entropy decoder 2260, an inverse DND processor 2250, an inverse folding processor 2240, an inverse shifter 2230, an inverse DPCM processor 2220, an inverse quantizer 2210, a linear key decoder 2200, and a floating-point number inverse converter 2205.

Figure 23A:
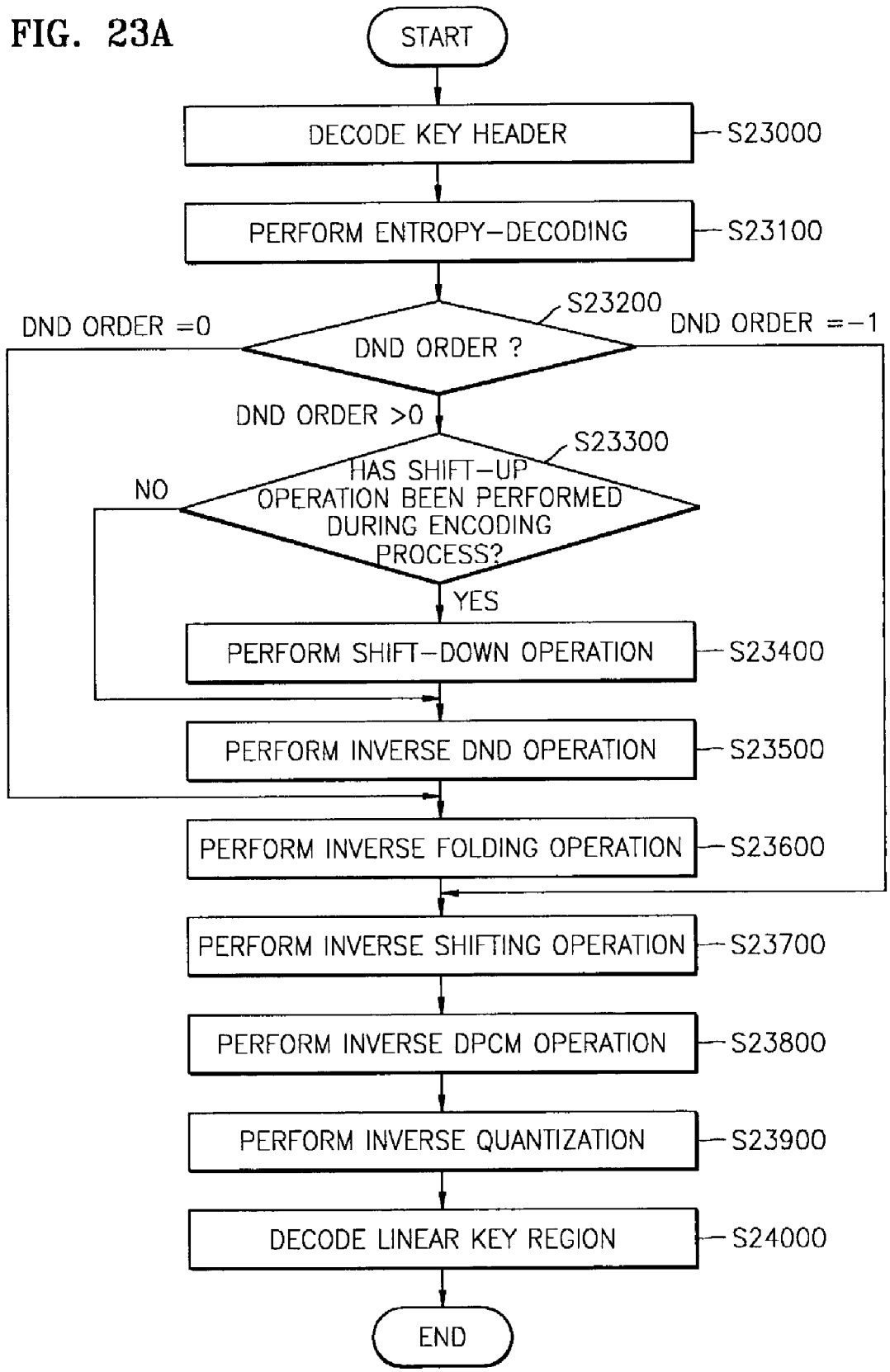
FIGS. 23A and 23B are flowcharts of a method of decoding key data according to a preferred embodiment of the present invention.

FIG. 23A is a flowchart of a method for decoding key data according to a preferred embodiment of the present invention. Referring to FIGS. 22 and 23A, a bitstream, into which key data are compressed, is input into the header decoder 2110 and the entropy decoder 2260.

The header decoder 2110 decodes pieces of information required for each step of decoding and provides them to their corresponding steps of decoding in step S23000. The information decoded by the header decoder 2110 will be described with each decoding step.

The entropy decoder 2260 receives the number of differential data to be decoded and the number of bits that have been used for encoding, i.e., the number of bits to be used for decoding, from the header decoder 2110 and decodes the input bitstream in step S23100. The number of differential data is equal to the result of subtracting the number of intra key data obtained by performing DPCM from the number of key data.

The entropy decoder 2260 identifies if the differential data to be decoded have negative values or positive values based on predetermined information included in the bitstream, for example, bSignedAACFlag in the present embodiment. If the encoded differential data have negative values, the entropy decoder 2260 decodes them using function decodeSignedAAC( ). On the other hand, if the encoded differential data have only positive values, the entropy decoder 2260 decodes them using function decodeUnsignedAAC( ). Thereafter, the decoded differential data are transmitted to the inverse DND processor 2250.

The inverse DND processor 2250 receives the order of DND and a maximum value nKeyMax in each cycle of DND from the header decoder 2110.

If the order of DND is <1, this means that the encoded differential data being decoded have been entropy-decoded going through a DPCM operation and a shifting operation instead of going through DND, and the method directly moves onto a step of performing an inverse shifting operation. If the order of DND is 0, this means that the encoded differential data being decoded have been entropy-decoded going through a folding operation instead of going through DND, and thus the method directly moves onto a step of performing an inverse folding operation. If the order of DND is greater than 0, an inverse DND operation is performed in step S23200.

The inverse DND processor 2250 determines whether or not the encoded differential data being decoded have been encoded going through a shift-up operation in step S23300. In a preferred embodiment of the present invention, it is determined whether or not the encoded differential data being decoded have been encoded going through a shift-up operation by checking whether or not nKeyInvertDown included in a bitstream is greater than 0.

If the encoded differential data being decoded have hot been through a shift-up operation, the method moves onto a step of performing an inverse DND. On the other hand, if the encoded differential data being decoded have been through a shift-up operation, the differential data that have been transferred from a positive number region to a negative number region by performing a shift-up operation are moved back to the negative number region in step S23400. In a preferred embodiment of the present invention, the differential data having been through a shift-up operation are restored by performing a shift-down operation (an invert-down operation) which is expressed by the following equation.

$$\begin{aligned} \text{invert} - \text{down}(v) & & (37) \\ = v & \quad (\text{if } v \leq nKeyInvertDown) \\ = nKeyInvertDown - v & \quad (\text{if } v > nKeyInvertDown) \end{aligned}$$

Here, nKeyInvertDown has the same value as the maximum value nKeyMax used in the shift-up operation. As a result of the shift-down operation, the differential data having a value over nKeyInvertDown are converted into negative values below −1.

An inverse divide-down operation or an inverse divide-up operation is selectively performed on the differential data having been through the shift-down operation depending on the maximum value nKeyMax in each cycle of DND.

Figure 23B:
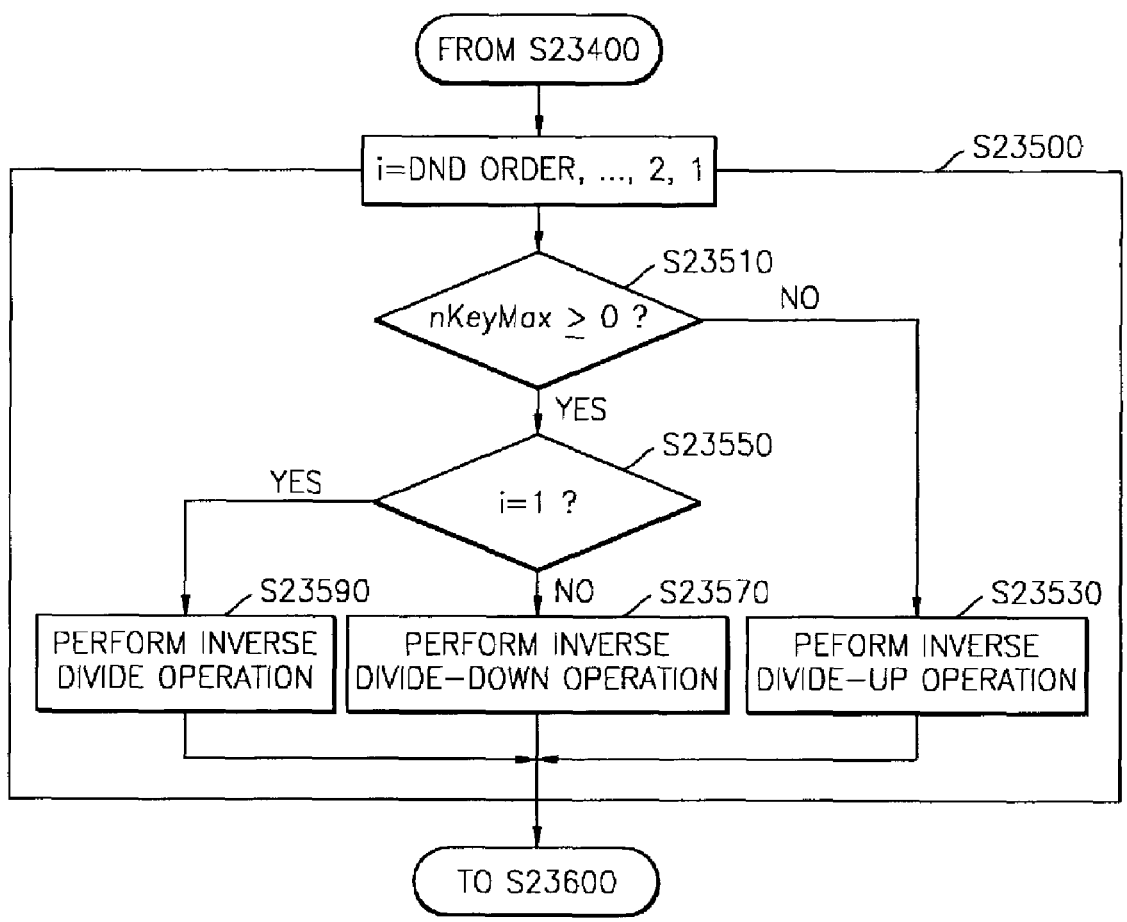

Referring to FIG. 23B, the inverse DND processor 2250 performs an inverse DND operation as many times as the differential data have been through a DND operation during encoding. In other words, the inverse DND processor 2250 sets up an initial value of the order of inverse DND to be equal to the order of DND. Next, the inverse DND processor 2250 subtracts 1 from the initial value of the order of inverse DND every time it performs an inverse DND operation and keeps performing the inverse DND operation until the order of inverse DND becomes 1. The inverse DND processor 2250 searches for nKeyMax in each cycle of DND and checks whether or not each nKeyMax is not smaller than 0 in step S23510.

If nKeyMax is smaller than 0, it means that a divide-up operation has been performed in the process of encoding, and thus the inverse DND processor 2250 extends the range of the differential data being decoded to a negative number region by performing an inverse divide-up operation, in step S23530. In a preferred embodiment of the present invention, an inverse divide-up operation which is defined by Equation (38) may be used.

$$\begin{aligned} \text{inverse} - \text{divide} - \text{up}(v) & & (38) \\ = v & \quad (\text{if } v \geq 0) \\ = (nKeyMax_i - 1) - \frac{v-1}{2} & \quad (\text{if } v < 0, v \bmod 2 \neq 0) \\ = \frac{v}{2} & \quad (\text{if } v < 0, v \bmod 2 = 0) \end{aligned}$$

However, if nKeyMax is not smaller than 0, the inverse DND processor 2250 checks if the order of inverse DND is 1. If the order of inverse DND is not 1, it means that a divide-down operation has been performed on the differential data being decoded in the process of encoding, and thus the inverse DND processor 2250 extends the range of the differential data to a positive number region by performing an inverse divide-down operation, in step S23570.

In a preferred embodiment of the present invention, an inverse divide-down operation which is defined by the following equation may be used.

$$\text{inverse} - \text{divide} - \text{down}(v) \qquad (39)$$
$$= v \qquad (\text{if } v \geq 0)$$
$$= (nKey\text{Max}_i + 1) + \frac{v-1}{2} \qquad (\text{if } v < 0, v \bmod 2 \neq 0)$$
$$= \frac{v}{2} \qquad (\text{if } v < 0, v \bmod 2 = 0)$$

If nKeyMax is not smaller than 0 and the order of inverse DND is 1, the inverse DND processor 2250 completes an entire inverse DND operation after performing an inverse divide operation in step S23590. In a preferred embodiment of the present invention, an inverse divide operation which is defined by Equation (40) may be used.

$$\text{inverse} - \text{divide}(v) \qquad (40)$$
$$= v \qquad (\text{if } v \geq 0)$$
$$= v + (nKey\text{Max}_0 + 1) \qquad (\text{if } v < 0)$$

The differential data of key data which have been through the inverse DND operation are input into the inverse folding processor 2240, and the inverse folding processor 2240 performs an inverse folding operation on the differential data so that the differential data which used to be only in a positive number region are divided into positive values and negative values in step S23600. In a preferred embodiment of the present invention, an inverse folding operation which is defined by Equation (41) may be used.

$$\text{inverse} - \text{fold}(v) = -\frac{(v+1)}{2} \qquad (\text{if } v \bmod 2 \neq 0) \qquad (41)$$
$$= \frac{v}{2} \qquad (\text{if } v \bmod 2 = 0)$$
$$= 0 \qquad (\text{if } v = 0)$$

The differential data which have been through the inverse folding operation are output to the inverse shifter 2230, and the inverse shifter 2230 adds a mode nKeyShift, which has been used in the process of encoding and is input from the header decoder 2110, to the differential data input from the inverse folding processor 2240, in step S23700. This operation is expressed by the following equation.

$$\text{inverse-shift}(v) = v + n\text{KeyShift} \qquad (42)$$

The inverse DPCM processor 2220 restores the differential data input from the inverse shifter 2230 into quantized key data using the order of DPCM input from the header encoder 2110, in step S23800. The inverse shifter 2230 performs an inverse DPCM operation as many times as the order of DPCM following Equation (43).

$$v(i+1) = v(i) + \text{delta}(i) \qquad (43)$$

Here, i indicates an index of differential data and key data, v indicates an array of integers, and delta(i) indicates differential data.

The quantized key data having been through the inverse DPCM operation are input into the inverse quantizer 2210. Then, the inverse quantizer 2210 receives information on whether or not the size nKeyQBit of quantization bits and maximum and minimum values used for inverse quantization are encoded by the floating-point number converter 905 from the header decoder 2110 and converts the quantized key data into inverse-quantized key data in step S23900 using the following equation.

$$\text{inverse} - \text{quantize}(v) = \qquad (44)$$
$$fKey\text{Min} + \frac{v}{2^{nKeyQBit} - 1} \times (fKey\text{Max} - fKey\text{Min})$$

If maximum and minimum values used for quantization have not been converted by the floating-point number converter 905 in the process of encoding key data, fKeyMin and fKeyMax shown in Equation (44) are set to 0 and 1, respectively. However, if the maximum and minimum values used for quantization have been converted by the floating-point number converter 905, maximum and minimum values which are inversely converted by the floating-point number inverse converter 2205 are used as the maximum and minimum values, respectively, for inverse quantization.

An example of program codes into which the inverse DND operation to the inverse quantization are realized will be described later.

The decoded key data output from the inverse quantizer 2210 are added to the key data decoded in the linear key decoder 2200, thus constituting decoded key data.

Hereinafter, a linear key decoding process will be described in the following.

The header decoder 2110 decodes key header information from a bitstream. If information on a linear key data region exists in the bitstream, the header decoder 2110 outputs information required for decoding the beginning and ending keys of the linear key data region to the floating-point number inverse converter 2205 and outputs the number of keys, which are encoded as linear keys, to the linear key decoder 2200.

The floating-point number inverse converter 2205 inversely converts the beginning and ending keys of the linear key data region, which are expressed by decimal numbers, into binary numbers and outputs the binary numbers to the linear key decoder 2200.

Supposing two floating-point numbers to be decoded are referred to as fKeyMin and fKeyMax, a process of decoding fKeyMin is as follows.

The header decoder 2110 reads the number of digits of fKeyMin from a bitstream. If the digit number of fKeyMin is 0, fKeyMin is set to 0, and the number of digits of fKeyMax is read from the bitstream in order to decode fKeyMax. If the digit number of fKeyMax is not smaller than 8, it means that fKeyMax has been encoded following the IEEE Standard 754. Thus, the floating-point number fKeyMax is decoded after 32 bits of it are read.

However, if the digit number of fKeyMax is between 1 and 7, the header decoder 2110 reads a sign bit from the bitstream. In a preferred embodiment of the present invention, if the sign bit is 1, MinKeyMantissaSign is set to −1. On the other hand, if the sign bit is 0, MinKeyMantissaSign is set to 1. Thereafter, the number of bits required for decoding is obtained referring to Table 1 which shows the relationship between the digit number of a mantissa and the number of bits required for encoding. Next, as many bits of the bitstream as the number of bits required for encoding are read and are stored in MinKeyMantissa. Then, next one bit of the bitstream is read and is stored in MinKeyExponentSign in the same way as the sign of the mantissa is stored in MinKeyMantissaSign. Next six bits of the bitstream, which correspond to an exponent value, are read and are stored in nMinKeyExponent.

The floating-point number inverse converter 2205 restores fKeyMin by substituting the value input from the header decoder 2110 into Equation (45).

$$fKeyMin = \frac{MinKeyMantissaSign * nMinKeyMantissa}{10^{MinKeyExponentSign * nMinKeyExponent}} \quad (45)$$

A process of restoring fKeyMax is the same as the process of restoring fKeyMin. In particular, it is determined whether or not the same value as the exponent of fKeyMin is used as the exponent of fKeyMax before reading the exponent of fKeyMax from the bitstream. If the same value as the exponent of fKeyMin is not used as the exponent of fKeyMin, the exponent of fKeyMax is read from the bitstream in the same way the exponent of fKeyMin is read from the bitstream.

The linear key decoder 2200 receives the beginning and ending keys of the linear key data region from the floating-point number inverse converter 2205 and decodes the linear key data region following Equation (46).

$$Key_i = fKeyMin + \frac{(fKeyMax - fKeyMin) * i}{(nNumberOfLinearKey - 1)} \quad (46)$$

$(i = 0, \ldots, nNumberOfLinearKey - 1)$

Here, fKeyMin and fKeyMax indicate the beginning and ending key data, respectively, of the linear key data region.

Key data in the linear key data region decoded using the aforementioned method are added to the key data output from the inverse quantizer 2210, and then the results of the adding are output as final key data.

Hereinafter, an apparatus for decoding an orientation interpolator according to a preferred embodiment of the present invention and a method of encoding key value data according to a preferred embodiment of the present invention will be described with reference to FIGS. 24A through 25.

Figure 24A:
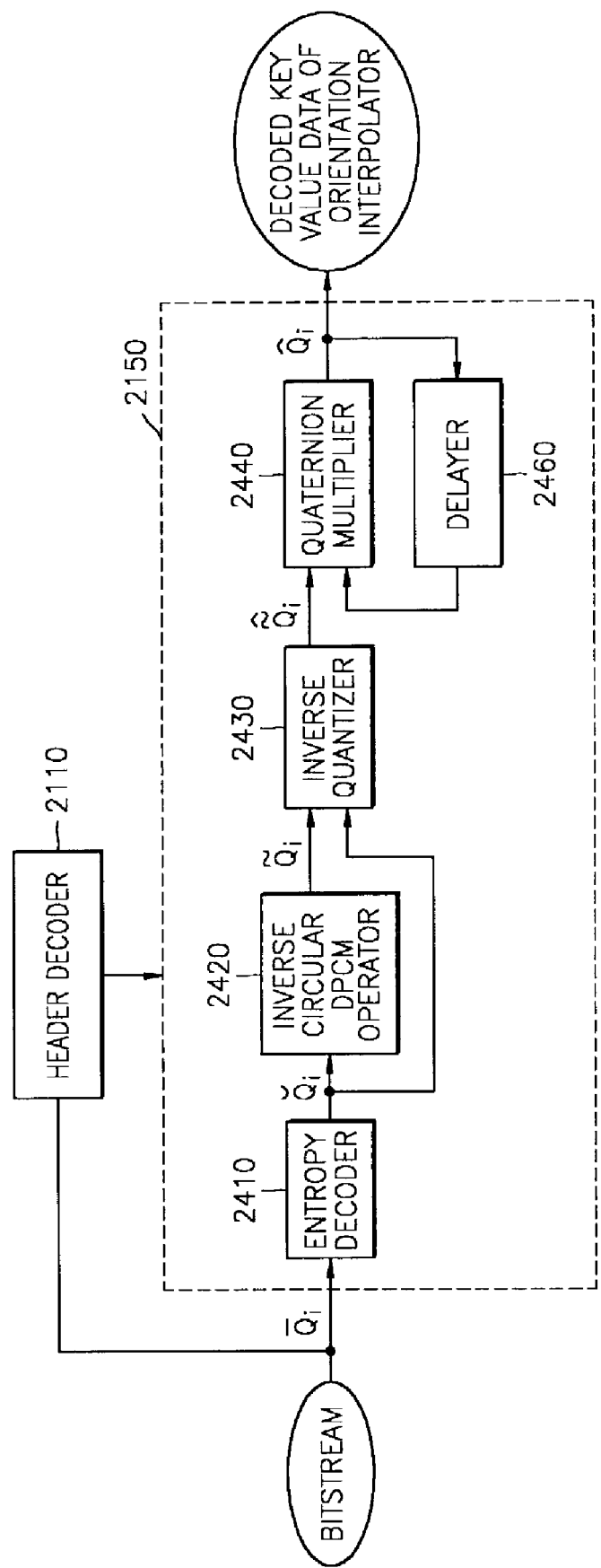
FIG. 24A is a block diagram of a key value data decoder according to a preferred embodiment of the present invention.

FIG. 24A is a block diagram of an apparatus for decoding an orientation interpolator according to a preferred embodiment of the present invention. Referring to FIG. 24A, the apparatus for decoding an orientation interpolator includes a header decoder 2110, which decodes header information required for decoding key value data represented by a quaternion from an input bitstream and provides the decoded header information to a key value data decoder 2150, an entropy decoder 2410, which generates circular-DPCMed rotational differential data or quantized rotational differential data by entropy-decoding entropy-encoded key value data from the input bitstream, an inverse circular DPCM operator 2420, which generates quantized rotational differential data by performing an inverse circular DPCM operation on circular-DPCMed rotational differential data input thereinto, an inverse quantizer 2430, which generates a rotational differential value by inverse-quantizing quantized rotational differential data, and a quaternion multiplier 2440, which generates a rotational transformation value of a current keyframe by quaternion-multiplying a rotational differential value of the current keyframe by a rotational transformation value of a previous keyframe.

Figure 24B:
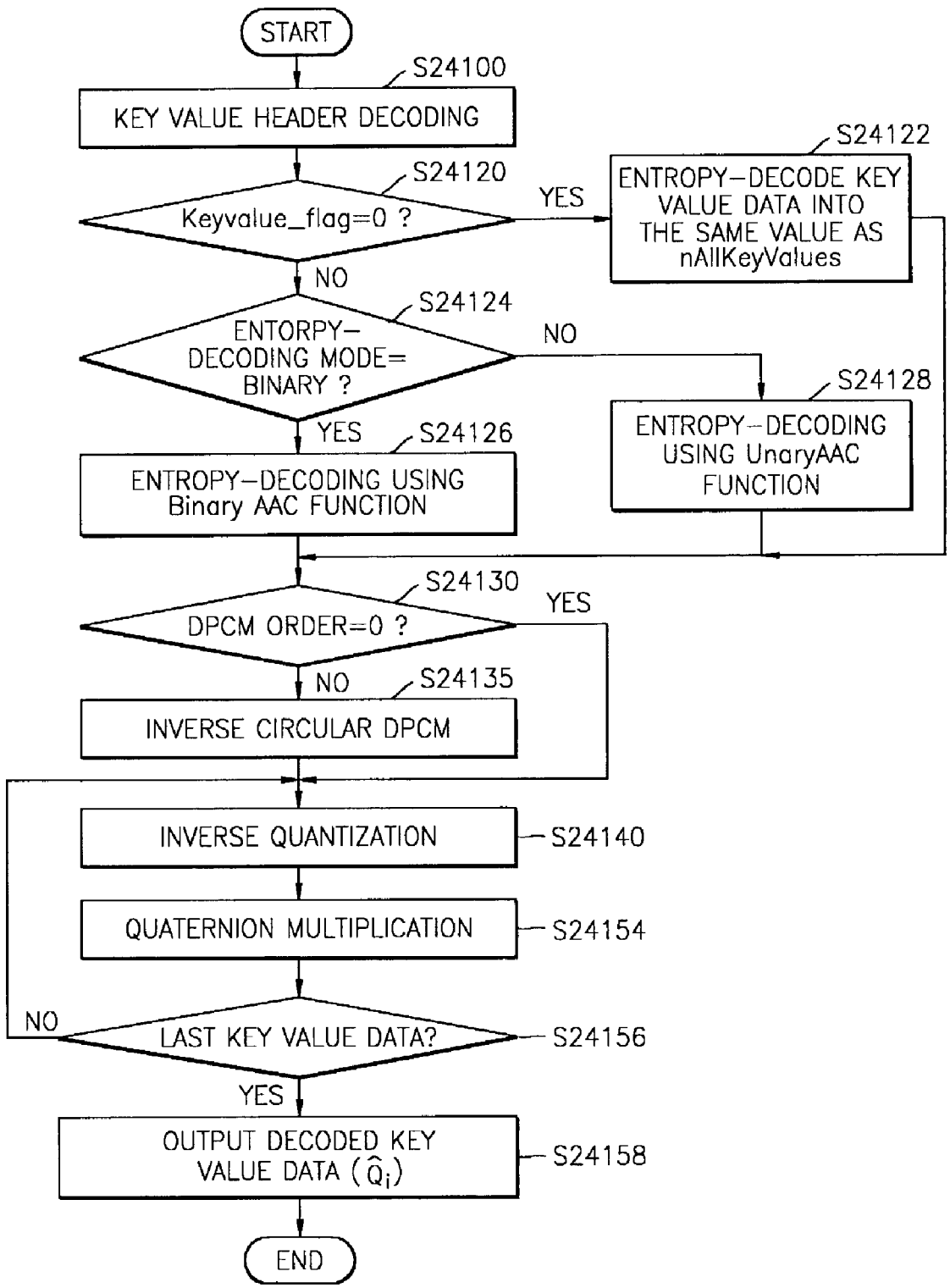
FIG. 24B is a flowchart of a method of encoding key value data according to a preferred embodiment of the present invention.

FIG. 24B is a flowchart of a method for decoding key value data according to a preferred embodiment of the present invention. Referring to FIG. 24B, a bitstream, into which key value data are encoded using the apparatus for encoding an orientation interpolator according to the present invention, is input into the header decoder 2110 and the entropy decoder 2410 of the key value data decoder 2150.

The header decoder 2110 decodes header information required for decoding key value data from the input bitstream and provides the decoded header information to the key value data decoder 2150 in step S24100.

In the header information, first and second intra key value data quantized into quaternions based on the order of DPCM and a plurality of flags used to decode other key value data are encoded.

If the order of DPCM is 1 (for example, if nKVDPC-MOrder, which is one of the plurality of flags, is set to 0), first quantized key value data are included in the header information as intra key value data. If a quaternion value of first inverse-quantized key value data satisfies $\hat{Q}_0 = (\hat{q}_{0,0}, \hat{q}_{0,1}, \hat{q}_{0,2}, \hat{q}_{0,3})^T$, the first inverse-quantized key value data are calculated with Equation (48) below.

$$\hat{q}_{0,0} = \tan\left(\frac{\pi}{4} * \left(\frac{|firstQKV\_S|}{2^{nKVQBit-1} - 1}\right)\right) \quad (48)$$

$$\hat{q}_{0,1} = \tan\left(\frac{\pi}{4} * \left(xSign * \frac{|firstQKV\_X|}{2^{nKVQBit-1} - 1}\right)\right)$$

$$\hat{q}_{0,2} = \tan\left(\frac{\pi}{4} * \left(ySign * \frac{|firstQKV\_Y|}{2^{nKVQBit-1} - 1}\right)\right)$$

$$\hat{q}_{0,3} = \tan\left(\frac{\pi}{4} * \left(zSign * \frac{|firstQKV\_Z|}{2^{nKVQBit-1} - 1}\right)\right)$$

In Equation (48), xSign is 1 only when nFirstXSign in class OriIDPCMKeyValueHeader, which will be described later, is 1 and is −1 under other conditions. ysign and zsign have the same relationships with nFirstYSign and nFirstZSign, respectively, as the relationship between xSign and nFirstXSign.

The restored quaternion component values defined by Equation (48) are converted into angular displacements to be used as an orientation interpolator. Each of the angular displacements restored from the key value data can be expressed by a four-dimensional vector $(\hat{x}_i, \hat{y}_i, \hat{z}_i, \hat{\theta}_i)^T$ where i represents current key data $(\hat{x}_i, \hat{y}_i, \hat{z}_i)$ represents the vector of a rotation axis, and $\hat{\theta}_i$ represents a counterclockwise rotation angle. Accordingly, the restored quaternion component values are converted into angular displacements following Equation (49).

$$\hat{x}_0 = \hat{q}_{0,1} * \frac{1}{\sin\left(\frac{\hat{\theta}_0}{2}\right)} \quad (49)$$

$$\hat{y}_0 = \hat{q}_{0,2} * \frac{1}{\sin\left(\frac{\hat{\theta}_0}{2}\right)}$$

$$\hat{z}_0 = \hat{q}_{0,3} * \frac{1}{\sin\left(\frac{\hat{\theta}_0}{2}\right)}$$

$$\hat{\theta}_0 = \arccos(\hat{q}_{0,0}) * 2$$

If the order of DPCM is 2, for example, if nKVDPC-MOrder is set to 1, first and second quantized key value data are included in the header information. The first quantized key value data are restored in the same way as described above. The second key value data, however, are restored in a different method. In other words, only three components of the second quantized key value data are transmitted along with an encoded bitstream and their values are not intra key value data but differential values ($Q_1=(\tilde{q}_{1,1},\tilde{q}_{1,2}, \tilde{q}_{1,3})$) with the first key value data. Supposing a quaternion representing the second key value data of inverse-quantized key value data satisfies $\hat{Q}_1=(\hat{q}_{1,0}, \hat{q}_{1,1},\hat{q}_{1,2},\hat{q}_{1,0})^T$, $\hat{Q}_1$ is calculated with Equation (50) below.

$$\hat{q}_{1,0} = \sqrt{1-\left(\hat{q}_{1,1}^2+\hat{q}_{1,2}^2+\hat{q}_{1,3}^2\right)}$$

$$\hat{q}_{1,1} = \tan\left(\frac{\pi}{4}*\left(secondXSign*\frac{|secondQKV\_X|}{2^{nKVQBit-1}-1}\right)\right)$$

$$\hat{q}_{1,2} = \tan\left(\frac{\pi}{4}*\left(secondYSign*\frac{|secondQKV\_Y|}{2^{nKVQBit-1}-1}\right)\right)$$

$$\hat{q}_{1,3} = \tan\left(\frac{\pi}{4}*\left(secondZSign*\frac{|secondQKV\_Z|}{2^{nKVQBit-1}-1}\right)\right)$$

(50)

In Equation (50), secondXSign is 1 only when nSecondXSign in class OrilDPCMKeyValueHeader is 1 and is −1 under other conditions. secondYSign and secondZSign have the same relationships with nSecondYSign and nSecondZSign, respectively as the relationship between secondXSign and nSecondXSign. If a quaternion $\hat{Q}_1$ representing second inverse-quantized key value data satisfies $\hat{Q}_1=(\hat{q}_{1,0},\hat{q}_{1,1},\hat{q}_{1,2},\hat{q}_{1,3},)^T$, $\hat{Q}_1$ is calculated by multiplying $\hat{Q}_1$ by $\hat{Q}_0$. In other words, $\hat{Q}_1=\hat{Q}_1\times\hat{Q}_0$.

The header decoder 2110 outputs decoded key value data and decoded header information to the key value decoder 2150.

When the order of DPCM is 1, the number of rotational differential data of each of the components included in the bitstream is N−2 (0, 1, . . . , nNumberOfKeyValue−3).

The entropy decoder 2410 receives x_keyvalue_flag, y_keyvalue_flag, and z_keyvalue_flag from the header decoder 2110 and checks if x_keyvalue_flag, y_keyvalue_flag, and z_keyvalue_flag are each set to 1 in step S24120.

When x_keyvalue_flag, y_keyvalue_flag, and z_keyvalue_flag are each set to 0, it is considered that all quantized key value data or all differential data of each component are the same as nAllKeyValues in class OrilKeyValueCodingBit. Accordingly, the entropy decoder 2410 decodes the key value data of each of the components into the same value as nAllKeyValues input from the header decoder 2110 and outputs the decoded key value data to the inverse circular DPCM operator 2420 in step S24122.

If x_keyvalue_flag, y_keyvalue_flag, and z_keyvalue_flag are not set to 0, for example, if x_keyvalue_flag, y_keyvalue_flag, and z_keyvalue_flag are set to 1, the entropy decoder 2410 checks an entropy decoding mode input from the header decoder 2110 in order to decode each component of input key value data ($\overline{Q}_i=(\overline{q}_{i,1},\overline{q}_{i,2}, \overline{q}_{i,3},)$) in step S24124.

When the entropy decoding mode is a binary decoding mode, the entropy decoder 2410 decodes an adaptive-arithmetically encoded bitstream using a function decodeSignedAAC( ) shown in Table 3 below and outputs quantized rotational differential data to the inverse circular DPCM operator 2420 in step S24126.

TABLE 3

```
void decodeSignedAAC(int *nDeCodedValue, int qstep, QState *signContext, QState
*valueContext) {
    int b;
    b = qstep - 2;
    int msb = 0;
    do {
        qf_decode(&msb, &valueContext[b]);
        msb = msb << b;
        b--;
    } while (msb == 0 && b >=0);
    int sgn = 0;
    int rest = 0;
    if(msb != 0) {
        qf_decode(&sgn, signContext);
        while (b >= 0) {
            int temp = 0;
            qf_decode(&temp, &valueContext[b]);
            rest |= (temp << b);
            b--;
        }
    }
    if(sgn)
        *nDecodedValue = -(msb+rest);
    else
        *nDecodedValue = (msb+rest);
}
```

The entropy decoder 2410 receives a bitstream, into which differential data of key value data are encoded, and entropy-decodes the input bitstream using decoding information decoded by the header decoder 2110 in steps S24120 through S24128.

Figure 25:
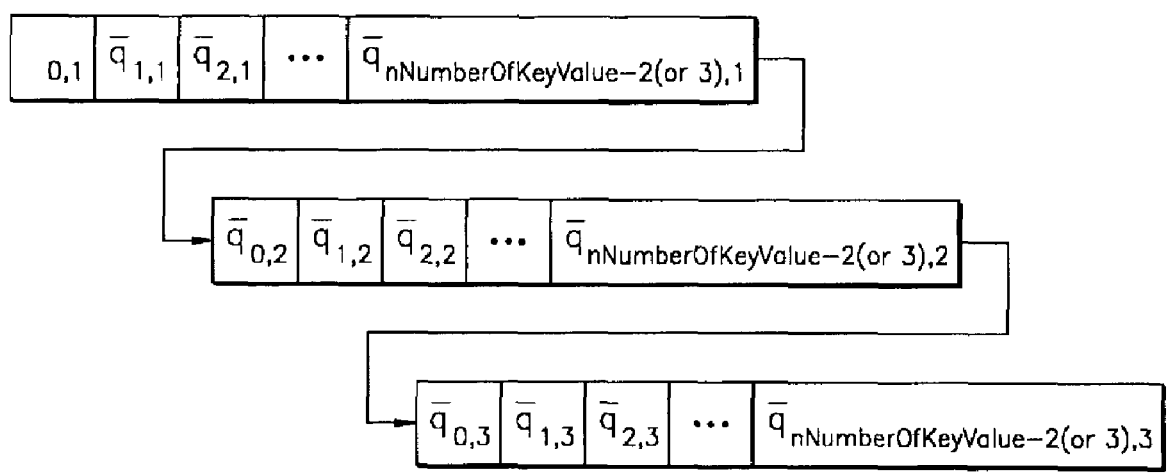
FIG. 25 is a diagram illustrating the structure of a bitstream input into an entropy decoder of a key value data decoder according to a preferred embodiment of the present invention.

FIG. 25 is a diagram illustrating the structure of a bitstream input into the entropy decoder 2410. In FIG. 25, supposing N (nNumberOfKeyValue) represents the number of encoded key value data, the number of rotational differential data of each component included in a bitstream is N−1 (0, 1, . . . , nNumberOfKeyValue−2) when the order of DPCM is 0.

On the other hand, when the entropy decoding mode is not a binary decoding mode, the entropy decoder 2410 decodes the input bitstream using a function decodeUnaryAAC( ) in step S24128. The function decodeUnaryAAC( ) decodes the input bitstream by consecutively reading 0 until 1 is read from the bitstream, converting the number of successive 0s into its absolute value, and reading a bit next to the bit '1', and converting the bit into a sign bit and then outputs quantized rotational differential data to the inverse circular DPCM operator 2420. An example of the function decodeUnaryAAC( ) is shown in Table 4.

TABLE 4

```
void decodeUnaryAAC(int* nDecodedValue, QState* signContext, QState* valueContext)
{
    int nBits = -1;
    bit bBit;
    do {
        qf_decode(&bBit, valueContext);
        nBits++;
    } while(bBit == 0);
    if(nBits != 0) {
        qf_decode(&bBit, signContext);
        if(bBit == 0)
            * nDecodedValue = nBits;
        else
            * nDecodedValue = -nBits;
    }
    else
        * nDecodedValue = 0;
}
```

A function qf_decode( ) adopted in the aforementioned functions decodeSignedAAC( ) and decodeUnaryAAC( ) is used to read the bit 1 from an adaptive-arithmetically encoded bitstream and is defined by a document ISO/IEC 14496-2: 1999 Coding of Audio-Visual Objects: Visual, authorized by the International Standardization Organization.

The inverse circular DPCM operator 2420 receives the entropy-decoded key value data from the entropy decoder 2410 and checks the order of DPCM input from the header decoder 2110. If the order of DPCM is 0, the inverse circular DPCM operator 2420 outputs decoded rotational differential data $Q_{i-2}$ to the inverse quantizer 2430 in step S24130 since the entropy-decoded key value data input from the entropy decoder 2410 are quantized rotational differential data.

On the other hand, if the order of DPCM is 1, the inverse circular DPCM operator 2420 performs an inverse circular DPCM operation in step S24135 since the entropy-decoded key value data input from the entropy decoder 2410 are circular-DPCMed rotational differential data.

Supposing nKVQBit represents inverse quantization bits, the inverse circular DPCM operator 2420 performs an inverse circular DPCM operation on the rotational differential data $Q_{i-2}$ following Equation (51) and generates quantized rotational differential data $Q_{i-2}'$ in step S24135.

$$\check{Q}'_{i-2} = \check{Q}_{i-2} - (2^{nKVQBit} - 1) \text{ (if } \check{Q}_{i-2} \geq 0)$$

$$\check{Q}'_{i-2} = \check{Q}_{i-2} + (2^{nKVQBit} - 1) \text{ (if } \check{Q}_{i-2} \leq 0)$$

$$(i=2, \ldots, n\text{NumberOfKeyValue}-1) \quad (51)$$

Thereafter, the inverse circular DPCM operator 2420 obtains an inverse-DPCMed value A and an inverse-DPCMed value B using $Q_{i-2}$ and $Q_{i-2}'$, respectively, which is shown in Equation (52).

$$A = \check{Q}_{i-2} + \tilde{Q}_{i-1}$$

$$B = \check{Q}'_{i-2} + \tilde{Q}_{i-1}$$

$$(i=2, \ldots, n\text{NumberOfKeyValue}-1) \quad (52)$$

The inverse circular DPCM operator 2420 outputs B as inverse circular DPCMed data $Q_i$ if $B+(2^{nKVQBit-1}-1)$ is between 0 and a maximum value in a quantization range. On the other hand, the inverse circular DPCM operator 2420 outputs A as $Q_i$ if $B+(2^{nKVQBit-1}-1)$ is smaller than 0 or greater than the maximum value in the quantization range.

An example of C++ program codes, into which the aforementioned operation of the inverse circular DPCM operator 2420 is written, is shown in Table 5.

TABLE 5

```
ICDPCM(int* curIDPCMKeyValue, int deltaKeyValue, int prevICDPCMKeyValue)
{
    int circularDelta;
    int tempIDPCMKeyValue;
    prevICDPCMKeyValue += ((1 << (nKVQBit-1))-1);
    if(deltaKeyValue >= 0.0)
        circularDelta = deltaKeyValue - ((1 << nKVQBit)-1);
    else
        circularDelta = deltaKeyValue + ((1 << nKVQBit)-1);
    tempIDPCMKeyValue = circularDelta + prevICDPCMKeyValue;
    if((tempIDPCMKeyValue >= 0.0) && (tempIDPCMKeyValue < ((1 << nKVQBit)-1)))
        *curIDPCMKeyValue = tempIDPCMKeyValue;
    else
        *curIDPCMKeyValue = deltaKeyValue + prevICDPCMKeyValue;
    *curIDPCMKeyValue -= ((1 << (nKVQBit-1))-1);
}
```

The inverse quantizer 2430 receives the quantized rotational differential data $(\tilde{Q}_i = (\tilde{q}_{i,1}, \tilde{q}_{i,2}, \tilde{q}_{i,3}))$ generated by the inverse circular DPCM operator 2420 performing an inverse circular DPCM operation, restores a rotational differential value $(\hat{Q}_i = (\hat{q}_{i,0}, \hat{q}_{i,1}, \hat{q}_{i,2}, \hat{q}_{i,3})^T)$ by performing an inverse quantization operation on $\tilde{Q}_i$ following Equation (53), and outputs the rotational differential value $\hat{Q}_i$ to the quaternion multiplier 2440 in step S24140.

$$\hat{\tilde{q}}_{i,0} = \sqrt{1 - \left(\hat{\tilde{q}}_{i,1}^2 + \hat{\tilde{q}}_{i,2}^2 + \hat{\tilde{q}}_{i,3}^2\right)} \quad (53)$$

$$\hat{\tilde{q}}_{i,j} = \tan\left(\frac{\pi}{4} * \left(sgn(\tilde{q}_{i,j}) * \frac{|\tilde{q}_{i,j}|}{2^{nKVQBit-1} - 1}\right)\right)$$

$$(i = 2, \ldots, nNumberOfKeyValue - 1, \; j = 1, 2, 3)$$

Thereafter, the quaternion multiplier 2440 receives the rotational differential value $\hat{Q}_i$. The quaternion multiplier 2440 restores a rotational transformation value $\hat{Q}_i$ (where $\hat{Q}_i = (\hat{q}_{i,0}, \hat{q}_{i,1}, \hat{q}_{i,2}, \hat{q}_{i,3})^T$) of a current keyframe in step S24154 by quaternion-multiplying the input rotational differential value $\hat{Q}_i$ by a rotational transformation value $\hat{Q}_{i-1}$ of a previous keyframe following Equation (54).

$$\hat{Q}_i = \hat{Q}_i \times \hat{Q}_{i-1}$$

$$(i=2, \ldots, nNumberOfKeyValue-1) \quad (54)$$

After restoring a rotational transformation value, the key value data decoder 2400 checks if the restored rotational transformation value corresponds to last key value data in step S24156. If the restored rotational transformation value does not correspond to the last key value data, the key value data decoder 2400 repeatedly performs steps S24140 through S24154. On the other hand, if the restored rotational transformation value is the last key value data's, the key value data decoder 2400 outputs the restored rotational transformation value in step S24158.

If the order of DPCM is 0, the inverse circular DPCM operator 2420 outputs the decoded quantized rotational differential data $Q_i$ (where $Q_i = (\check{q}_{i,1}, \check{q}_{1,2}, \check{q}_{i,3})$) to the inverse quantizer 2430. Then, the inverse quantizer 2430 generates a rotational differential value $\hat{Q}_i$ (where $\hat{Q}_i = (\hat{q}_{i,0}, \hat{q}_{i,1}, \hat{q}_{i,2}, \hat{q}_{i,3})^T$) by inverse-quantizing the rotational differential data $Q_i$ input from the inverse circular DPCM operator 2420 and outputs $\hat{Q}_i$ to the quaternion multiplier 2440 in step S24140.

$$\hat{\tilde{q}}_{i,0} = \sqrt{1 - \left(\hat{\tilde{q}}_{i,1}^2 + \hat{\tilde{q}}_{i,2}^2 + \hat{\tilde{q}}_{i,3}^2\right)} \quad (55)$$

$$\hat{\tilde{q}}_{i,j} = \tan\left(\frac{\pi}{4} * \left(sgn(\tilde{q}_{i,j}) * \frac{|\tilde{q}_{i,j}|}{2^{nKVQBit-1} - 1}\right)\right)$$

$$(i = 1, \ldots, nNumberOfKeyValue - 1, \; j = 1, 2, 3)$$

Even when the order of DPCM is 0, the quaternion multiplier 2440 restores rotational transformation values in almost the same way (steps S24150 through S24158) as it does when the order of DPCM is not 0. When the order of DPCM is 0, the quaternion multiplier 2440 performs quaternion multiplication following Equation (56).

$$\hat{Q}_i = \hat{Q}_i \times \hat{Q}_{i-1}$$

$$(i=1, \ldots, nNumberOfKeyValue-1) \quad (56)$$

Hereinafter, the operation of the orientation interpolator synthesizer 2180 will be described below.

Figure 26:
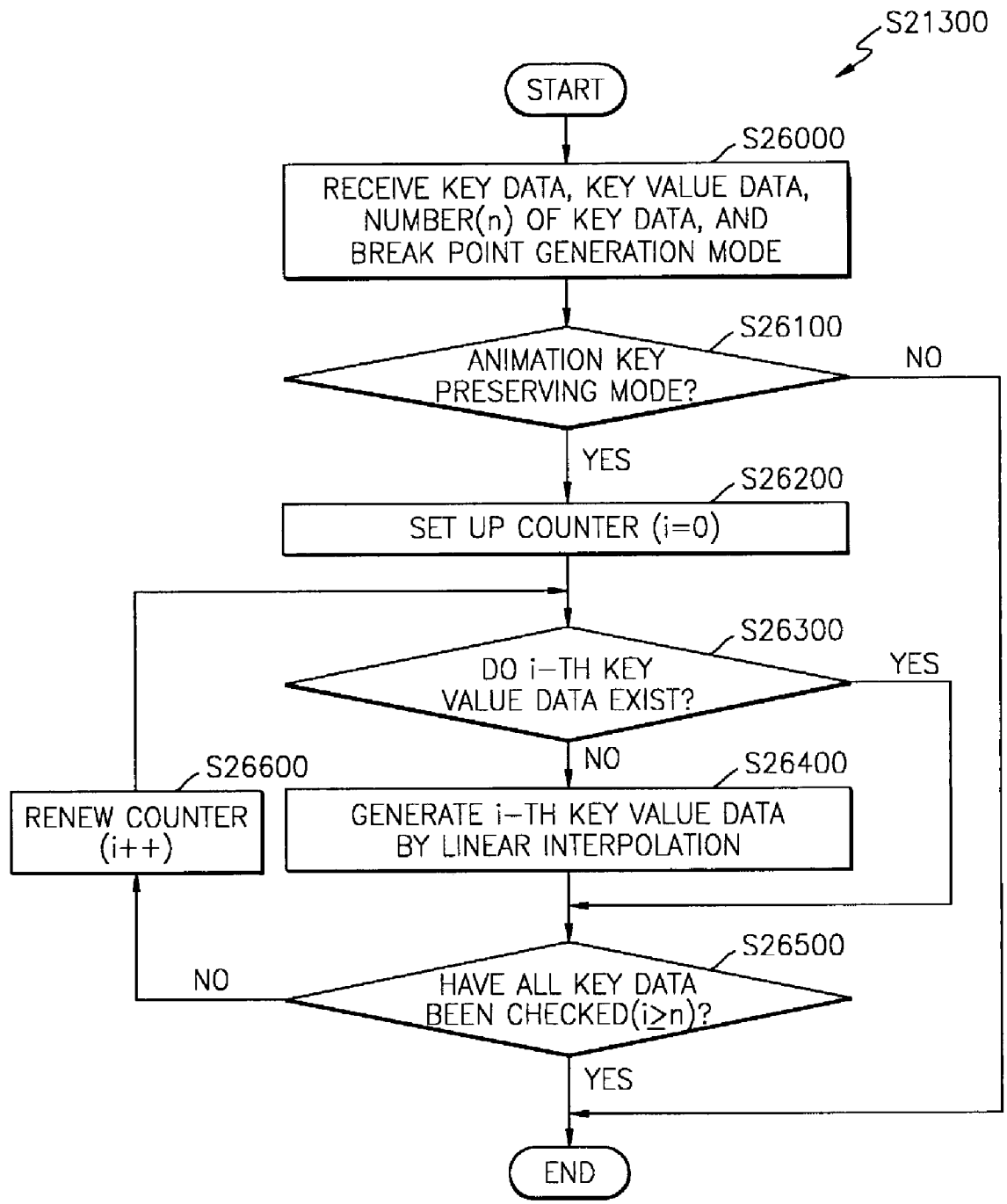
FIG. 26 is a flowchart of a method of synthesizing key data and key value data of an orientation interpolator according to a preferred embodiment of the present invention.

FIG. 26 is a flowchart of the operation of the orientation interpolator synthesizer 2180. Referring to FIG. 26, the orientation interpolator synthesizer 2180 receives decoded key data and decoded key value data and receives the number of key data and an break point generation mode and key selection flags from the header decoder 2110 in step S26000.

The orientation interpolator synthesizer 2180 outputs the decoded key data and the decoded key value data in step S26100 when the break point generation mode is an animation path-preserving mode. In a case where break points have been extracted in an animation-path preserving mode, key data correspond to key value data, and thus there is no need to generate new key value data using interpolation. However, if the break points have been extracted in an animation key-preserving mode, it means only key value data corresponding to the break points have been encoded while all key data have been encoded and decoded. Accordingly, in this case, the key data do not correspond to the key value data, and thus it is necessary to interpolate key value data, which will be described in the following paragraphs.

When the break point generation mode is an animation key preserving mode, a counter, which indicates an index of the array of key selection flags, is set up so as to correspond to key data in step S26200, in order to figure out whether or not key value data corresponding to the key data exist.

The orientation interpolator synthesizer 2180 checks if key value data corresponding to the key data indicated by the counter exist and goes to step S26500 in step S26300.

If there is no key value data corresponding to the key data indicated by the counter, the orientation interpolator synthesizer 2180 generates key value data in step S26400 by linearly interpolating current key value data using key value data corresponding to key data indicated by two successive break points including one prior to the key data indicated by the counter and the other next to the key data indicated by the counter.

Thereafter, the orientation interpolator synthesizer 2180 checks if all the key value data have their corresponding key value data and linear interpolation has been performed on all the key data not having their corresponding key value data in step S26500. If there still exists key data, which have not been checked, the orientation interpolator synthesizer 2180 renews the counter and performs steps 26300 through S26500 again. If all the key data have been checked, the orientation interpolator synthesizer 2180 outputs synthesized key data and synthesized key value data as an orientation interpolator in step S26600.

Hereinafter, examples of SDL-language program codes, by which the apparatus for decoding an orientation interpolator according to the present invention, which decodes key data and key value data, is realized, will be described below.

FIG. 29A is a diagram illustrating a class CompressedOrientationInterpolator. CompressedOrientationInterpolator is a top class used for reading an encoded bitstream of an orientation interpolator. KeyHeader, KeySelectionFlag, and Key are classes for reading, from a bitstream, key data information corresponding to key field data in a conventional orientation. OriIKeyValueHeader and OriIDPCMKeyValue are classes for reading information on key value data corresponding to key value field data in the conventional orientation interpolator. A function qf_start( ) is used to initialize an arithmetic decoder before reading a bitstream, into which key value data are encoded, using adaptive arithmetic coding (AAC).

FIG. 29B is a diagram illustrating a key header class for decoding a key header required for decoding.

The key header class includes the number of key data, quantization bits, intra key data, a DND header and the number of bits actually used for decoding. nKeyQBit represents quantization bits used in inverse quantization to restore floating-point key values. nNumKeyCodingBit indicates a bit size of nNumberOfKey representing the number of key data.

nKeyDigit indicates a number of most significant digits of original key data and is used to round off decoded values.

When information on linear key sub-regions is included in a key header, a flag bisLinearKeySubRegion is set to 1. In this case, keys included in specific linear key sub-regions within an entire key region can be calculated using decoded header information following a flag blsLinearKeySubRegion. bRangeFlag indicates whether or not key data ranges from 0 to 1. If key data does not range from 0 to 1, minimum and maximum values within the key data range are decoded from a class KeyMinMax class. KeyMinMax retrieves the minimum and maximum values required for inverse quantization. Each of the aforementioned values can be divided into their respective mantissas and exponents.

nBitSize is a bit size of nQIntraKey, and nKeyShift is an initial bit size of nKeyMax. nQIntraKey indicates the magnitude of first quantized intra data and is combined with nQIntraKeySign indicating a sign of nQIntraKey. nQIntraKey is used as a base required for restoring other quantized key data. In all sign bits used in interpolator compression, a value '0' denotes a positive sign, and a value '1' denotes a negative sign. nKDPCMOrder indicates a value, which is the order of DPCM minus 1. The order of DPCM may be 1, 2, or 3. The number of quantized intra data is the same as the order of DPCM.

nKeyShift, together with a sign bit nKeyShiftSign, is an integer indicating the amount of shift in a key data decoder. nKeyShift and nKeyShiftSign are decoded if bShiftFlag is set as 'true'. nDNDOrder is the order of divide-and-divide (DND) operation. The DND operation has been described above with a key data decoder. If the value of nDNDOrder is 7, then bNoDND is decoded. bNoDND indicates whether or not an inverse DND operation will be performed. nKeyMax is a maximum value or a minimum value used during successive cycles of an inverse DND operation. nKeyCodingBit indicates bits used for encoding key data.

bSignedAACFlag indicates a decoding process to be performed during AAC decoding. If bSigneAACFlag is set to 0, an unsigned AAC decoding process will be performed. Otherwise, a signed AAC decoding process will be performed. bKeyInvertDownFlag is a Boolean value indicating whether or not nKeyInvertDown will be used. nKeyInvertDown is an integer used to convert all quantized key data of greater than itself into negative values of no greater than −1. If nKeyInvertDown is set to −1, then a shift-down operation will not be performed.

FIG. 29C is a diagram illustrating a class LinearKey. In FIG. 20C, nNumLinearKeyCodingBit is a value indicating the number of bits necessary to encode a predetermined number of linearly predictable keys. nNumberOfLinearKey is a value indicating the number of linearly predictable keys.

FIG. 29D is a diagram illustrating a class KeyMinMax. In FIG. 29D, bMinKeyDigitSame is a flag indicating if the number (nKeyDigit) of most significant digits of all keys and the number of most significant digits of a minimum value among the keys are the same. nMinKeyDigit is a value indicating the number of most significant digits of the minimum value among the keys. nMinKeyMantissaSign is a value indicating a sign of nMinKeyMantissa. nMinKeyMantissa is a value indicating the mantissa of the minimum value among the keys. nMinKeyExponentSign is a value indicating a sign of nMinKeyExponent.

nMinKeyExponent is a value indicating the exponent of the minimum value among the keys.

fKeyMin is a value indicating the minimum value among the keys. bMaxKeyDigitSame is a flag indicating if the number nKeyDigit of most significant digits of all the keys and the number of most significant digits of a maximum value among the keys are the same. nMaxKeyDigit is a value indicating the number of most significant digits of the maximum value among the keys. nMaxKeyMantissaSign is a value indicating a sign of nMaxKeyMantissa. nMaxKeyMantissa is a value indicating the mantissa of the maximum value among the keys.

bSameExponent is a flag indicating if the exponent of the maximum value among the keys is the same as nMinKeyExponent. nMaxKeyExponentSign is a value indicating a sign of nMaxKeyExponent. nMaxKeyExponent is a value indicating the exponent of the maximum value among the keys. FKeyMax is a value indicating the maximum value among the keys.

FIG. 29E is a diagram illustrating a class OriIKeyValueHeader. The meaning of each variable used in this class is as follows. bPreserveKey indicates whether or a current decoding mode is an animation key preserving mode or an animation path preserving mode. When bPreserveKey is set as 'true', the current decoding mode is an animation key preserving mode.

nKVQBit represents an inverse quantization bit size of key value data. nKVDPCMOrder represents the order of inverse DPCM operation used for decoding key value data. When nKVDPCMOrder=0, an inverse circular DPCM operation does not need to be performed. On the other hand, when nKVDPCMOrder=1, an inverse circular DPCM operation having an order of 2 is supposed to be performed.

FIG. 29F is a diagram illustrating a class OriDPCMKeyValueHeader. The meaning of each variable used in this class is as follows. firstQKV_S, firstQKV_X, firstQKV_Y, and firstQKV_Z represent first values of four components s, x, y, and z, respectively, constituting a quaternion (s, x, y, z) representing quantized key value data. nFirstXSign, nFirstYSign, and nFirstZSign represent signs of firstQKV_X, firstQKV_Y, and firstQKV_Z, respectively. secondQKV_X, secondQKV_Y, and second QKV_Z represent second values of the three components x, y, and z, respectively, and nSecondXSign, nSecondYSign, and nSecondZSign represent signs of secondQKV_X, secondQKV_Y, and second QKV_Z, respectively. blsMoreTwoKVs indicates if there are more than two key value data to be decoded when an inverse circular DPCM is supposed to be performed. x_keyvalue_flag, y_keyvalue_flag, and z_keyvalue_flag indicate if all quantized values of each of the components x, y, and z, respectively, are the same.

FIG. 29G is a diagram illustrating a class OriIKeyValueCodingBit. The meaning of each variable used in this class is as follows. nKVCodingBit represents the number of bits used to store each component of all quaternion key value data except for intra key value data (firstQKV_S, firstQKV_X, firstQKV_Y, firstQKV_Z, second QKV_X, secondQKV_Y, and secondQKV_Z in the class OriIDPCMKeyValueHeader) after quantization.

nAllKeyValue represents a quantized value of each component of all key value data when keyvalue_flag for each of the components is set to 0. nSign represents the sign of nAllKeyValue. blsUnaryAAC represents an adaptive-arithmetic quantization method used for decoding quantized values of each of the components x, y, and z. If blsUnaryAAC is set as 'true', an unary AAC decoding function will be used. On the other hand, if blsUnaryAAC is set as 'false', a binaryAAC decoding function will be used.

FIG. 29H is a diagram illustrating a class KeySelectionFlag. In the class KeySelectionFlag, keyFlag indicates whether or not i-th key data have been encoded. nNumOfKeyValue is an integer indicating the number of key value data to be decoded.

FIG. 29I is a diagram illustrating a class Key. In the class Key, nQKey is an array of quantized key data decoded from a bitstream. KeyContext is a context for reading a magnitude of nQKey. KeySignContext is a context for reading a sign of nQKey.

DecodeUnsignedAAC is a function used to perform an unsigned decoding process of adaptive arithmetic coding with a given context, which will be described below. DecodeSignedAAC is a function used to perform a signed decoding process of adaptive arithmetic coding with a given context, which will be described below.

FIG. 29J is a diagram illustrating a class OrilDPCMKeyValue. The meaning of each value used in this class is as follows. DeltaKeyValue is used to store quantized key value data including the three components x, y, and z in the form of quaternion. The quantized key value data stored in DeltaKeyValue are decoded from a bitstream using a function decodeUnaryAAc or decodeSignedAAC.

kVXSignContext, kVYSignContext, and kVZSignContext are contexts used for decoding the three components x, y, and z of DeltaKeyValue using the function decodeUnaryMC or DecodeSignedAAC.

kVXUnaryContext, kVYUnaryContext, and kVZUnaryContext are contexts used for decoding the three components x, y, and z of DeltaKeyValue using the function decodeUnaryAAC.

kVXContext, kVYContext, and kVZContext are contexts used for decoding the three components x, y, and z of DeltaKeyValue using the function decodeSignedAAC.

Hereinafter, a method of measuring an error between an original rotational differential value and a rotational differential value restored by inverse-quantizing a quantized rotational differential value in the error calculator 42b, 46b, and 48b included in the break point extractor 42, 46, and 48 shown in FIGS. 4A through 4C, respectively, and a method of measuring an error between an original rotational differential value and a rotational differential value restored by inverse-quantizing a quantized rotational differential value, which is performed in the error measurement unit 2050 included in the quantizer 2000 according to the third embodiment of the present invention will be described.

The method of measuring an error between an original rotational differential value and a restored rotational differential value according to the present invention can also be used to measure an error between an original orientation interpolator before encoding and an orientation interpolator generated by decoding an encoded orientation interpolator. Accordingly, an animation path of an orientation interpolator, from which break points will be extracted by the break point extractor 42, 46, or 48, and the original rotational differential value used in the error measurement unit 2050 will be described as corresponding to an orientation interpolator before encoding. Likewise, an animation path of an orientation interpolator constituted by the extracted break points and the restored rotational differential value used in the error measurement unit 2050 will be described as corresponding to key value data of the decoded orientation interpolator.

In the process of encoding an orientation interpolator, an error occurs between an original orientation interpolator and a restored orientation interpolator during quantization. Here, the error between the original orientation interpolator and the restored orientation interpolator is defined by a difference in angles between original rotational transformation and restored rotational transformation.

In other words, supposing that one key value datum included in an orientation interpolator node and its restored key value datum in a decoder are referred to as $(\vec{r}, \theta)$ and $(\vec{r}, \hat{\theta})$, respectively, where $\vec{r}$ represents a rotation axis, and $\theta$ represents a rotation angle and satisfies $\theta \in [-\pi, \pi]$ and that an object in a three-dimensional space is moved from an arbitrary position $\vec{x}$ to an arbitrary position $\vec{y}$ and from $\vec{y}$ to an arbitrary position $\hat{\vec{y}}$ based on $(\vec{r}, \theta)$ and $(\vec{r}, \hat{\theta})$, respectively, by rotation transformation, a quantization error is the difference between $\vec{y}$ and $\hat{\vec{y}}$ and satisfies $\vec{e}(\vec{x}) = \vec{y} - \hat{\vec{y}}$. $\vec{x}$, $\vec{y}$, and $\hat{\vec{y}}$ represented in the form of quaterion are shown in Equation (57)

$$X = (0, \vec{x}), Y = (0, \vec{y}), \hat{Y} = (0, \hat{\vec{y}}) \tag{33}$$

When quaternions representing $(\vec{r}, \theta)$ and $(\vec{r}, \hat{\theta})$ are referred to as $Q$ and $\hat{Q}$, the following equations can be derived.

$$Y = Q \times X \times Q^*$$

$$X = Q^* \times Y \times Q \tag{58}$$

Here, $A \times B$ represents quaternion multiplication, and $A^*$ represents a conjugate of A. Based on Equations (57) and (58), the following equation can be derived.

$$\hat{Y} = \hat{Q} \times X \times \hat{Q}^* = \hat{Q} \times Q^* \times Y \times Q \times \hat{Q}^* = Q_{error} \times Y \times Q^*_{error} \times Y \times Q^*_{error} \tag{59}$$

Here, $Q_{error}$ is a value representing the relationship between $\vec{y}$ and $\hat{\vec{y}}$ in terms of rotation transformation and is defined by the following equation.

$$Q_{error} = \hat{Q} \times Q^* \tag{60}$$

When a differential rotation angle between $\vec{y}$ and $\hat{\vec{y}}$ is referred to as $\theta_{error}$, $\theta_{error}$ can be obtained using a quaternion transformation formula and Equation (61).

$$\theta_{error} = 2 \cos^{-1} q_{0,error}, 2 \cos^{-1} (\hat{Q} \cdot Q) \; \theta_{error} \in [0, \pi] \tag{61}$$

Here, · represents an inner product operation. Equation (61) defines an instantaneous quantization error occurring among all animation keyframes at a predetermined moment of time, and accordingly, the error measurement unit 2050 included in the quantizer 2000 according to the third embodiment of the present invention calculates an error between an original orientation interpolator and a restored orientation interpolator with Equation (61).

In addition, an instantaneous quantization error at a predetermined moment of time (t) can be defined by the following equation in order to derive a formula for obtaining a quantization error in an entire animation interval from Equation (62).

$$e(t) = 2 \arccos \{Q(t) \cdot \hat{Q}(t)\} \tag{62}$$

An average error $E_m$ and a maximum error $E_p$ can be derived by extensively applying Equation (62) to the entire keyframe interval, during which an animation is being performed using an orientation interpolator.

Figure 27:
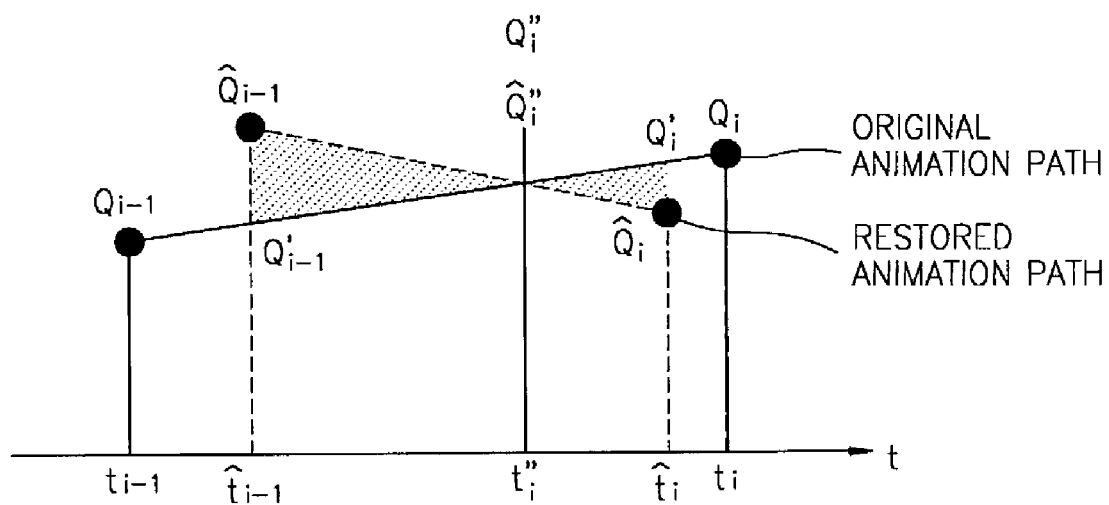
FIG. 27 is a diagram illustrating an example of a method of calculating an error between an orientation interpolator to be encoded and a decoded orientation interpolator.

Here, in order to obtain the average error $E_m$, the partial sum $E_m^i$ of errors in an interval $[t_{i-1}, t_i]$ must be obtained first, as shown in FIG. 27. Hereinafter, predetermined moments of time when decoded key data corresponding to original key data at predetermined moments of time $t_{i-1}$ and $t_i$ exist will be respectively referred to as $\hat{t}_{i-1}$ and $\hat{t}_i$, and decoded key value data corresponding to original key value data $Q_{i-1}$ and $Q_i$ will be referred to as $\hat{Q}_{i-1}$ and $\hat{Q}_i$, respectively.

Due to noise generated during encoding key data, it is impossible to directly calculate an error between an original animation path $Q_i'$ of an original orientation interpolator and an animation path $\hat{Q}_i'$ of a decoded orientation interpolator, as shown in FIG. 27. Accordingly, the interval $[t_{i-1}, t_i]$ must be divided into three sub-intervals $[t_{i-1}, \hat{t}_{i-1}]$, $[\hat{t}_{i-1}, \hat{t}_i]$ and $[\hat{t}_i, t_i]$. Next, quaternion values at $\hat{t}_{i-1}$ and $\hat{t}_i$ are obtained using Equation (63).

$$Q_{i-1}' = SLERP\left(Q_{i-1}, Q_i, \frac{\hat{t}_{i-1} - t_{i-1}}{t_i - t_{i-1}}\right) \quad (63)$$

$$Q_i' = SLERP\left(Q_{i-1}, Q_i, \frac{\hat{t}_i - t_{i-1}}{t_i - t_{i-1}}\right)$$

In Equation (63), a function SLERP( ) is used to perform spherical linear interpolation.

Due to the fact that an animation path is inevitably distorted in a 3D space, as shown in FIG. 27, $[\hat{t}_{i-1}, \hat{t}_i]$ must be divided into two sub-intervals $[\hat{t}_{i-1}, t_i'']$ and $[t_i'', \hat{t}_i]$, and then the two sub-intervals must be calculated separately from each other. Here, let us assume that a distance between two animation paths, i.e., between a group of values of $Q_i$ and a group of values of $\hat{Q}_i$ is minimized at $t_i''$ in the interval $[\hat{t}_{i-1}, \hat{t}_i]$. Instantaneous errors at $\hat{t}_{i-1}$ and $\hat{t}_i$ are calculated using the following equations.

$$e_{i-1} = 2 \arccos(Q_{i-1}' \cdot \hat{Q}_{i-1})$$

$$e_i = 2 \arccos(Q_i' \cdot \hat{Q}_i) \quad (64)$$

In addition, $t_i''$ in the interval $[\hat{t}_{i-1}, \hat{t}_i]$ is proportional to $$\frac{e_{i-1}}{e_i},$$

which is shown in Equation (65).

$$t_i'' = \hat{t}_{i-1} + \frac{e_{i-1}}{e_{i-1} + e_i}(\hat{t}_i - \hat{t}_{i-1}) \quad (65)$$

Intermediate quaternion values and an instantaneous error at $t_i''$ are calculated with Equation (66) below.

$$Q_i'' = SLERP\left(Q_{i-1}', Q_i', \frac{t_i'' - \hat{t}_{i-1}}{\hat{t}_i - \hat{t}_{i-1}}\right) \quad (66)$$

$$\hat{Q}_i'' = SLERP\left(\hat{Q}_{i-1}, \hat{Q}_i, \frac{t_i'' - \hat{t}_{i-1}}{\hat{t}_i - \hat{t}_{i-1}}\right)$$

$$e_i'' = 2 \cdot \arccos(Q_i'' \cdot \hat{Q}_i'')$$

However, an instantaneous error at an arbitrary moment (t) of time is obtained following Equation (67).

$$e(t) = 2 \cdot \arccos(Q(t) \cdot \hat{Q}(t)) \quad (67)$$

Here, $$Q(t) = SLERP\left(Q_{i-1}', Q_i', \frac{t - \hat{t}_{i-1}}{\hat{t}_i - \hat{t}_{i-1}}\right) \text{ and } \hat{Q}(t) = SLERP\left(\hat{Q}_{i-1}, \hat{Q}_i, \frac{t - \hat{t}_{i-1}}{\hat{t}_i - \hat{t}_{i-1}}\right).$$

However, it is not easy to calculate an instantaneous error e(t) at an arbitrary moment (t) of time. Accordingly, e(t) is determined using linear approximation, which is shown in Approximation (68).

$$e(t) \cong \begin{cases} e_{i-1} + \frac{t - \hat{t}_{i-1}}{t_i'' - \hat{t}_{i-1}}(e_i'' - e_{i-1}), \hat{t}_{i-1} \le t \le t_i'' \\ e_i'' + \frac{t - t_i''}{\hat{t}_i - t_i''}(e_i - e_i''), t_i'' \le t \le \hat{t}_i \end{cases} \quad (68)$$

The partial sum $E_m^i$ of errors in the interval $[\hat{t}_{i-1}, \hat{t}_i]$ and a partial sum $E_p^i$ of maximum errors in the interval $[\hat{t}_{i-1}, \hat{t}_i]$ can also be obtained using Approximations (69) and (70).

$$\begin{cases} E_p^i \equiv \max_{\hat{t}_{i-1} \le t \le \hat{t}_i} |e(t)| \\ E_m^i \equiv \int_{\hat{t}_{i-1}}^{t_i''} e^2(t) dt + \int_{t_i''}^{\hat{t}_i} e^2(t) dt \end{cases}, \quad (69)$$

Approximation (69) can be rearranged as follows.

$$\begin{cases} E_p^i \cong \max\{|e_{i-1}|, |e_i''|, |e_i|\} \\ E_m^i \cong \frac{1}{3}(t_i'' - \hat{t}_{i-1})\{(e_i'')^2 + e_{i-1}^2 + e_i''e_{i-1}\} + \frac{1}{3}(\hat{t}_i - t_i'')\{e_i^2 + (e_i'')^2 + e_i e_i''\} \end{cases} \quad (70)$$

Finally, an average error $E_m$ and a maximum error $E_p$ in a time interval $[t_{min}, t_{max}]$ are calculated with Approximation (71) below.

$$E_m \cong \sqrt{\frac{1}{t_{max} - t_{min}} \sum_i E_m^i} \quad (71)$$

$$E_p \cong \max_i E_p^i$$

Accordingly, the error calculator 42b, 46b, and 48b included in the break point extractor 42, 46, and 48 shown in FIGS. 4A through 4C, respectively, calculates an error between an original orientation interpolator and a restored orientation interpolator using Equation (71) and can measure the degree to which images are distorted in a quaternion space due to a quantization error more precisely.

Figure 28:
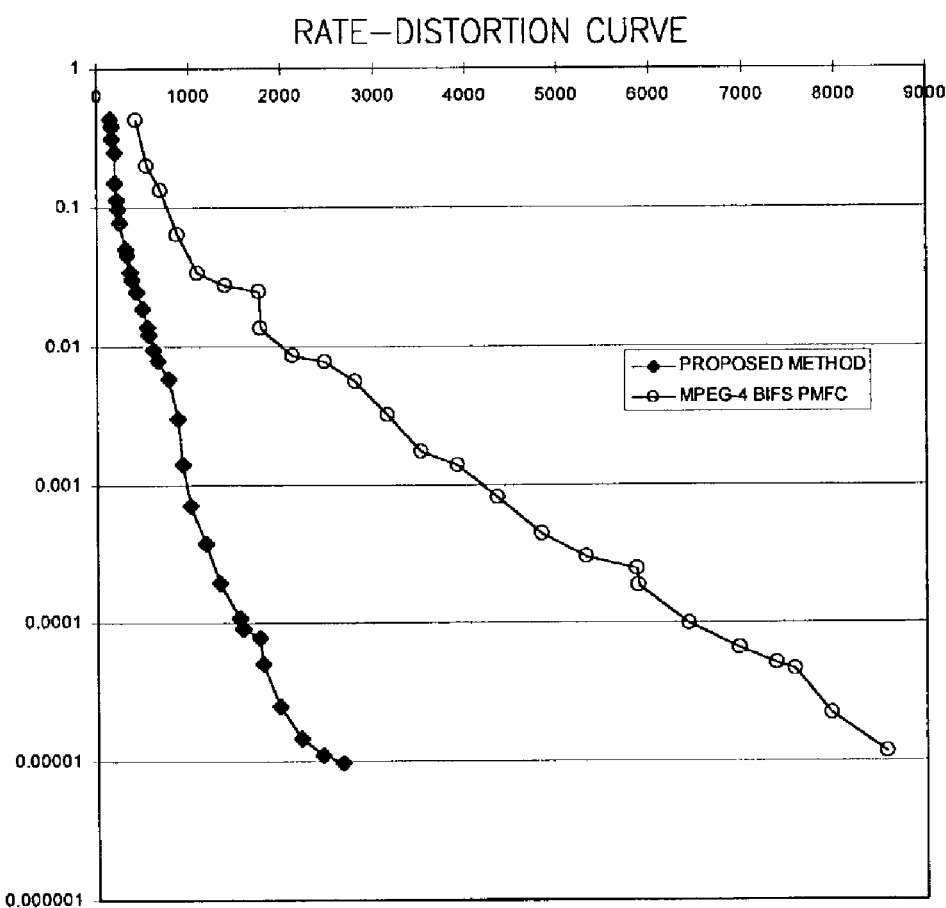
FIG. 28 is a diagram for comparing the performance of a method for encoding an orientation interpolator according to the present invention with the performance of a conventional method for encoding an orientation interpolator.

FIG. 28 is a diagram showing the performance of the method for encoding key value data according to the present invention compared with a conventional method for encoding key value data. As shown in FIG. 28, according to the method for encoding an orientation interpolator of the present invention, the degree, to which images are distorted when a predetermined number of bits required for encoding are given, can be lowered more considerably than in the conventional MPEG_4 BIFS PMFC method.

The present invention can be realized as computer-readable codes written on an computer readable recording medium. Here, the computer-readable recording medium includes any kind of recording medium which can be read by a computer system. For example, the computer readable recording medium may include a ROM, a RAM, a DC-ROM, a magnetic tape, a floppy disk, an optical data storage, and the like. The computer-readable recording medium can be decentralized to computer systems connected over a network, and a computer can read the recording medium in a decentralized way.

The method and the apparatus for encoding an orientation interpolator according to the present invention are capable of encoding animation key data and key value data with a high efficiency while maintaining high-quality animation. In addition, according to the present invention, it is possible to maintain high-quality animation data by taking advantage of a method of measuring an error between animation data paths, and it is also possible to considerably reduce the amount of key data and key value data to be encoded by using the resampling method and the break point extraction point of the present invention.

Moreover, it is possible to provide high-quality animation with a high compression rate by calculating a rotational differential value, which can sufficiently reflect redundancy in rotational transformation corresponding to key value data of an orientation interpolator, and thus encoding the key value data of the orientation interpolator.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for encoding an orientation interpolator, which includes key data indicating the locations of keyframes on a temporal axis and key value data indicating the rotation of an object, the apparatus comprising:
a break point extractor which extracts a plurality of break points from a first animation path constituted by an orientation interpolator input thereinto, calculates the error between said first animation path and a second animation path generated by the extracted break points and extracts additional break points until said error falls below a predetermined error limit;
a key data encoder which encodes key data input from the break point extractor; and
a key value data encoder which encodes key value data input from the break point extractor by generating rotational differential data, by which the object is rotationally transformed by as much as a difference between a rotational transformation value of a current keyframe and a rotational transformation value of a previous keyframe, wherein the key data encoder comprises:
a first quantizer which quantizes key data of an orientation interpolator using predetermined quantization bits;
a first DPCM processor which generates differential data of the quantized key data;
a divide and divide (DND) processor which performs a DND operation on the differential data depending on a relationship between the differential data and a maximum value and a minimum value among them; and
a first entropy encoder which entropy-encodes the differential data input from the DND processor.

2. The apparatus of claim 1, wherein the break point extractor comprises:
a linear interpolator which extracts a beginning path point and an ending path point of an input animation path, selects path points between the beginning and ending path points, and interpolates other path points, using the selected path points;
an error calculator which calculates an error between the input animation path and an interpolated animation path generated by the linear interpolator; and
a determining unit which extracts break points, by which an error between the input animation path and the interpolated animation path can be minimized, outputs the selected break points if the corresponding error is not greater than a predetermined error limit and signals said linear interpolator to select additional break points on said input animation path if said error is greater than a predetermined error limit.

3. The apparatus of claim 2, wherein if the error between the input animation path and the interpolated animation path constituted, which is minimized by the selected break points, is greater than the predetermined error limit, the linear interpolator selects all the path points except for the break points input from the determining unit one by one and performs spherical linear interpolation on the selected path points.

4. The apparatus of claim 2, wherein the error calculator divides the input animation path and an animation path generated by the spherical linear interpolation into a predetermined number of sections based on one reference component constituting their path points and calculates an error between the input animation path and the generated animation path in each of the sections by measuring an area of each of the sections.

5. The apparatus of claim 1 further comprising:
a resampler which samples the first animation path into a predetermined number of sections having an interval of a predetermined amount of time and outputs an orientation interpolator including resampled key data and resampled key value data; and
a selector which outputs an orientation interpolator input thereinto to the resampler or the break point extractor depending on an external input signal.

6. The apparatus of claim 5, wherein the resampler divides an animation path constituted by key data and key value data of an orientation interpolator into a predetermined number of sections having an interval of a predetermined amount of time, outputs end points of each of the sections as key data to be encoded, and outputs key value data existing on the animation path in each of the sections as key value data to be encoded.

7. The apparatus of claim 1 further comprising a resampler which samples the first animation path into a predetermined number of sections having an interval of a predetermined amount of time and outputs an orientation interpolator including resampled key data and resampled key value data,
wherein the break point extractor extracts break points from an animation path constituted by an orientation interpolator input from the resampler.

8. The apparatus of claim 1, further comprising a resampler which samples an animation path constituted by an orientation interpolator extracted from the break point extractor into a predetermined number of sections having an interval of a predetermined amount of time and outputs an orientation interpolator including resampled key data and resampled key value data to the key data encoder and the key value data encoder.

9. The apparatus of claim 1, wherein the key data encoder quantizes the key data input from the break point extractor using predetermined quantization bits, generates differential data by performing a predetermined DPCM operation on quantized key data, and encodes the differential data.

10. The apparatus of claim 1, wherein the key data encoder further comprises a linear key encoder, which identifies and encodes a region where key data linearly increase among all key data input thereinto.

11. The apparatus of claim 1, wherein the key data encoder further comprises:
   a shifter which obtains a differential datum (mode) having the highest frequency among the differential data input from the first DPCM processor and subtracts the mode from the differential data; and
   a folding processor which converts the shifted differential data into positive numbers or negative numbers, and the DND processor selects one of the differential data input from the shifter, the differential data input from the folding processor, and the DNDed differential data depending on the number of bits required for encoding and outputs the selected differential data.

12. The apparatus of claim 1, wherein the key value data encoder comprises:
   a rotational differential data generator which generates, using a rotational transformation value of a current keyframe and a restored rotational transformation value of a previous keyframe, a rotational differential value used to rotate the object by as much as a difference between rotational transformation applied to the object in the current keyframe by key value data and rotational transformation applied to the object in the previous keyframe by key value data, and outputs rotational differential data by quantizing the rotational differential value; and
   an entropy encoder which entropy-encodes the rotational differential data.

13. The apparatus of claim 12, wherein the rotational differential data generator comprises:
   a quantizer which generates rotational differential data by quantizing three component values of the rotational differential value
   a quantized data adjustor which adjusts three component values of rotational differential data input thereinto;
   an inverse quantizer which inverse-quantizes the adjusted component values;
   a rotational differential value restorer which restores one component value, which has not been quantized, using the three inverse-quantized component values and thus generate a restored rotational differential value; and
   an error measurement unit which measures an error between a rotational differential value input into the quantizer and the restored rotational differential value and outputs rotational differential data having adjusted component values so that the error can be minimized.

14. The apparatus of claim 12, wherein the rotational differential data generator comprises:
   a first quaternion multiplier which generates the rotational differential value using the rotational transformation value of the current keyframe and the restored rotational transformation value of the previous keyframe;
   a quantizer which generates rotational differential data by quantizing the rotational differential value;
   an inverse quantizer which generates a restored rotational differential value by inverse-quantizing the rotational differential data; and
   a second quaternion multiplier which generates a restored rotational differential value of the current keyframe by quaternion-multiplying the restored rotational differential value by a rotational transformation value of the previous keyframe.

15. An apparatus for encoding an orientation interpolator, which includes key data indicating the locations of keyframes on a temporal axis and key value data indicating the rotation of an object, the apparatus comprising:
   a break point extractor which extracts a plurality of break points from a first animation path constituted by an orientation interpolator input thereinto, calculates the error between said first animation path and a second animation path generated by the extracted break points and extracts additional break points until said error falls below a predetermined error limit;
   a key data encoder which encodes key data input from the break point extractor; and
   a key value data encoder comprising:
      a rotational differential data generator which generates, using a rotational transformation value of a current keyframe and a restored rotational transformation value of a previous keyframe, a rotational differential value used to rotate the object by as much as a difference between rotational transformation applied to the object in the current keyframe by key value data and rotational transformation applied to the object in the previous keyframe by key value data, and outputs rotational differential data by quantizing the rotational differential value, said rotational differential data generator comprising:
         a rotation direction error detector which detects whether or not the rotation direction error has occurred so that the original rotation direction of the object is opposite to a decoded rotation direction of the object, a based on the rotational transformation value of the current keyframe and the restored rotational transformation value of the previous keyframe;
         a rotation direction corrector which adjusts the rotational differential value so that the decoded rotation direction of the object can be the same as the original rotation direction of the object; and
         a rotation direction selector which selects either the rotation differential value or the rotation differential value input from the rotation direction corrector as differential data to be quantized, depending on the result of the detection input from the rotation direction error detector; and
      an entropy encoder which entropy-encodes the rotational differential data.

16. An apparatus for encoding an orientation interpolator, which includes key data indicating the locations of keyframes on a temporal axis and key value data indicating the rotation of an object, the apparatus comprising:
   a resampler which samples an animation path constituted by an input orientation interpolator into a predetermined number of sections having an interval of a predetermined amount of time and outputs an orientation interpolator including resampled key data and resampled key value data;
   a key data encoder which encodes key data input from the resampler; and a key value data encoder comprising:
      a rotational differential data generator, comprising:

a rotation direction error detector which detects whether or not the rotation direction error has occurred so that the original rotation direction of the object is opposite to a decoded rotation direction of the object, a based on the rotational transformation value of the current keyframe and the restored rotational transformation value of the previous keyframe;

a rotation direction corrector which adjusts the rotational differential value so that the decoded rotation direction of the object can be the same as the original rotation direction of the object; and a rotation direction selector which selects either the rotation differential value or the rotation differential value input from the rotation direction corrector as differential data to be quantized, depending on the result of the detection input from the rotation direction error detector; and an entropy encoder which entropy-encodes the rotational differential data.

17. An apparatus for decoding a bitstream, into which an orientation interpolator, including key data indicating the locations of keyframes on a temporal axis and key value data indicating the rotation of an object, and a header including information for decoding the key data and key value data are encoded, the apparatus comprising:

a header decoder which decodes information from an input bitstream for decoding key data and key value data in the input bitstream;

a key data decoder which decodes key data from the input bitstream;

a key value data decoder which decodes key value data from the input bitstream; and an orientation interpolator synthesizer which generates an orientation interpolator when a specific decoded key data does not have corresponding decoded key value data by synthesizing missing key value data by spherically and linearly interpolation using the decoded key value data, wherein the header decoder provides the decoded information to the key data decoder, the key value data decoder and the orientation interpolator synthesizer for use thereby, and wherein the key value data decoder comprises:

an entropy decoder which generates circular-DPCMed rotational differential data or quantized rotational differential data by entropy-decoding key value data from the bitstream;

an inverse circular DPCM operator which generates quantized rotational differential data by performing an inverse circular DPCM operation on rotational differential data input from the entropy-decoder following the order of DPCM operation decoded from the bitstream;

an inverse quantizer which generates rotational differential data used to rotate the object by as much as a difference between rotational transformations applied to the object by quaternion key value data of each of the keyframes by inverse-quantizing the quantized rotational differential data; and a quaternion multiplier which generates a rotational transformation value of a current keyframe by quaternion-multiplying a rotational differential value of the current keyframe by a restored rotational transformation value of a previous keyframe.

18. The apparatus of claim 17, wherein if there is no decoded key value data corresponding to key data currently being subjected to orientation interpolator synthesization, the orientation interpolator synthesizer interpolates key value data corresponding to the key data currently being subjected to orientation interpolator synthesization using decoded key value data corresponding to previously synthesized key data and decoded key value data corresponding to key data to be synthesized next.

19. A method for encoding an orientation interpolator including key data indicating the locations of keyframes on a temporal axis and key value data indicating the location of an object, the method comprising:

(b) generating key data and key value data to be encoded by extracting, from a first animation path constituted by the orientation interpolator, a minimum number of break points, which can bring about an error of no greater than a predetermined error limit between the first animation path and a second animation path to be generated by the extracted break points;

(d) encoding the key data generated in step (b);

(e11) detecting whether or not a rotation direction error has occurred so that an original rotation direction of the object is opposite to a decoded rotation direction of the object depending on the rotational transformation value of the current keyframe and the restored rotational transformation value of the previous keyframe;

(e12) adjusting the rotational differential value so that the original rotation direction of the object can be the same as the decoded rotation direction of the object;

(e13) selecting the rotational differential value or the adjusted rotational differential value in step (e12) as differential data to be quantized depending on the result of the detection performed in step (e11);

(e2) entropy-encoding the rotational differential data; and (f) outputting the entropy-encoded rotational differential data.

20. A method for encoding an orientation interpolator including key data indicating the locations of keyframes on a temporal axis and key value data indicating the rotation of an object, the method comprising:

(a) sampling an animation path constituted by the orientation interpolator into a predetermined number of sections having an interval of a predetermined amount of time and thus generating an orientation interpolator including resampled key data and resampled key value data;

(d) reducing the range of the key data sampled in step (a) by reducing the difference between a maximum possible value of the key and the minimum possible value of the key and encoding the key data;

(e) encoding the key value data sampled in step (a) by generating and encoding a rotational differential value used to rotate the object by as much as a difference between rotational transformation applied to the object by key value data of a current keyframe and rotational transformation applied to the object by key value data of a previous keyframe; and (f) outputting the encoded key value data.

21. The method of claim 20, wherein step (a) comprises dividing the animation path into a predetermined number of sections having an interval of a predetermined amount of time, setting up end points of each of the sections as the sampled key data, and setting up key value data existing on the first animation path in each of the sections as the sampled key value data.

22. The method of claim 20, wherein step (e) comprises:

(e1) generating a rotational differential value used to rotate the object by as much as a difference between rotational transformations applied to the object by key value data of the current and previous keyframes using a rotational transformation value of the current keyframe and a restored rotational transformation value of the previous keyframe and generating rotational differential data by quantizing the rotational differential value; and (e2) entropy-encoding the rotational differential data.

23. The method of claim 22, wherein step (e1) comprises:
(e11) generating rotational differential data by quantizing three component values of the rotational differential value;
(e12) adjusting three component values of the rotational differential data;
(e13) inverse-quantizing the adjusted component values;
(e14) generating a restored rotational differential value by restoring one component value using the three inverse-quantized component values; and
(e15) measuring an error between the rotational differential value and the restored rotational differential value and determining rotational differential data having adjusted component values so that the error can be minimized as rotational differential data to be entropy-encoded.

24. The method of claim 22, wherein step (e1) comprises:
(e11) generating the rotational differential value using a rotational transformation value of the current keyframe and a restored rotational transformation value of the previous keyframe;
(e12) generating rotational differential data by quantizing the rotational differential value;
(e13) generating a restored rotational differential value by inverse-quantizing the rotational differential data; and
(e14) generating a restored rotational transformation value of the current keyframe by quaternion-multiplying the restored differential value by a rotational transformation value of the previous keyframe.

25. A method for encoding an orientation interpolator including key data indicating the locations of keyframes on a temporal axis and key value data indicating the rotation of an object, the method comprising:
(a) sampling an animation path constituted by the orientation interpolator into a predetermined number of sections having an interval of a predetermined amount of time and thus generating an orientation interpolator including resampled key data and resampled key value data;
(d) reducing the range of the key data sampled in step (a) and encoding the key data;
(e11) detecting whether or not a rotation direction error has occurred so that an original rotation direction of the object is opposite to a decoded rotation direction of the object depending on the rotational transformation value of the current keyframe and the restored rotational transformation value of the previous keyframe;
(e12) adjusting the rotational differential value so that the original rotation direction of the object can be the same as the decoded rotation direction of the object; and
(e13) selecting the rotational differential value or the adjusted rotational differential value in step (e12) as differential data to be quantized depending on the result of the detection performed in step (e11);
(e2) entropy-encoding the rotational differential data; and
(f) outputting the entropy-encoded rotational differential data.

26. A tangible computer-readable recording medium where computer-readable program codes, by which the method of claim 20 is realized, are recorded.

27. A method for decoding a bitstream, into which an orientation interpolator, including key data indicating the locations of keyframes on a temporal axis and key value data indicating the rotation of an object, and a header including information for decoding the key data and key value data are encoded, the method comprising:
(a) decoding information from an input bitstream for decoding key data and key value data in the input bitstream;
(b) decoding key data from the input bitstream;
(c) decoding key value data from the input bitstream;
(d) generating an orientation interpolator when a specific decoded key data does not have corresponding decoded key value data by synthesizing missing key value data by spherically and linearly interpolation using the decoded key value data,
wherein the decoded information in step (a) is used in steps (b)-(d); and
(f) outputting the orientation interpolator, wherein step (b) comprises:
generating differential data by entropy-decoding the input bitstream;
generating quantized key value data by performing a predetermined DPCM operation and an inverse DND operation on the differential data; and
generating restored key data by inverse-quantizing the quantized key value data.

28. The method of claim 27, wherein in step (d), if there is no decoded key value data corresponding to key data currently being subjected to orientation interpolator synthesization, key value data corresponding to the key data currently being subjected to orientation interpolator synthesization are interpolated using decoded key value data corresponding to previously synthesized key data and decoded key value data corresponding to key data to be synthesized next.

29. A method for decoding a bitstream, into which an orientation interpolator, including key data indicating the locations of keyframes on a temporal axis and key value data indicating the rotation of an object, and a header including information for decoding the key data and key value data are encoded, the method comprising:
(a) decoding information from an input bitstream for decoding key data and key value data in the input bitstream;
(b) decoding key data from the input bitstream;
(c) decoding key value data from the input bitstream;
(d) generating an orientation interpolator when a specific decoded key data does not have corresponding decoded key value data by synthesizing missing key value data by spherically and linearly interpolation using the decoded key value data,
wherein the decoded information in step (a) is used in steps (b)-(d); and
(f) outputting the orientation interpolator, wherein step (c) comprises:
(c1) generating circular-DPCMed rotational differential data or quantized rotational differential data by entropy-decoding key value data from the bitstream;
(c2) generating rotational differential data by performing an inverse circular DPCM operation on entropy-decoded rotational differential data following the order of DPCM operation decoded from the bitstream;
(c3) generating a rotational differential value used to rotate the object by as much as a difference between rotational transformations applied to the object by quaternion key value data of each of the keyframes by inverse-quantizing the rotational differential data; and (c4) generating a rotational transformation value of a current keyframe by quaternion-multiplying a rotational differential value of the current keyframe by a decoded rotational transformation value of a previous keyframe.

30. A tangible computer-readable recording medium where computer-readable program codes, by which the method of claim 27 is realized, are recorded.

31. A tangible computer-readable recording medium where computer-readable program codes, by which the method of claim 29 is realized, are recorded.

32. A tangible computer memory encoded with a bitstream, into which an orientation interpolator, including key data indicating the locations of keyframes on a temporal axis and key value data indicating the rotation of an object, is encoded, said bitstream containing executable instructions representing a computer program that can cause a computer to function in a particular fashion, the bitstream comprising instructions for:

generating the orientation interpolator using key data encoding/decoding information, into which key data and information necessary to decode the key data are encoded, and key value data encoding/decoding information, into which key value data and information necessary to decode the key value data are encoded, wherein the key data encoding/decoding configures the computer to execute the steps of:

extending a range of differential data and maximum and minimum values among differential data used in each cycle of an inverse DND operation using inverse DND operation information including the order of inverse DND indicating a predetermined number of cycles of inverse DND to be performed on differential data generated by entropy-decoding the bitstream;

converting the inverse-DNDed differential data into quantized key data and intra key data which are used for each cycle of inverse DPCM operation using first inverse DPCM operation information including the order of inverse DPCM operation to be performed on the inverse-DNDed differential data; and generating restored key data by inverse-quantizing the quantized key data using first inverse quantization information; and wherein the key value data encoding/decoding information configures the computer to execute the steps of:

quantizing a rotational differential value used to rotate the object by as much as a difference between rotational transformations applied to the object by quaternion key value data of each of the keyframes to generate entropy-encoded rotational differential data;

indicating an entropy decoding method to be performed on the rotational differential data using entropy-decoding information including an entropy decoding mode;

indicating whether or not an inverse circular DPCM operation will be performed on entropy-decoded rotational differential data following the entropy decoding mode using inverse circular DPCM operation information including the order of inverse circular DPCM operation; and restoring original key value data by inverse-quantizing the quantized key value data using second inverse quantization information including a predetermined number of inverse quantization bits used to.

33. The computer memory of claim 32, wherein the inverse DND operation information indicates whether or not a shift-down operation will be performed on differential data subjected to an inverse DND operation using a flag.

34. The computer memory of claim 32, wherein the first inverse quantization information comprises an inverse quantization bit size and maximum and minimum values among quantized key data, which are used when inverse-quantizing the quantized key data.

35. The computer memory of claim 34, comprising:

adjusting maximum and minimum values among the quantized key data so as to minimize a quantization error of the quantized key data.

36. The computer memory of claim 32, comprising:

decoding a linear key region included in the bitstream, and indicating whether or not there exists the linear key region where key data linearly increase among the key data, the number of key data included in the linear key region, and beginning and ending key data of the linear key region through linear key decoding information of the key data encoding/decoding information.

37. The computer memory of claim 32, wherein the rotational differential data are encoded so that only three components of a rotational differential value represented by a quaternion are quantized.

38. The computer memory of claim 32, wherein the entropy-decoding information further configures the computer to execute the steps of:

indicating whether or not rotational differential data of each component of the key value data have the same value using a key value flag; and decoding predetermined rotational differential data into each component of rotational differential data of all key value data when the key value flag indicates that the rotational differential data of each of the components of the key value data have the same value.

39. The computer memory of claim 32, wherein the inverse circular DPCM information further configures the computer to perform the step of performing an inverse circular DPCM operation on the rotational differential data using intra rotational differential data.

40. A method for decoding a bitstream, into which an orientation interpolator, including key data indicating the locations of keyframes on a temporal axis and key value data indicating the rotation of an object, is encoded, the method comprising:

generating differential data by entropy-decoding the bitstream;

generating quantized key data by performing inverse DND, inverse folding, inverse shift, and inverse DPCM operations on the differential data if the DND order (nDNDOrder) of the differential data is not lower than 1, performing the inverse folding, inverse shift, and inverse DPCM operations on the differential data if the DND order of the differential data is 0, and performing the inverse shift and inverse DPCM operations on the differential data if the DND order of the differential data is −1;

reconstructing reconstructed key data by inversely quantizing the quantized key data;

entropy-decoding key value data from the bitstream, to generate quantized rotational differential data by performing an inverse circular-DPCM operation on the key value data if the DPCM order (nKVDPCMOrder) included in a key value header is 1, to generate the quantized rotational differential data if the DPCM order is 0;

generating a rotational differential value of a current keyframe used to rotate an object by as much as a difference between rotational transformations applied to the object by quaternion key value data of each of the keyframes by inverse-quantizing the quantized rotational differential data;

generating a rotational transformation value of the current keyframe by quaternion-multiplying the rotational differential value of the current keyframe by a decoded rotational transformation value of a previous keyframe;

generating an orientation interpolator by synthesizing the decoded key data and the key value data which is spherically linear-interpolated using the decoded key data and the decoded key value data, wherein the key value data of the current frame is restored by interpolating the previous keyframe and a subsequent keyframe if a key selection flag of the current keyframe is set to a value of 0; and outputting the orientation interpolator.

41. The method of claim 40, wherein the performing of the inverse DND operation comprises:

performing an invert-down operation if the DND order (nDNDOrder) of the differential data is not lower than 1 and a predetermined integer nKeyInvertDown included in the bitstream is not −1, the integer nKeyInvertDown being used for converting all quantized key data of greater than itself into negative values of no greater than −1; and performing a sub inverse DND operation as many times as the DND order (nDNDOrder) of the differential data, wherein the performing of the sub inverse DND operation comprises performing an inverse divide-down operation if a maximum value nKeyMax among differential data having been through a folding operation is a positive value, performing an inverse divide-up operation if the predetermined maximum value nKeyMax is a negative value, and performing an inverse divide if the predetermined maximum value nKeyMax is a positive value in the last time of sub inverse DND operation.

* * * * *